United States Patent
Shibata et al.

(10) Patent No.: US 12,164,131 B2
(45) Date of Patent: Dec. 10, 2024

(54) LIGHT ABSORPTION ANISOTROPIC LAYER, LAMINATE, DISPLAY DEVICE, INFRARED LIGHT IRRADIATION DEVICE, AND INFRARED LIGHT SENSING DEVICE

(71) Applicant: FUJIFILM Corporation, Tokyo (JP)

(72) Inventors: Naoya Shibata, Kanagawa (JP); Takashi Katou, Kanagawa (JP); Naoya Nishimura, Kanagawa (JP); Naoki Koito, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/481,052

(22) Filed: Oct. 4, 2023

(65) Prior Publication Data
US 2024/0094452 A1 Mar. 21, 2024

Related U.S. Application Data

(63) Continuation of application No. PCT/JP2022/017370, filed on Apr. 8, 2022.

(30) Foreign Application Priority Data

Apr. 9, 2021 (JP) .................. 2021-066751

(51) Int. Cl.
*G02F 1/1335* (2006.01)
*G02B 5/30* (2006.01)
(52) U.S. Cl.
CPC ..... *G02B 5/3016* (2013.01); *G02F 1/133507* (2021.01); *G02F 1/133541* (2021.01); *G02F 1/133528* (2013.01)
(58) Field of Classification Search
CPC ............. G02F 1/1335; G02F 1/133507; G02F 1/133528; G02B 5/208; G02B 5/22;
(Continued)

(56) References Cited

U.S. PATENT DOCUMENTS

2003/0170478 A1  9/2003 Cael et al.
2019/0048194 A1  2/2019 Higeta et al.
(Continued)

FOREIGN PATENT DOCUMENTS

JP  2005-522727 A  7/2005
JP  2017-072823 A  4/2017
(Continued)

OTHER PUBLICATIONS

International Search Report issued in PCT/JP2022/017370 on Jun. 28, 2022.
(Continued)

*Primary Examiner* — Thoi V Duong
(74) *Attorney, Agent, or Firm* — Edwards Neils LLC; Jean C. Edwards, Esq.

(57) ABSTRACT

A light absorption anisotropic layer in which, when combined with a λ/4 plate to form a circularly polarizing plate, applying the circularly polarizing plate to a display device, and displaying a display screen in black, coloration is suppressed and utilization efficiency of infrared light is high, a laminate including the light absorption anisotropic layer, a display device, an infrared light irradiation device, and an infrared light sensing device. The light absorption anisotropic layer contains an organic dichroic coloring agent, and satisfies expressions (1) to (4). (1) P(450)>99%, (2) P(550)>99%, (3) P(650)>99%, and (4) A(750)<0.2, here, P(450) represents a polarization degree at a wavelength of 450 nm, P(550) represents a polarization degree at a wavelength of 550 nm, P(650) represents a polarization degree at a wavelength of 650 nm, and A(750) represents an average absorbance at a wavelength of 750 nm.

20 Claims, 1 Drawing Sheet

(58) Field of Classification Search
CPC ........ G02B 5/223; G02B 5/30; G02B 5/3016; G09F 9/00; G01J 1/02; H05B 33/02; H10K 59/8791
See application file for complete search history.

(56) References Cited

U.S. PATENT DOCUMENTS

| | | |
|---|---|---|
| 2019/0340409 A1 | 11/2019 | Zhu et al. |
| 2023/0062801 A1 | 3/2023 | Hoshino et al. |

FOREIGN PATENT DOCUMENTS

| | | |
|---|---|---|
| JP | 2019-191507 A | 10/2019 |
| JP | 2020-533614 A | 11/2020 |
| WO | 2017/146212 A1 | 8/2017 |
| WO | 2018/221598 A1 | 12/2018 |
| WO | 2021/045192 A1 | 3/2021 |

OTHER PUBLICATIONS

Written Opinion issued in PCT/JP2022/017370 on Jun. 28, 2022.
International Preliminary Report on Patentability completed by WIPO on Oct. 10, 2023 in connection with International Patent Application No. PCT/JP2022/017370.

LIGHT ABSORPTION ANISOTROPIC LAYER, LAMINATE, DISPLAY DEVICE, INFRARED LIGHT IRRADIATION DEVICE, AND INFRARED LIGHT SENSING DEVICE

CROSS-REFERENCE TO RELATED APPLICATIONS

This application is a Continuation of PCT International Application No. PCT/JP2022/017370 filed on Apr. 8, 2022, which was published under PCT Article 21 (2) in Japanese, and which claims priority under 35 U.S.C. § 119 (a) to Japanese Patent Application No. 2021-066751 filed on Apr. 9, 2021. The above applications are hereby expressly incorporated by reference, in their entirety, into the present application.

BACKGROUND OF THE INVENTION

1. Field of the Invention

The present invention relates to a light absorption anisotropic layer, a laminate, a display device, an infrared light irradiation device, and an infrared light sensing device.

2. Description of the Related Art

In recent years, in applications such as a recognition light source for a touch panel, a security camera, a sensor, forgery prevention, and communication equipment, there has been a demand for a system that utilizes rays in an infrared region. On the other hand, in the above-described system, a light absorption anisotropic layer having a polarization function in a visible light region is usually used in an image display region. For example, JP2020-533614A discloses that, in order to perform fingerprint authentication at all portions on an image display screen of a display, an infrared light source and an infrared sensor are installed over the entire image display screen. On the other hand, in a case of transmitting and receiving infrared light, since a circularly polarizing plate has absorption in the infrared region, an intensity of the infrared light is attenuated. Since a polarizer containing iodine and polyvinyl alcohol (PVA), which is generally used, has absorption at 700 nm to 850 nm, there is a problem that the intensity of the infrared light is attenuated and an SN ratio (signal-to-noise ratio) is lowered.

SUMMARY OF THE INVENTION

With regard to such a problem, for example, a method using a light absorption anisotropic layer containing an organic dichroic coloring agent is conceivable. However, the present inventors have found that, in a case where a circularly polarizing plate in which such a light absorption anisotropic layer and a λ/4 plate are combined is applied to a display device to display a display screen in black and the display screen is irradiated with visible light, coloration of the display screen may not be suppressed, and there is a room for improvement.

An object of the present invention is to provide a light absorption anisotropic layer in which, in a case of being combined with a λ/4 plate to form a circularly polarizing plate, applying the circularly polarizing plate to a display device, and displaying a display screen in black, coloration is suppressed and utilization efficiency of infrared light is high, a laminate including the light absorption anisotropic layer, a display device, an infrared light irradiation device, and an infrared light sensing device.

As a result of intensive studies to achieve the above-described objects, the present inventors have found that the above-described objects can be achieved by using a light absorption anisotropic layer which satisfies expressions (1) to (4) described below and contains an organic dichroic coloring agent.

That is, the present inventors have found that the above-described objects can be achieved by employing the following configurations.

[1]
A light absorption anisotropic layer comprising:
an organic dichroic coloring agent, in which the light absorption anisotropic layer satisfies the following expressions (1) to (4), $$P(450) > 99.0\%, \quad (1)$$

$$P(550) > 99.0\%, \quad (2)$$

$$P(650) > 99.0\%, \text{ and} \quad (3)$$

$$A(750) < 0.20, \quad (4)$$

here, the P(450) represents a polarization degree at a wavelength of 450 nm, the P(550) represents a polarization degree at a wavelength of 550 nm, the P(650) represents a polarization degree at a wavelength of 650 nm, and the A(750) represents an average absorbance at a wavelength of 750 nm.

[2]
The light absorption anisotropic layer according to [1],
in which the light absorption anisotropic layer satisfies the following expression (5), $$A(750) \leq 0.15. \quad (5)$$

[3]
The light absorption anisotropic layer according to [1], in which the light absorption anisotropic layer satisfies the following expression (6), $$A(750) \leq 0.10. \quad (6)$$

[4]
The light absorption anisotropic layer according to any one of [1] to [3],
in which a film thickness is 0.5 to 5.0 μm.

[5]
The light absorption anisotropic layer according to any one of [1] to [4], further comprising:
a liquid crystalline compound.

[6]
The light absorption anisotropic layer according to [5], in which a content of the organic dichroic coloring agent is 5 to 40 parts by mass with respect to 100 parts by mass of a content of the liquid crystalline compound.

[7]
The light absorption anisotropic layer according to any one of [1] to [6], in which a content of the organic dichroic coloring agent in the light absorption anisotropic layer is 100 to 250 mg/cm$^3$.

[8]
The light absorption anisotropic layer according to any one of [1] to [7], in which an alignment degree at a wavelength of 650 nm is 0.95 or more.

[9]

The light absorption anisotropic layer according to any one of [1] to [8], in which the light absorption anisotropic layer shows a Bragg peak in an X-ray diffraction measurement.

[10]

A laminate comprising:

the light absorption anisotropic layer according to any one of [1] to [9]; and an optically anisotropic layer.

[11]

A laminate comprising:

a light absorption anisotropic layer A which is the light absorption anisotropic layer according to any one of [1] to [9]; and a light absorption anisotropic layer B which is different from the light absorption anisotropic layer A, in which the light absorption anisotropic layer B contains a dichroic coloring agent having a maximal absorption wavelength at a wavelength of 700 to 1400 nm.

[12]

The light absorption anisotropic layer according to any one of [1] to [9], in which the light absorption anisotropic layer is used for a display device, a sensor, a lens, a switching element, an isolator, or a camera.

[13]

The laminate according to [10] or [11], in which the laminate is used for a display device, a sensor, a lens, a switching element, an isolator, or a camera.

[14]

A display device comprising:

the light absorption anisotropic layer according to any one of [1] to [9]; or the laminate according to [10] or [11].

[15]

An infrared light irradiation device comprising:

the light absorption anisotropic layer according to any one of [1] to [9]; or the laminate according to [10] or [11].

[16]

An infrared light sensing device comprising:

the light absorption anisotropic layer according to any one of [1] to [9]; or the laminate according to [10] or [11].

According to the present invention, it is possible to provide a light absorption anisotropic layer in which, in a case of being combined with a λ/4 plate to form a circularly polarizing plate, applying the circularly polarizing plate to a display device, and displaying a display screen in black, coloration is suppressed and utilization efficiency of infrared light is high, a laminate, a display device, an infrared light irradiation device, and an infrared light sensing device.

DESCRIPTION OF THE PREFERRED EMBODIMENTS

Figure 1:
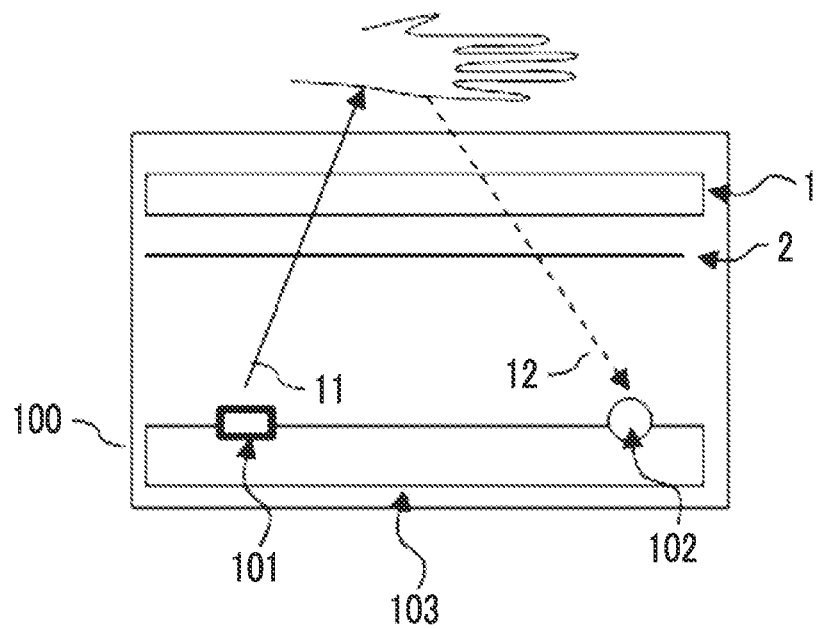
FIG. 1 is a schematic cross-sectional view showing an example of a display device according to an embodiment of the present invention.

Hereinafter, the present invention will be described in detail.

The description of configuration requirements described below may be made based on typical embodiments of the present invention, but the present invention is not limited to such embodiments.

Any numerical range expressed using "to" in the present specification refers to a range including the numerical values before and after the "to" as a lower limit value and an upper limit value, respectively.

In addition, in the present specification, a term "parallel" or "orthogonal" does not indicate parallel or orthogonal in a strict sense, but indicates a range of ±5° from parallel or orthogonal.

In addition, in the present specification, (meth)acrylic acid is a generic term indicating both of "acrylic acid" and "methacrylic acid", (meth)acryloyl is a generic term indicating both of "acryloyl" and "methacryloyl", (meth)acryloyloxy is a generic term indicating both of "acryloyloxy" and "methacryloyloxy", and (meth)acrylate is a generic term indicating both of "acrylate" and "methacrylate".

In addition, in the present specification, concepts of a liquid crystal composition and a liquid crystal compound also include those that no longer exhibit liquid crystallinity due to curing or the like.

[Substituent W]

A substituent W used in the present specification represents any of the following groups.

Examples of the substituent W include a halogen atom, an alkyl group having 1 to 20 carbon atoms, a halogenated alkyl group having 1 to 20 carbon atoms, a cycloalkyl group having 1 to 20 carbon atoms, an alkylcarbonyl group having 1 to 10 carbon atoms, an alkyloxycarbonyl group having 1 to 10 carbon atoms, an alkylcarbonyloxy group having 1 to 10 carbon atoms, an alkylamino group having 1 to 10 carbon atoms, an alkylaminocarbonyl group, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group (also referred to as a hetero ring group), a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group ($-B(OH)_2$), a phosphate group ($-OPO(OH)_2$), a sulfate group ($-OSO_3H$), and other known substituents.

Details of the substituent are described in paragraph [0023] of JP2007-234651A.

In addition, the substituent W may be a group represented by Formula (W1).

*-LW-SPW-Q    (W1)

In Formula (W1), LW represents a single bond or a divalent linking group, SPW represents a divalent spacer group, Q represents Q1 or Q2 in Formula (LC) described later, and * represents a bonding position.

Examples of the divalent linking group represented by LW include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. LW may be a group in which two or more of these groups are combined (hereinafter, also abbreviated as "L-C").

Examples of the divalent spacer group represented by SPW include a linear, branched, or cyclic alkylene group having 1 to 50 carbon atoms, and a heterocyclic group having 1 to 20 carbon atoms.

The carbon atom of the above-described alkylene group or the carbon atom of the heterocyclic group may be substituted with —O—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —C(S)—, —S(O)—, —SO$_2$—, —(O)S(O)O—, —O(O)S(O)O—, —SC(O)—, —C(O)S—, or a group obtained by combining two or more of these groups (hereinafter, also collectively abbreviated as "SP—C").

The hydrogen atom of the above-described alkylene group or the hydrogen atom of the heterocyclic group may be substituted with a halogen atom, a cyano group, —Z$^H$, —OH, —OZ$^H$, —COOH, —C(O)Z$^H$, —C(O)OZ$^H$, —OC(O)Z$^H$, —OC(O)OZ$^H$, —NZ$^H$Z$^H$, —NZ$^H$C(O)Z$^H$, —NZ$^H$C(O)OZ$^{Hh}$, —C(O)NZ$^H$Z$^{Hh}$, —OC(O)NZ$^H$Z$^{Hh}$, —NZ$^H$C(O)NZ$^{Hh}$OZ$^{Hh'}$, —SH, —S$^Z$H, —C(S)Z$^H$, —C(O)SZ$^H$, or —SC(O)Z$^H$ (hereinafter, also collectively abbreviated as "SP—H"). Here, Z$^H$ and Z$^{Hh}$ each independently represent an alkyl group having 1 to 10 carbon atoms, a halogenated alkyl group, or -L-CL (L represents a single bond or a divalent linking group, and specific examples of the divalent linking group are the same as those for LW and SPW described above; CL represents a crosslinkable group, examples thereof include a group represented by Q1 or Q2 in Formula (LC) described later, and a crosslinkable group represented by Formulae (P1) to (P30) described later is preferable).

[Light Absorption Anisotropic Layer]

The light absorption anisotropic layer according to the embodiment of the present invention is a light absorption anisotropic layer containing an organic dichroic coloring agent, in which the light absorption anisotropic layer satisfies the following expressions (1) to (4).

$$P(450) > 99.0\% \tag{1}$$

$$P(550) > 99.0\% \tag{2}$$

$$P(650) > 99.0\% \tag{3}$$

$$A(750) < 0.20 \tag{4}$$

Here, the P(450) represents a polarization degree at a wavelength of 450 nm, the P(550) represents a polarization degree at a wavelength of 550 nm, the P(650) represents a polarization degree at a wavelength of 650 nm, and the A(750) represents an average absorbance at a wavelength of 750 nm.

The upper limit of each polarization degree is 100%.

Since the light absorption anisotropic layer according to the embodiment of the present invention satisfies the expressions (1) to (3), in a case where a circularly polarizing plate in which the light absorption anisotropic layer and a λ/4 plate are combined is applied to a display device to display a display screen in black and the display screen is irradiated with visible light, coloration of the display screen can be suppressed.

In addition, since the light absorption anisotropic layer according to the embodiment of the present invention satisfies the expression (4), utilization efficiency of infrared light can be improved. Here, the "utilization efficiency infrared light is high" means that, in a device in which light emitted from an infrared light source is incident into an infrared light-receiving element, in some cases, a light absorption anisotropic layer is disposed on an optical path of infrared light, and the infrared light emitted from the infrared light source is efficiently received by the infrared light-receiving element.

The average absorbance in the present invention denotes an absorbance with respect to unpolarized light.

The average absorbance of the light absorption anisotropic layer according to the embodiment of the present invention at a wavelength of 750 nm is required to be less than 0.20 (that is, satisfying (4) A(750)<0.20), and from the viewpoint that the effect of the present invention is more excellent, it is preferably 0.15 or less (that is, satisfying (5) A(750)≤0.15), more preferably 0.12 or less, and still more preferably 0.10 or less (that is, satisfying (6) A(750)≤0.10).

The lower limit of the average absorbance of the light absorption anisotropic layer according to the embodiment of the present invention at a wavelength of 750 nm is preferably 0.

The method of obtaining a light absorption anisotropic layer satisfying the expression (4) is not limited thereto, and examples thereof include a method using an organic dichroic coloring agent having a maximal absorption wavelength in a visible light region (wavelength of 400 to 700 nm).

In order that the polarization degree at a wavelength of 650 nm satisfies the range of the present invention, an alignment degree of the light absorption anisotropic layer at the wavelength of 650 nm is preferably 0.95 or more, and more preferably 0.97 or more. The upper limit thereof is not particularly limited, but may be, for example, 1.00.

The light absorption anisotropic layer according to the embodiment of the present invention may be produced by various known techniques as long as the above-described conditions (that is, the expressions (1) to (4)). It is necessary to align the organic dichroic coloring agent in order to cause anisotropy in light absorption.

A well-known method in the related art is a method in which an organic dichroic coloring agent is contained in a resin film formed of polyvinyl alcohol (PVA) and the organic dichroic coloring agent is aligned by stretching the resin film.

As another method of aligning the organic dichroic coloring agent, a method of aligning the organic dichroic coloring agent using alignment of a liquid crystalline compound is preferably used in the present invention from the viewpoint of durability. In this case, in a case where the organic dichroic coloring agent itself exhibits liquid crystallinity, it is also possible not to use the liquid crystalline compound which does not exhibit dichroism in the visible region.

Among these, as compared with the method of alignment by stretching the resin film, the method of utilizing the alignment of the liquid crystalline compound is preferably used because the light absorption anisotropic layer can be made small because the light absorption anisotropic layer can be made thin, the light absorption anisotropic layer is less susceptible to changes in humidity environment, the alignment is less likely to be disturbed over time in a high-temperature environment, and the like.

From the viewpoint of at least one of miniaturization or curved surface application, a film thickness of the light absorption anisotropic layer according to the embodiment of the present invention is preferably 0.5 to 5.0 μm, and more preferably 1.0 to 3.0 μm.

In particular, in a case where the film thickness of the light absorption anisotropic layer is 1.0 μm more, a concentration of the organic dichroic coloring agent is improved, and a light absorption anisotropic layer satisfying the expressions (1) to (3) is easily obtained.

<Liquid Crystalline Compound>

The light absorption anisotropic layer preferably contains a liquid crystalline compound. By containing the liquid crystalline compound, the organic dichroic coloring agent can be aligned with a high alignment degree while precipitation of the organic dichroic coloring agent is suppressed.

The liquid crystalline compound is a liquid crystalline compound which does not exhibit dichroism.

Generally, the liquid crystalline compound can be classified into a rod-like type (rod-like liquid crystalline compound) and a disk-like type (disk-like liquid crystalline compound) depending on the shape thereof.

As the rod-like liquid crystalline compound, a liquid crystalline compound which does not exhibit dichroism in the visible region is preferable.

As the rod-like liquid crystalline compound, both a low-molecular-weight liquid crystalline compound and a high-molecular-weight liquid crystalline compound can be used, but from the viewpoint of increasing the alignment degree of the organic dichroic coloring agent, a high-molecular-weight liquid crystalline compound is preferable. Here, the "low-molecular-weight liquid crystalline compound" refers to a liquid crystalline compound having no repeating unit in the chemical structure. In addition, the "high-molecular-weight liquid crystalline compound" refers to a liquid crystalline compound having a repeating unit in the chemical structure.

Examples of the low-molecular-weight liquid crystalline compound include liquid crystalline compounds described in JP2013-228706A.

Examples of the high-molecular-weight liquid crystalline compound include thermotropic liquid crystalline polymers described in JP2011-237513A. In addition, the high-molecular-weight liquid crystalline compound may include a crosslinkable group (such as an acryloyl group and a methacryloyl group) at a terminal.

The rod-like liquid crystalline compound may be used alone or in combination of two or more kinds thereof.

From the viewpoint that the effect of the present invention is more excellent, the rod-like liquid crystalline compound preferably includes the high-molecular-weight liquid crystalline compound, and particularly preferably includes both the high-molecular-weight liquid crystalline compound and the low-molecular-weight liquid crystalline compound.

It is preferable that the rod-like liquid crystalline compound includes a liquid crystalline compound represented by Formula (LC), or a polymer thereof. The liquid crystalline compound represented by Formula (LC) or the polymer thereof is a compound exhibiting liquid crystallinity. The liquid crystal phase exhibited by the rod-like liquid crystalline compound may be a nematic phase or a smectic phase, or the rod-like liquid crystalline compound may exhibit both the nematic phase and the smectic phase, and it is preferable to exhibit at least the nematic phase.

The smectic phase may be a high-order smectic phase. The high-order smectic phase here denotes a smectic B phase, a smectic D phase, a smectic E phase, a smectic F phase, a smectic G phase, a smectic H phase, a smectic I phase, a smectic J phase, a smectic K phase, or a smectic L phase. Among these, a smectic B phase, a smectic F phase, or a smectic I phase is preferable.

In a case where the smectic liquid crystal phase exhibited by the liquid crystalline compound is any of these high-order smectic liquid crystal phases, the light absorption anisotropic layer with a higher alignment degree order can be produced. In addition, the light absorption anisotropic layer produced from such a high-order smectic liquid crystal phase with a high alignment degree order is a layer in which a Bragg peak derived from a high-order structure such as a hexatic phase and a crystal phase in X-ray diffraction measurement is obtained. The above-described Bragg peak is a peak derived from a surface periodic structure of molecular alignment, and a light absorption anisotropic layer having a periodic interval of 3.0 to 5.0 Å is preferable.

$$Q1-S1-MG-S2-Q2 \quad (LC)$$

In Formula (LC), Q1 and Q2 each independently represent a hydrogen atom, a halogen atom, a linear, branched, or cyclic alkyl group having 1 to 20 carbon atoms, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group (also referred to as a hetero ring group), a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), a sulfate group (—OSO$_3$H), or a crosslinkable group represented by any of Formulae (P-1) to (P-30), and it is preferable that at least one of Q1 or Q2 represents a crosslinkable group represented by any of the following formulae.

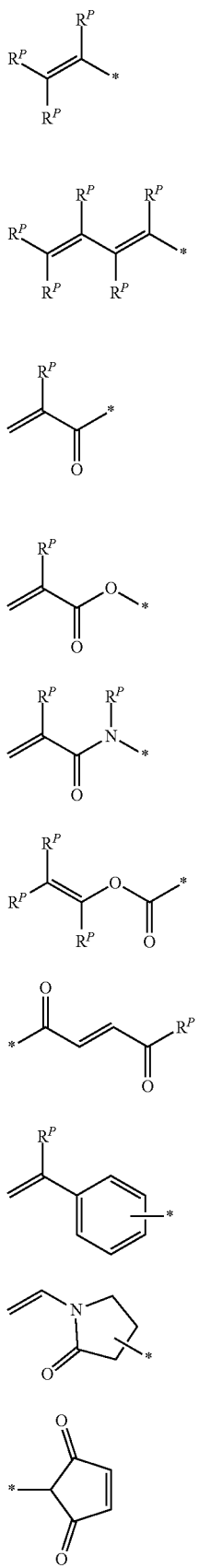
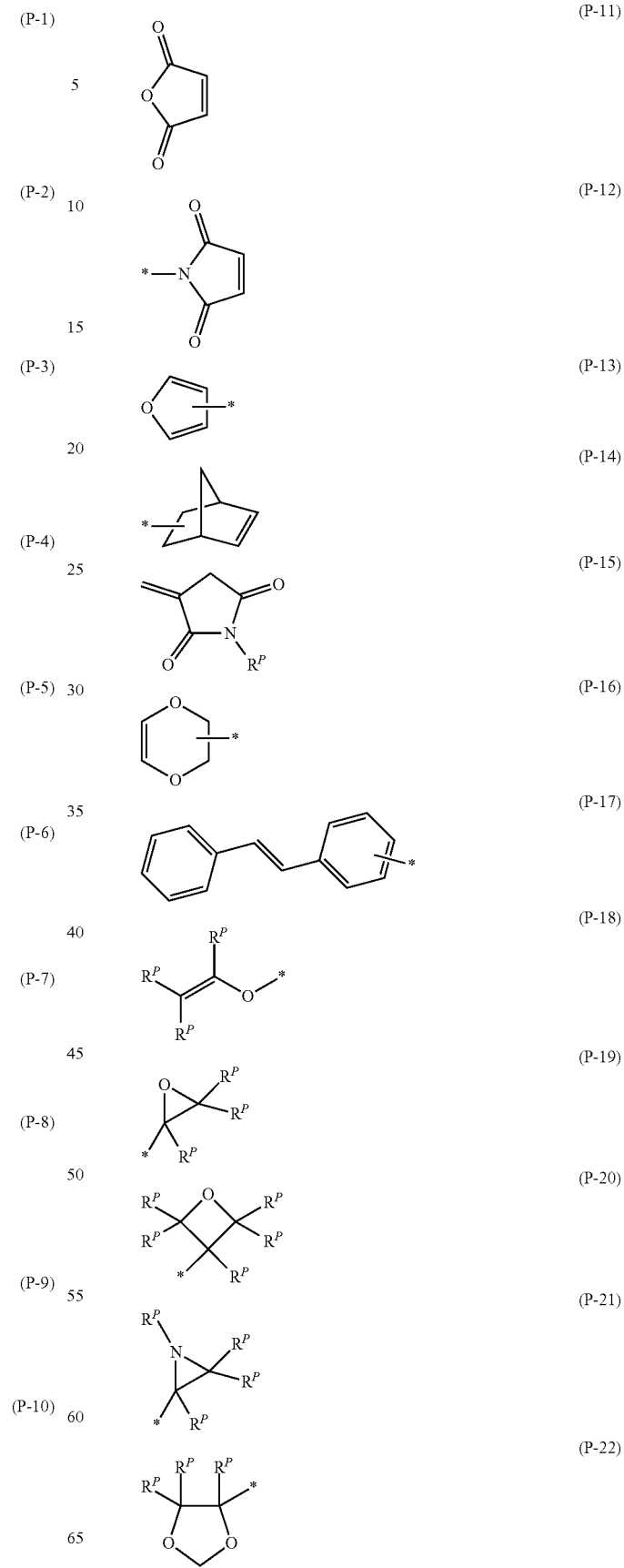

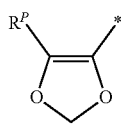 (P-23)

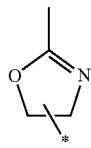 (P-24)

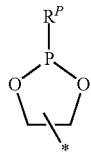 (P-25)

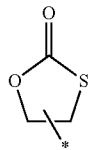 (P-26)

 (P-27)

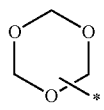 (P-28)

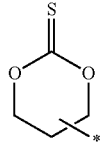 (P-29)

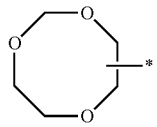 (P-30)

In Formulae (P-1) to (P-30), $R^P$ represents a hydrogen atom, a halogen atom, a linear, branched, or cyclic alkyl group having 1 to 10 carbon atoms, a halogenated alkyl group having 1 to 20 carbon atoms, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), or a sulfate group (—OSO$_3$H), and a plurality of $R^P$'s may be the same or different from each other.

Examples of a preferred aspect of the crosslinkable group include a radically polymerizable group and a cationically polymerizable group. As the radically polymerizable group, a vinyl group represented by Formula (P-1), a butadiene group represented by Formula (P-2), a (meth)acryloyl group represented by Formula (P-4), a (meth)acrylamide group represented by Formula (P-5), a vinyl acetate group represented by Formula (P-6), a fumaric acid ester group represented by Formula (P-7), a styryl group represented by Formula (P-8), a vinylpyrrolidone group represented by Formula (P-9 a maleic acid anhydride represented by Formula (P-11), or a maleimide group represented by Formula (P-12) is preferable. As the cationically polymerizable group, a vinyl ether group represented by Formula (P-18), an epoxy group represented by Formula (P-19), or an oxetanyl group represented by Formula (P-20) is preferable.

In Formula (LC), S1 and S2 each independently represent a divalent spacer group, and suitable aspects of S1 and S2 include the same structures as those for SPW in Formula (W1), and thus the description thereof will not be repeated.

In Formula (LC), MG represents a mesogen group described below. The mesogen group represented by MG is a group representing a main skeleton of a liquid crystal molecule which contributes to liquid crystal formation. A liquid crystal molecule exhibits liquid crystallinity which is in an intermediate state (mesophase) between a crystal state and an isotropic liquid state. The mesogen group is not particularly limited, and for example, particularly description on pages 7 to 16 of "Flussige Kristalle in Tabellen II" (VEB Deutsche Verlag fur Grundstoff Industrie, Leipzig, 1984) and particularly description in Chapter 3 of "Liquid Crystal Handbook" (Maruzen, 2000) edited by Liquid Crystal Handbook Editing Committee can be referred to.

The mesogen group represented by MG preferably has 2 to 10 cyclic structures and more preferably has 3 to 7 cyclic structures.

Specific examples of the cyclic structure include an aromatic hydrocarbon group, a heterocyclic group, and an alicyclic group.

As the mesogen group represented by MG, from the viewpoint of expressing the liquid crystallinity, adjusting a liquid crystal phase transition temperature, availability of raw materials, and synthetic suitability, and from the viewpoint that the effect of the present invention is more excellent, a group represented by Formula (MG-A) or Formula (MG-B) is preferable, and a group represented by Formula (MG-B) is more preferable.

$$* \!-\!(\!A1\!)_{\overline{a1}}\!-\!* \qquad \text{(MG-A)}$$

$$* \!-\!(\!A2\!-\!LA1\!)_{\overline{a2}}\!A3\!-\!* \qquad \text{(MG-B)}$$

In Formula (MG-A), A1 represents a divalent group selected from the group consisting of an aromatic hydrocarbon group, a heterocyclic group, and an alicyclic group. These groups may be substituted with a substituent such as the substituent W.

It is preferable that the divalent group represented by A1 is a 4- to 15-membered ring. In addition, the divalent group represented by A1 may be a monocyclic ring or a fused ring.

In addition, * represents a bonding position to S1 or S2.

Examples of the divalent aromatic hydrocarbon group represented by A1 include a phenylene group, a naphthylene group, a fluorene-diyl group, an anthracene-diyl group, and a tetracene-diyl group. From the viewpoint of design diversity of the mesogenic skeleton and the availability of raw materials, a phenylene group or a naphthylene group is preferable.

The divalent heterocyclic group represented by A1 may be any of aromatic or non-aromatic, but from the viewpoint of further improving the alignment degree, a divalent aromatic heterocyclic group is preferable.

Examples of atoms other than carbon, constituting the divalent aromatic heterocyclic group, include a nitrogen atom, a sulfur atom, and an oxygen atom. In a case where the aromatic heterocyclic group has a plurality of atoms other than carbon, constituting a ring, these atoms may be the same or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, a thienooxazole-diyl group, and the following structures (II-1) to (II-4).

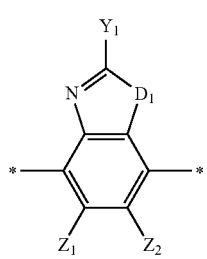

(II-1)

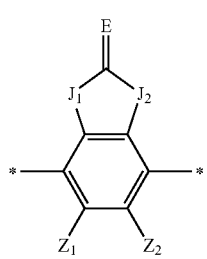

(II-2)

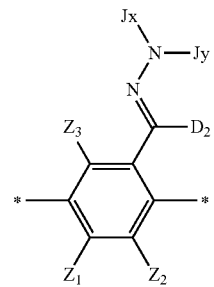

(II-3)

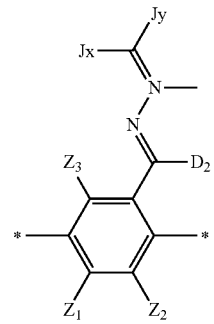

(II-4)

In Formulae (II-1) to (II-4), $D_1$ represents —S—, —O—, or —NR"—, in which R" represents a hydrogen atom or an alkyl group having 1 to 6 carbon atoms; $Y_1$ represents an aromatic hydrocarbon group having 6 to 12 carbon atoms or an aromatic heterocyclic group having 3 to 12 carbon atoms; $Z_1$, $Z_2$, and $Z_3$ each independently represent a hydrogen atom, an aliphatic hydrocarbon group having 1 to 20 carbon atoms, an alicyclic hydrocarbon group having 3 to 20 carbon atoms, a monovalent aromatic hydrocarbon group having 6 to 20 carbon atoms, a halogen atom, a cyano group, a nitro group, —$NR^{12}R^{13}$, or —$SR^{12}$, in which $Z_1$ and $Z_2$ may be bonded to each other to form an aromatic ring or an aromatic heterocyclic ring, and $R^{12}$ and $R^{13}$ each independently represent a hydrogen atom or an alkyl group having 1 to 6 carbon atoms; $J_1$ and $J_2$ each independently represent a group selected from the group consisting of —O—, —$NR^{21}$— ($R^{21}$ represents a hydrogen atom or a substituent), —S—, and —C(O)—; E represents a hydrogen atom or a non-metal atom of Group 14 to Group 16, to which a substituent may be bonded; Jx represents an organic group having 2 to 30 carbon atoms, which has at least one aromatic ring selected from the group consisting of an aromatic hydrocarbon ring and an aromatic heterocyclic ring; Jy represents a hydrogen atom, an alkyl group having 1 to 6 carbon atoms, which may have a substituent, or an organic group having 2 to 30 carbon atoms, which has at least one aromatic ring selected from the group consisting of an aromatic hydrocarbon ring and an aromatic heterocyclic ring; the aromatic ring of Jx and Jy may have a substituent, Jx and Jy may be bonded to each other to form a ring; and $D_2$ represents a hydrogen atom or an alkyl group having 1 to 6 carbon atoms, which may have a substituent.

In Formula (II-2), in a case where $Y_1$ represents an aromatic hydrocarbon group having 6 to 12 carbon atoms, the aromatic hydrocarbon group may be monocyclic or polycyclic. In a case where $Y_1$ represents an aromatic heterocyclic group having 3 to 12 carbon atoms, the aromatic heterocyclic group may be monocyclic or polycyclic.

In Formula (II-2), in a case where $J_1$ and $J_2$ represent —$NR^{21}$—, the substituent as $R^{21}$ can refer to, for example, description in paragraphs [0035] to [0045] of JP2008-107767A, and the content thereof is incorporated in the present specification.

In Formula (II-2), in a case where E represents a non-metal atom of Group 14 to Group 16, to which a substituent may be bonded, =O, =S, =NR', or =C(R')R' is preferable. R' represents a substituent, and as the substituent, for example, description in paragraphs [0035] to [0045] of JP2008-107767A can be referred to, and —NZ$^{41}$Z$^{42}$ (Z$^{41}$ and Z$^{42}$ each independently represent a hydrogen atom, an alkyl group, or an aryl group) is preferable.

Specific examples of the divalent alicyclic group represented by A1 include a cyclopentylene group and a cyclohexylene group, and the carbon atoms thereof may be substituted with —O—, —Si(CH$_3$)$_2$—, —N(Z)— (Z represents a hydrogen atom, an alkyl group having 1 to 4 carbon atoms, a cycloalkyl group, an aryl group, a cyano group, or a halogen atom), —C(O)—, —S—, —C(S)—, —S(O)—, —SO$_2$—, or a group obtained by combining two or more of these groups.

In Formula (MG-A), a1 represents an integer of 2 to 10 (preferably, an integer of 2 to 4). A plurality of A1's may be the same or different from each other.

In Formula (MG-B), A2 and A3 each independently represent a divalent group selected from the group consisting of an aromatic hydrocarbon group, a heterocyclic group, and an alicyclic group. Specific examples and suitable aspects of A2 and A3 are the same as those for A1 in Formula (MG-A), and thus the description thereof will not be repeated.

In Formula (MG-B), a2 represents an integer of 1 to 10 (preferably, an integer of 1 to 3), a plurality of A2's may be the same or different from each other, and a plurality of LA1's may be the same or different from each other. From the viewpoint that the effect of the present invention is more excellent, it is more preferable that a2 is 2 or more.

In Formula (MG-B), LA1 represents a single bond or a divalent linking group. Here, in a case where a2 is 1, LA1 is a divalent linking group, and in a case where a2 is 2 or more, at least one of a plurality of LA1's is a divalent linking group.

In Formula (MG-B), the divalent linking group represented by LA1 is the same as LW, and thus the description thereof will not be repeated.

Specific examples of MG include the following structures, and the hydrogen atoms on the aromatic hydrocarbon group, the heterocyclic group, and the alicyclic group in the following structures may be substituted with the substituent W described above.

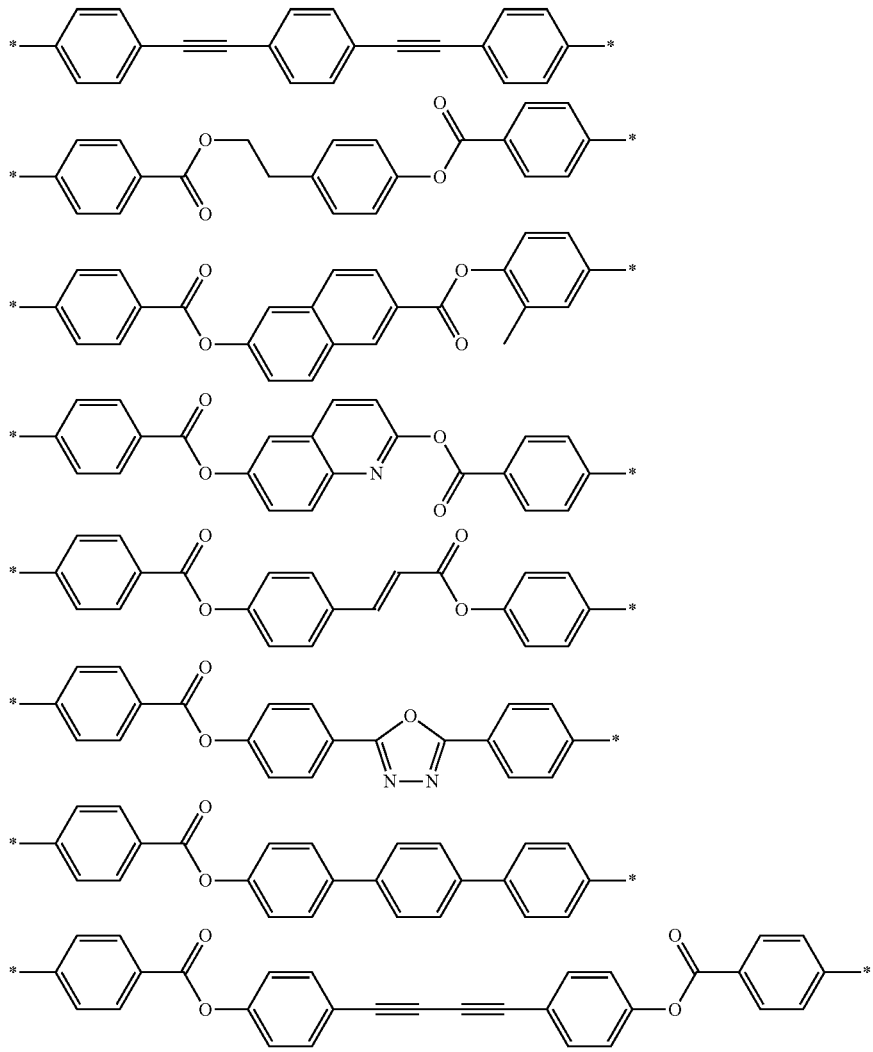

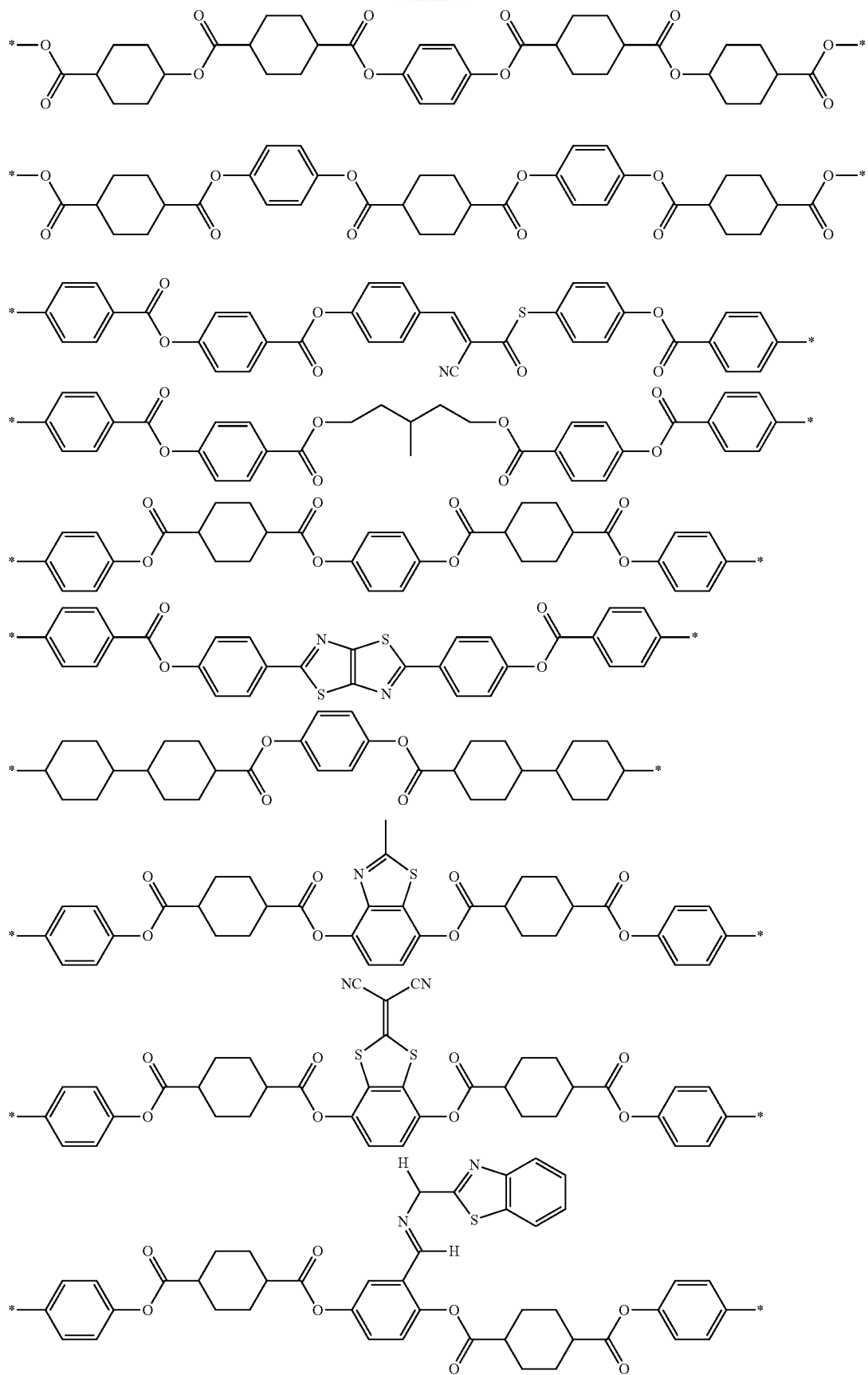

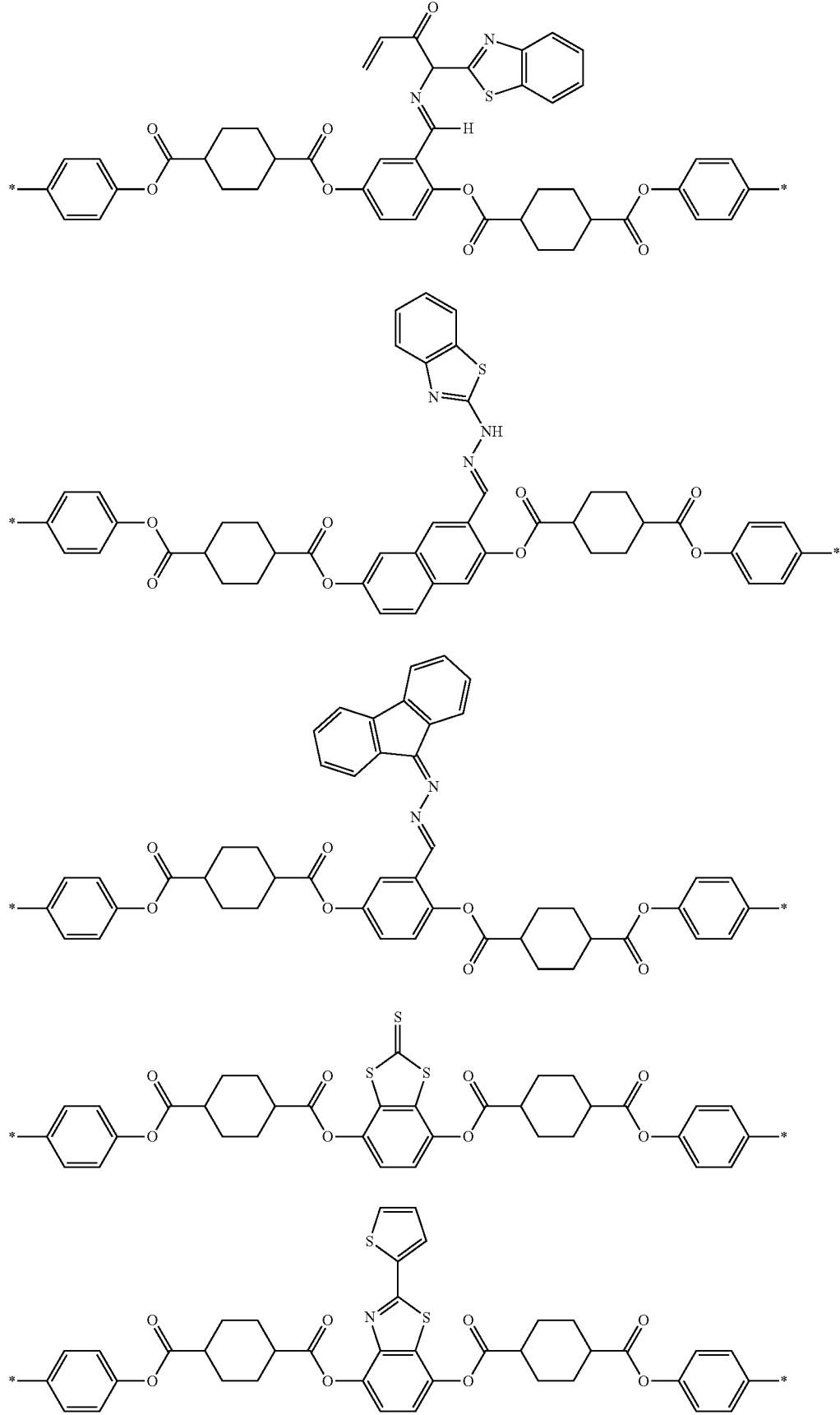

-continued
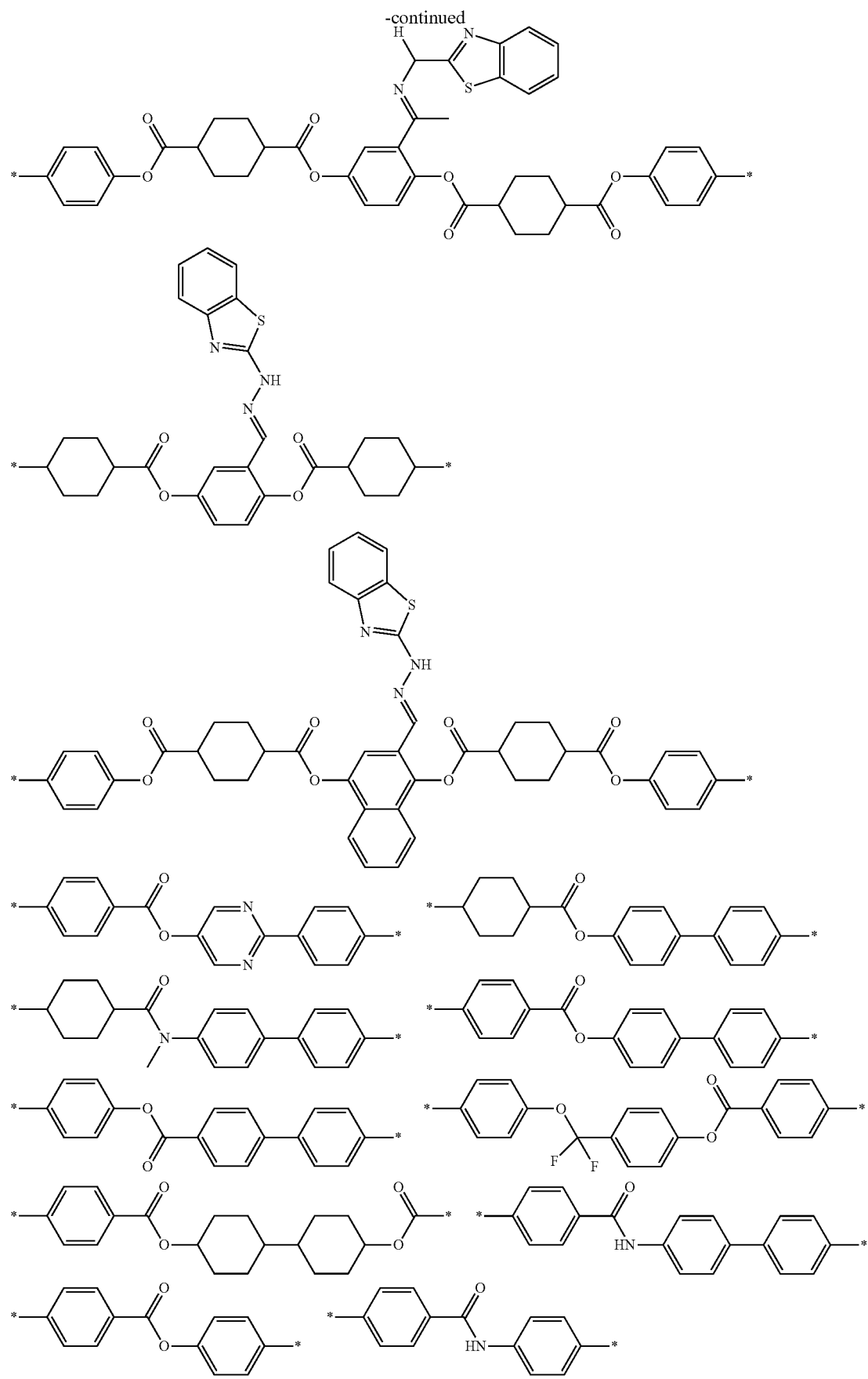

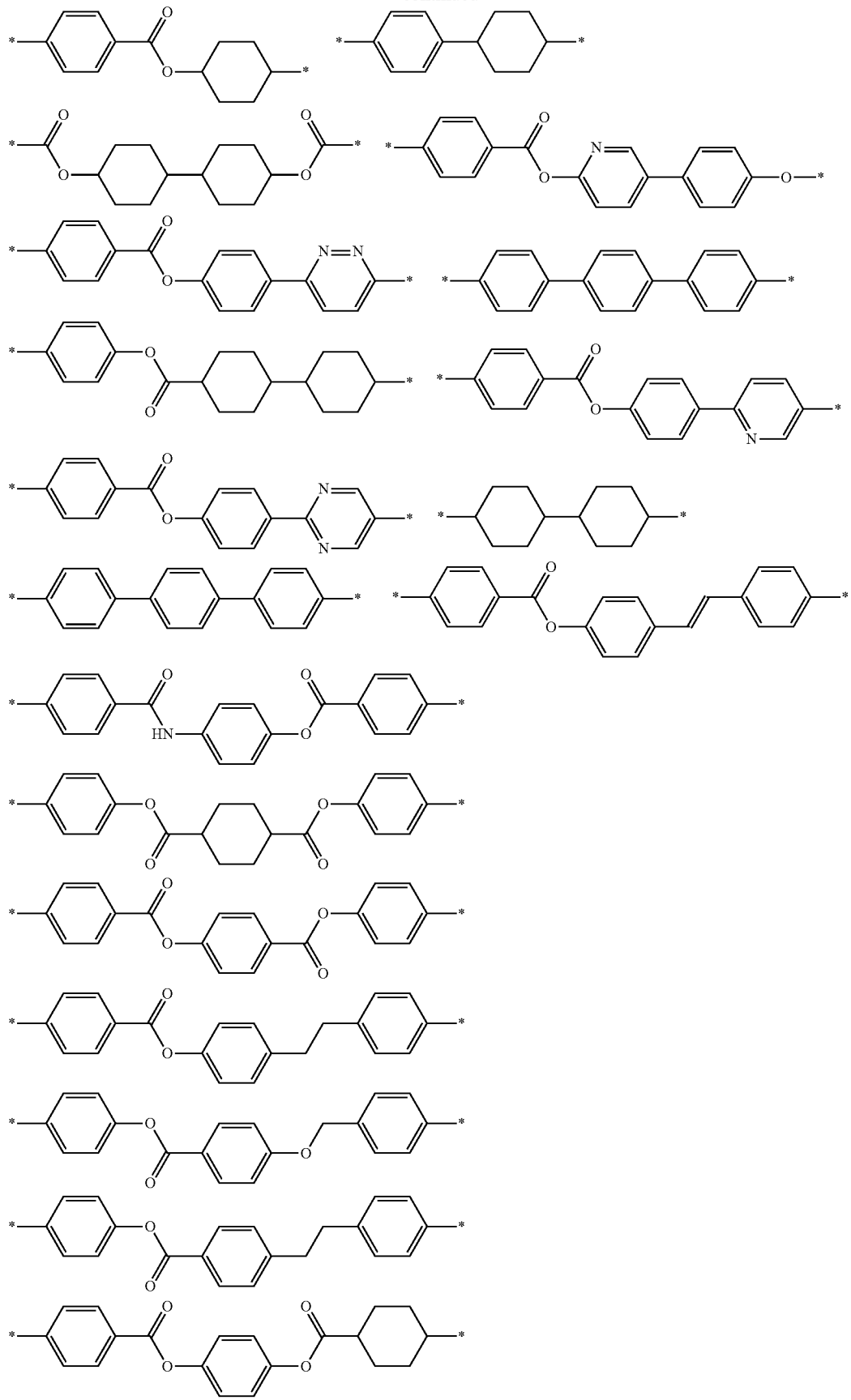

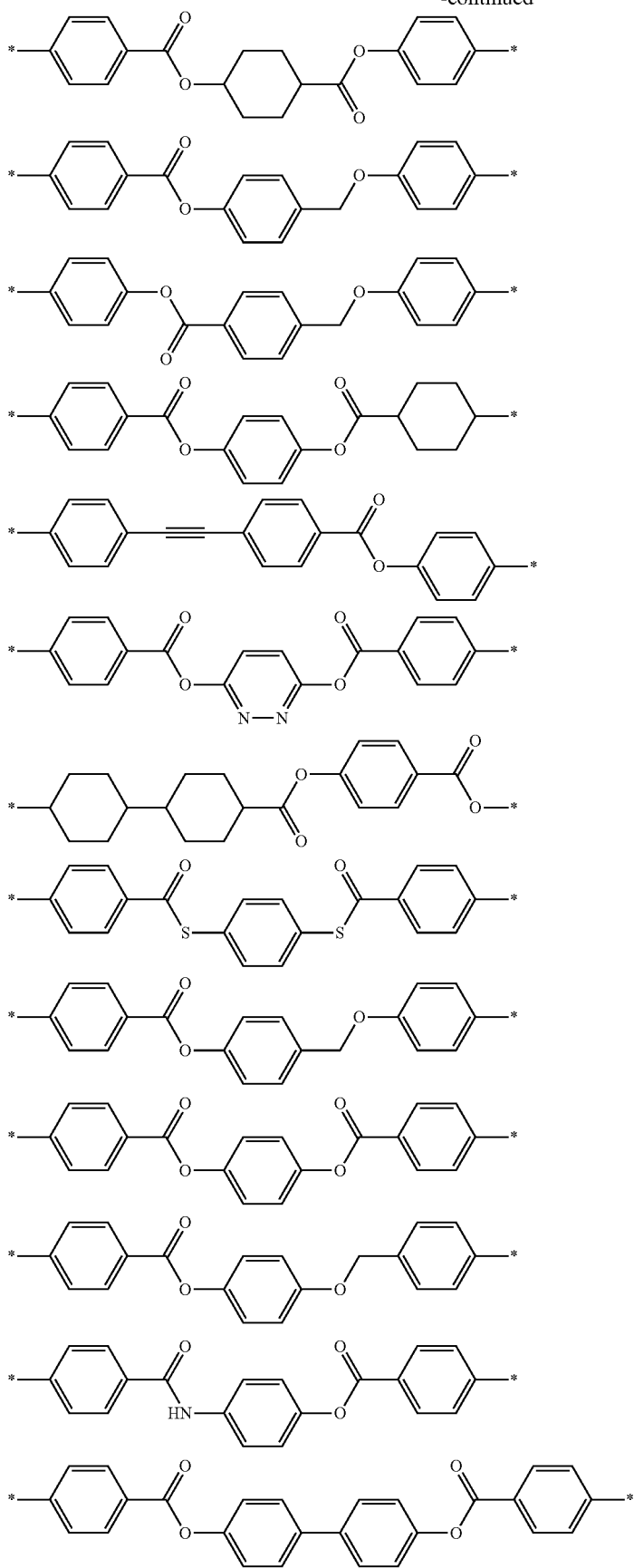

-continued
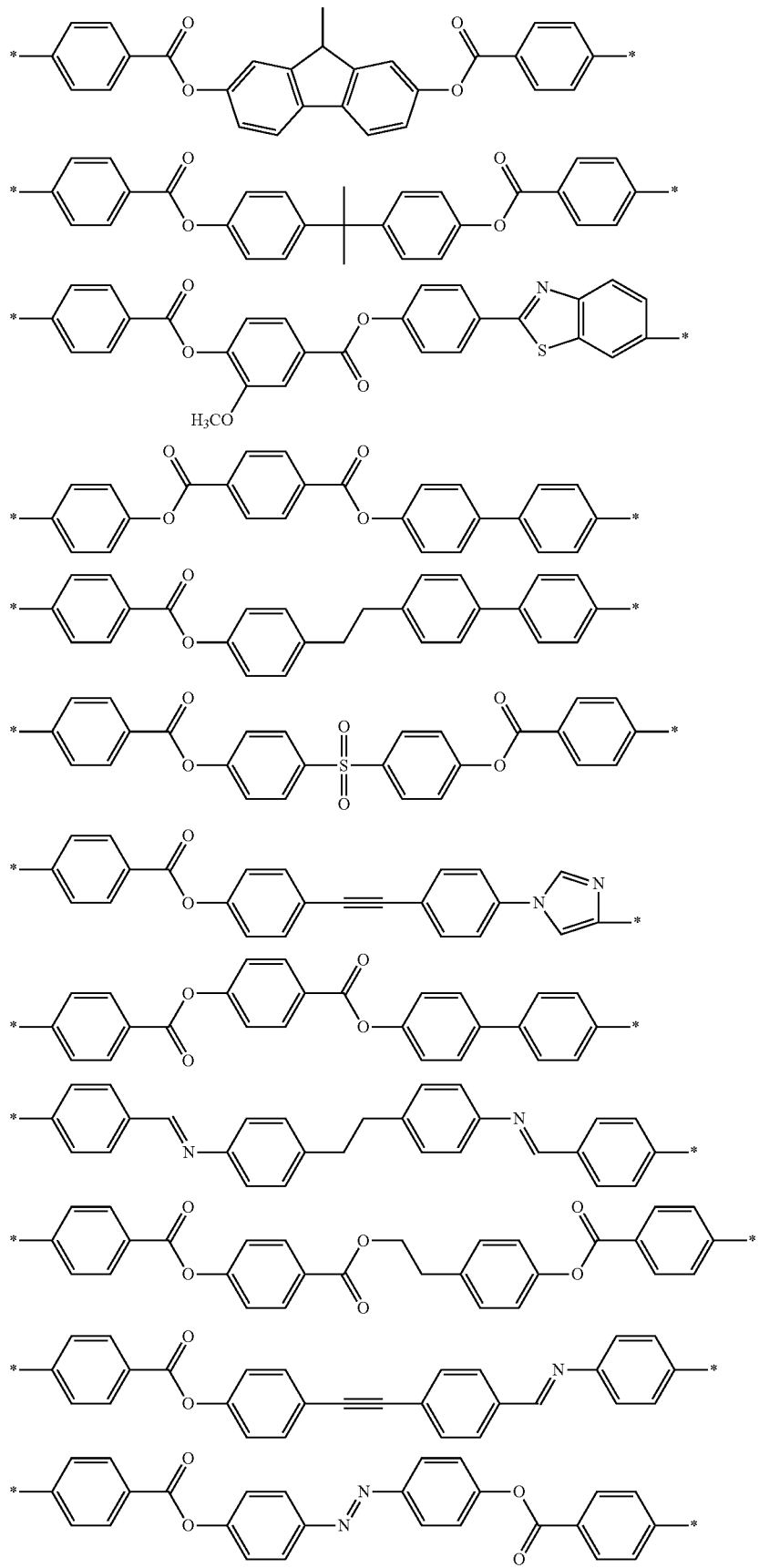

-continued

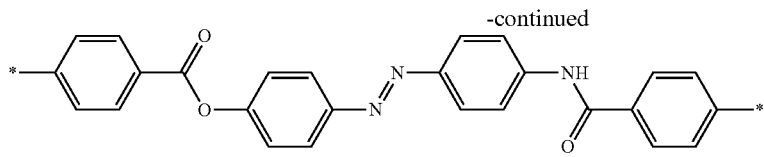

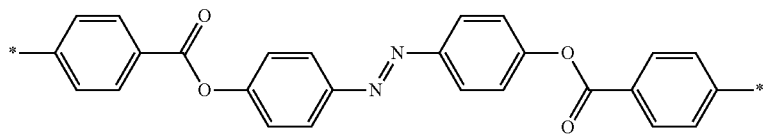

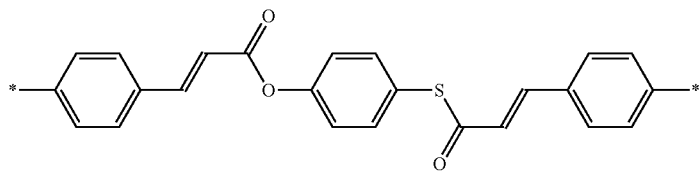

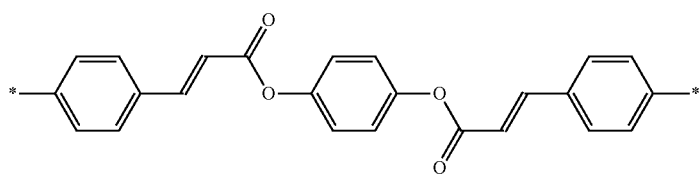

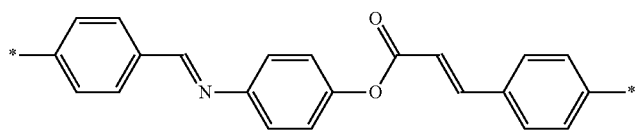

In a case where the liquid crystalline compound represented by Formula (LC) is low-molecular-weight liquid crystalline compound, examples of preferred aspects of the cyclic structure of the mesogen group MG include a cyclohexylene group, a cyclopentylene group, a phenylene group, a naphthylene group, a fluorene-diyl group, a pyridine-diyl group, a pyridazine-diyl group, a thiophene-diyl group, an oxazole-diyl group, a thiazole-diyl group, and a thienothiophene-diyl group, and the number of cyclic structures is preferably 2 to 10 and more preferably 3 to 7.

Examples of preferred aspects of the substituent W in the mesogen structure include a halogen atom, a halogenated alkyl group, a cyano group, a hydroxy group, a nitro group, a carboxy group, an alkoxy group having 1 to 10 carbon atoms, an alkylcarbonyl group having 1 to 10 carbon atoms, an alkyloxycarbonyl group having 1 to 10 carbon atoms, an alkylcarbonyloxy group having 1 to 10 carbon atoms, an amino group, an alkylamino group having 1 to 10 carbon atoms, an alkylaminocarbonyl group, and a group in which LW in Formula (W1) represents a single bond, SPW represents a divalent spacer group, and Q represents a crosslinkable group represented by any of Formulae (P-1) to (P-30); and as the crosslinkable group, a vinyl group, a butadiene group, a (meth)acryloyl group, a (meth)acrylamide group, a vinyl acetate group, a fumaric acid ester group, a styryl group, a vinylpyrrolidone group, a maleic acid anhydride, a maleimide group, a vinyl ether group, an epoxy group, or an oxetanyl group is preferable.

Preferred aspects of the divalent spacer groups S1 and S2 are the same as those for SPW described above, and thus the description thereof will not be repeated.

In a case where a low-molecular-weight liquid crystalline compound exhibiting smectic properties is used, the number of carbon atoms in the spacer group (the number of atoms in a case where the carbon atoms are substituted with "SP—C") is preferably 6 or more and more preferably 8 or more.

In a case where the liquid crystalline compound represented by Formula (LC) is the low-molecular-weight liquid crystalline compound, a plurality of low-molecular-weight liquid crystalline compounds may be used in combination, and it is preferable that 2 to 6 kinds of low-molecular-weight liquid crystalline compounds are used in combination, and it is more preferable that 2 to 4 kinds of low-molecular-weight liquid crystalline compounds are used in combination. By using the low-molecular-weight liquid crystalline compounds in combination, solubility can be improved, and the phase transition temperature of the liquid crystal composition can be adjusted.

Specific examples of the low-molecular-weight liquid crystalline compound include compounds represented by Formulae (LC-1) to (LC-77), but the low-molecular-weight liquid crystalline compound is not limited thereto.

(LC-1) 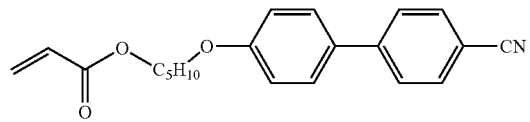
(LC-2) 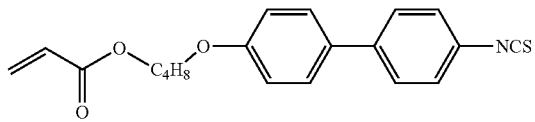
(LC-3) 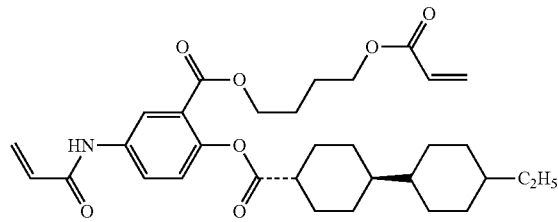
(LC-4) 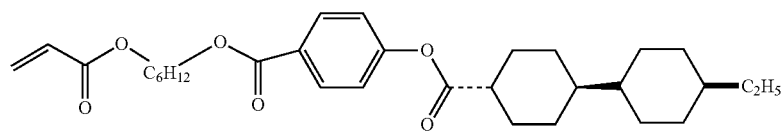
(LC-5) 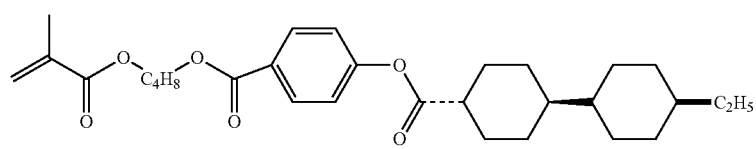
(LC-6) 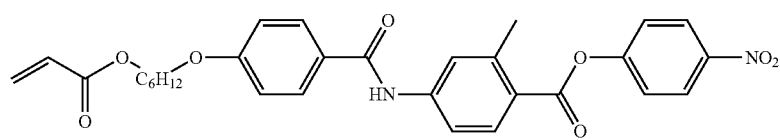
(LC-7) 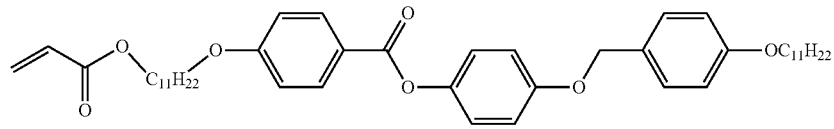
(LC-8) 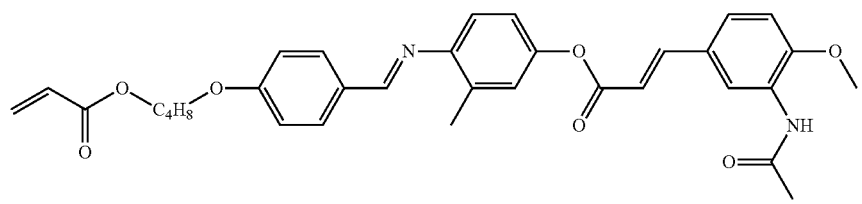
(LC-9) 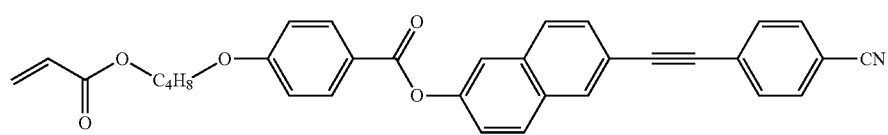
(LC-10) 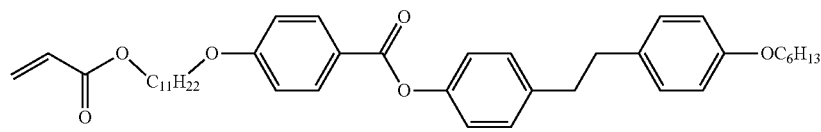
(LC-11) 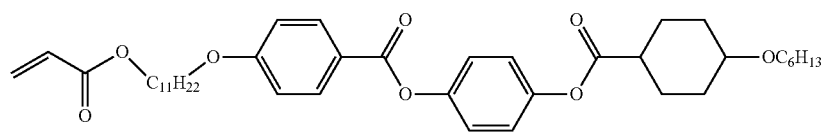

-continued
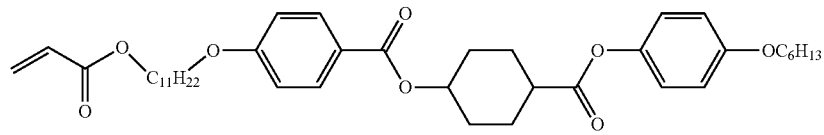
(LC-12)
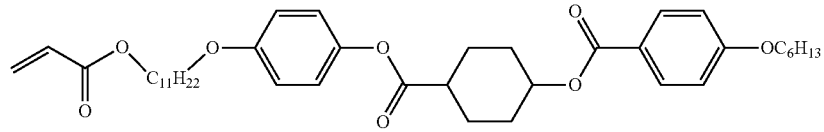
(LC-13)
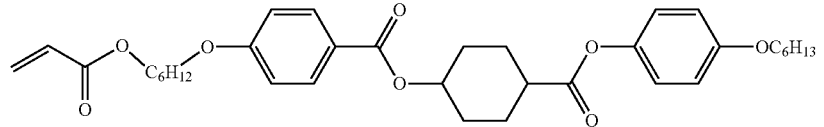
(LC-14)
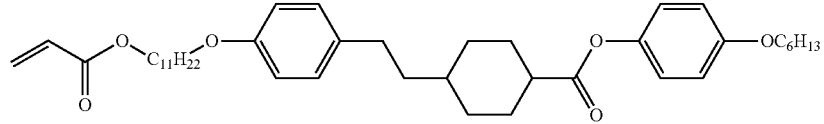
(LC-15)
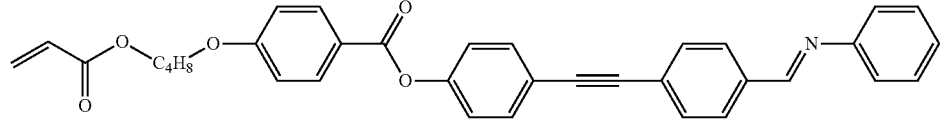
(LC-16)
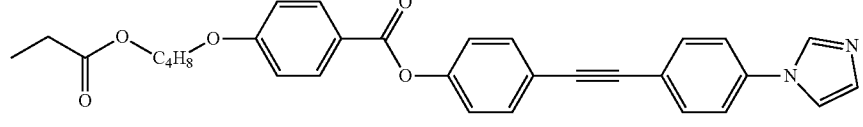
(LC-17)
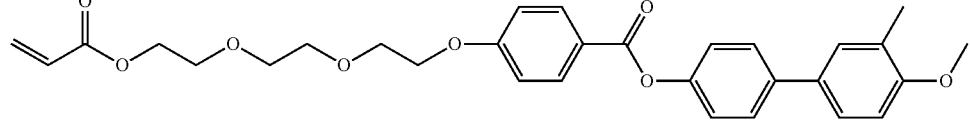
(LC-18)
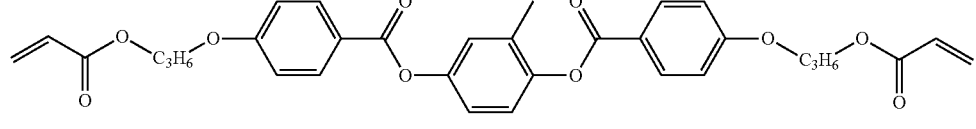
(LC-19)
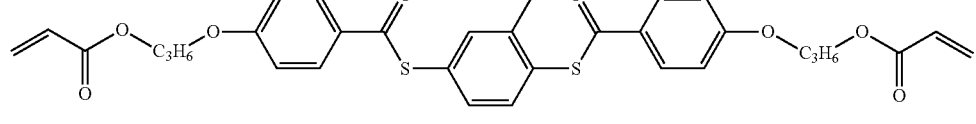
(LC-20)
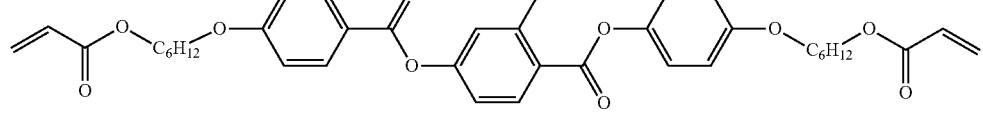
(LC-21)
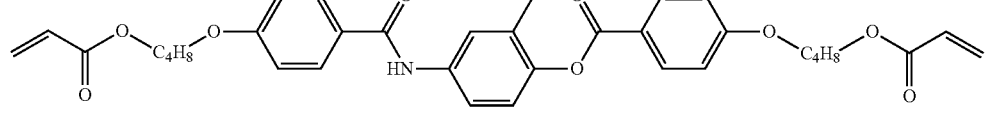
(LC-22)

-continued
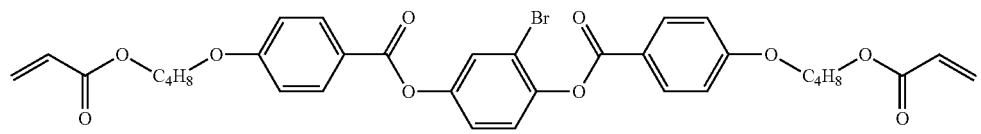
(LC-23)
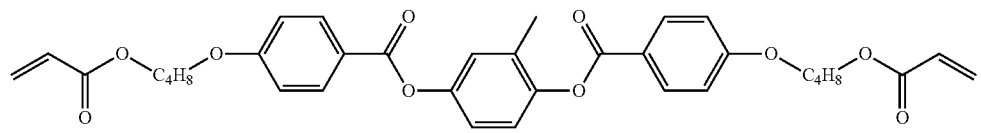
(LC-24)
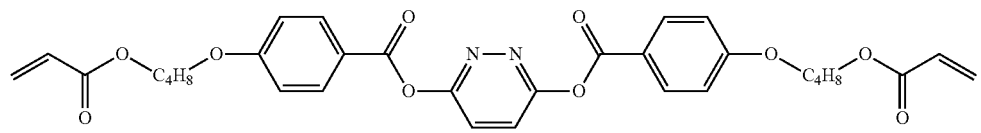
(LC-25)
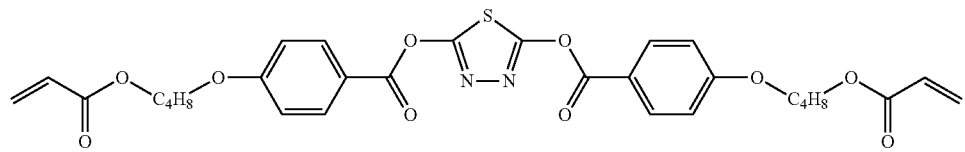
(LC-26)
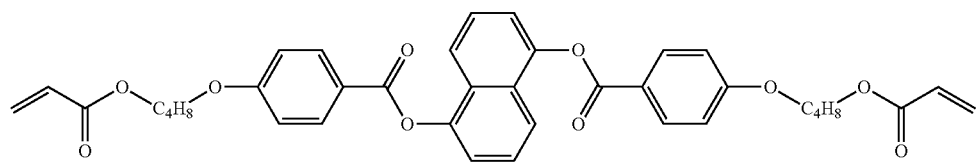
(LC-27)
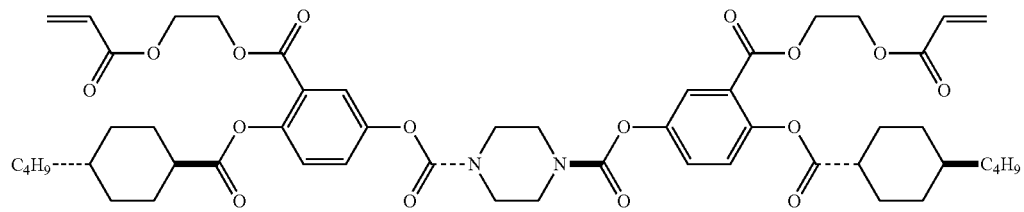
(LC-28)
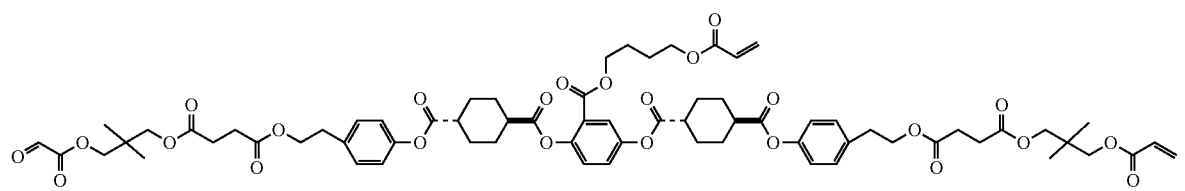
(LC-29)
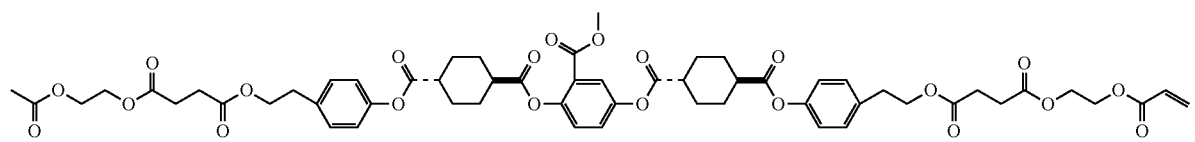
(LC-30)
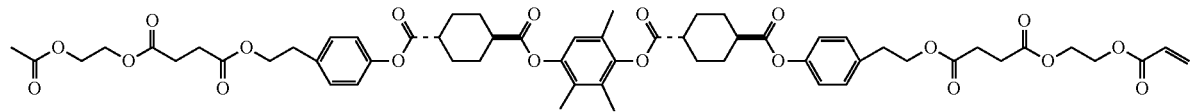
(LC-31)

-continued
(LC-32)
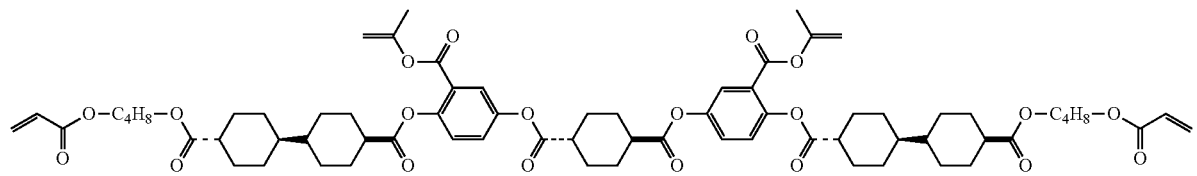
(LC-33)
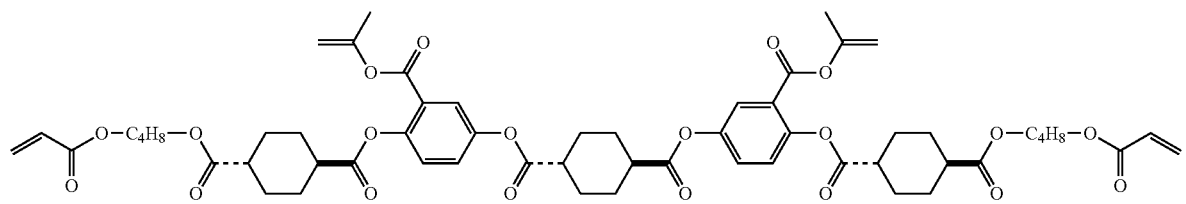
(LC-34)
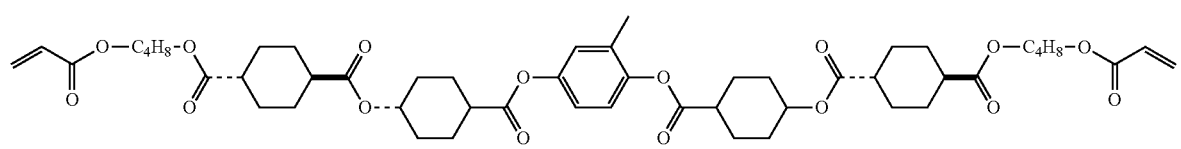
(LC-35)
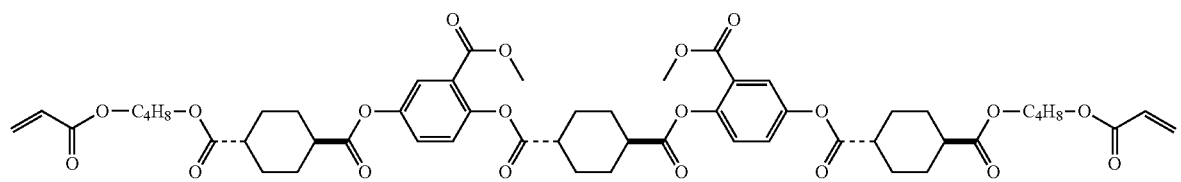
(LC-36)
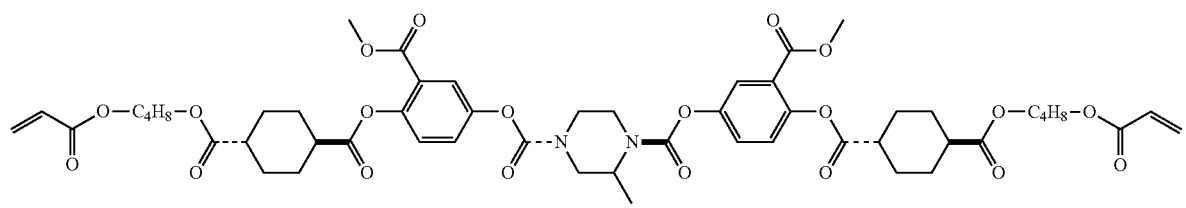
(LC-37)
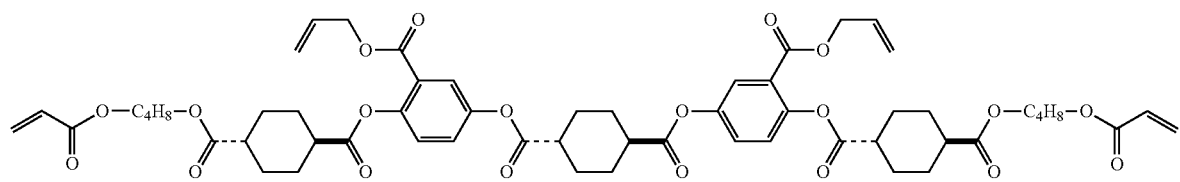
(LC-38)
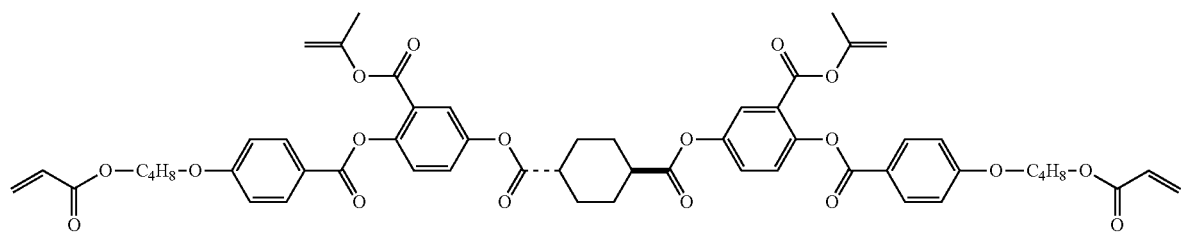

-continued
(LC-39)
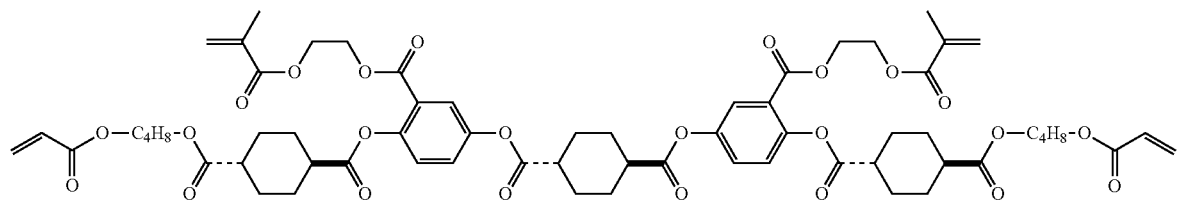
(LC-40)
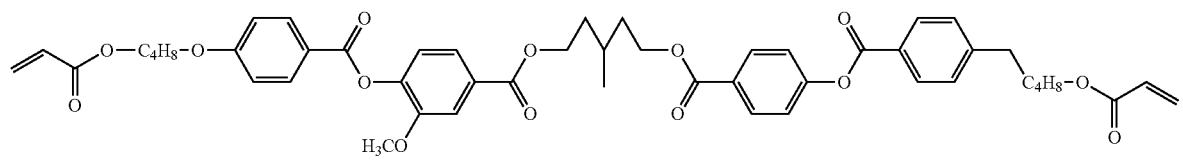
(LC-41)
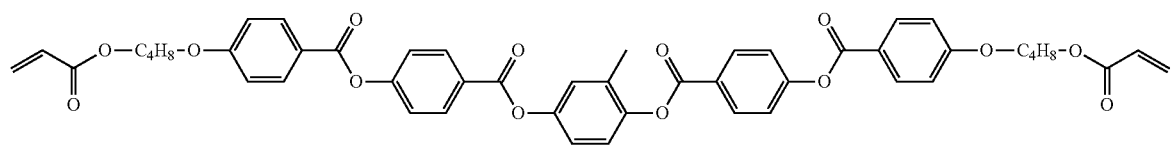
(LC-42)
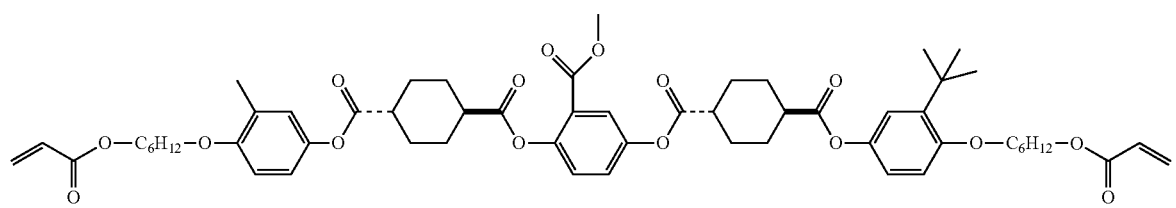
(LC-43)
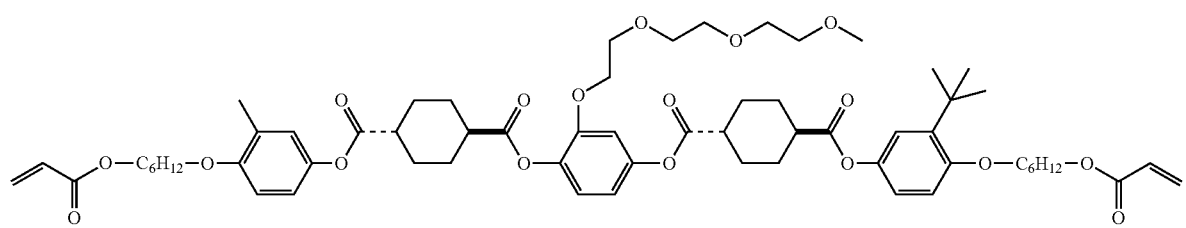
(LC-44)
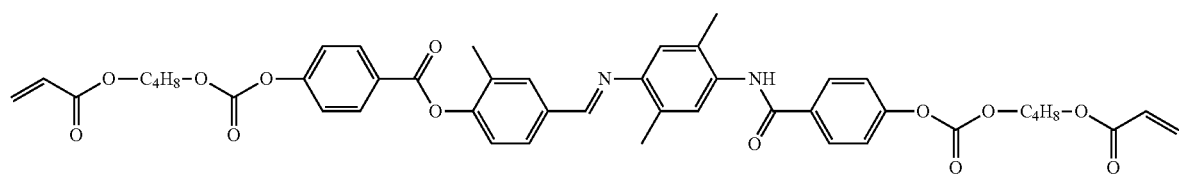
(LC-45)
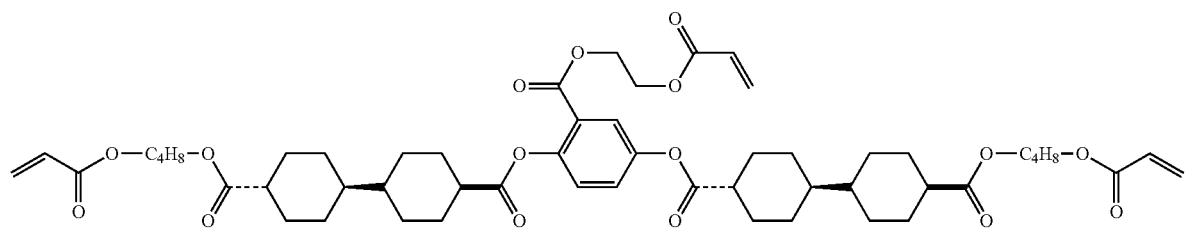

-continued
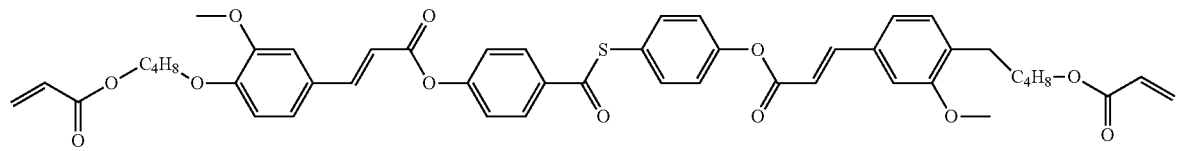
(LC-46)
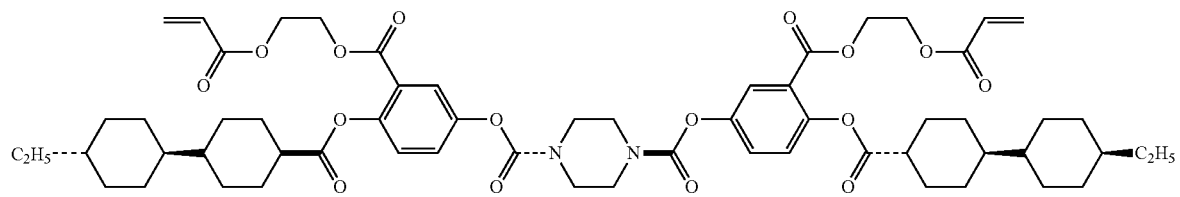
(LC-47)
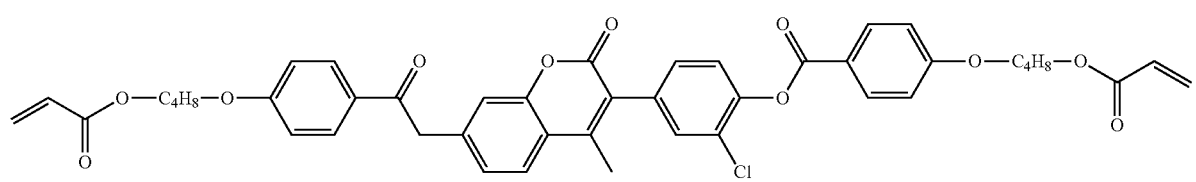
(LC-48)
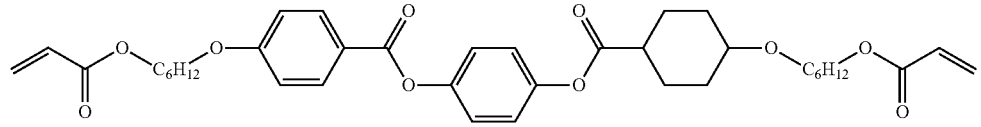
(LC-49)
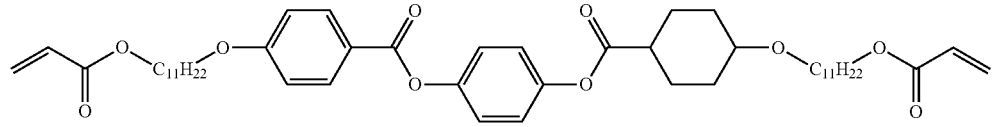
(LC-50)
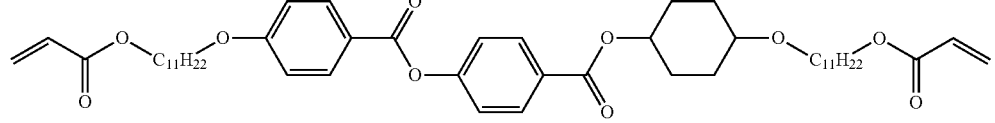
(LC-51)
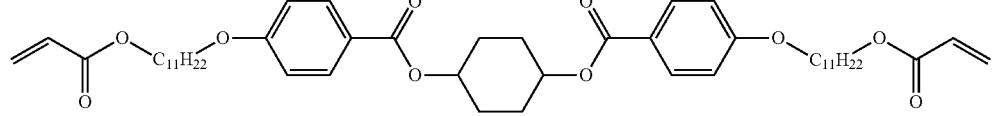
(LC-52)
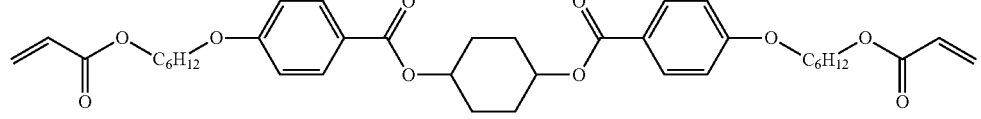
(LC-53)
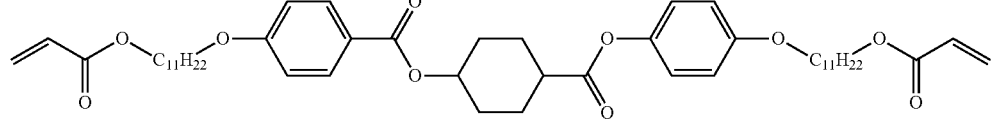
(LC-54)
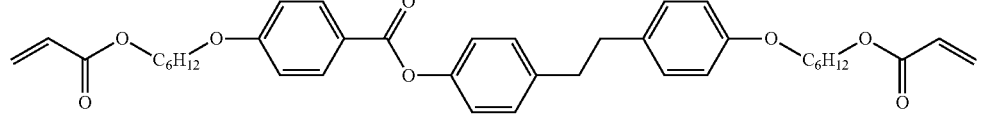
(LC-55)

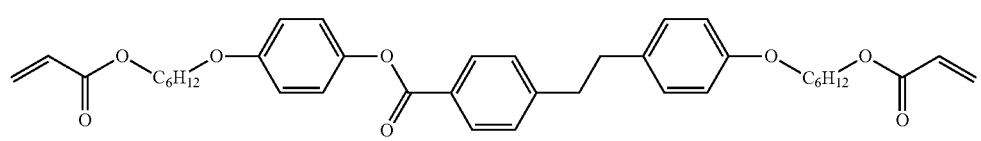
(LC-56)
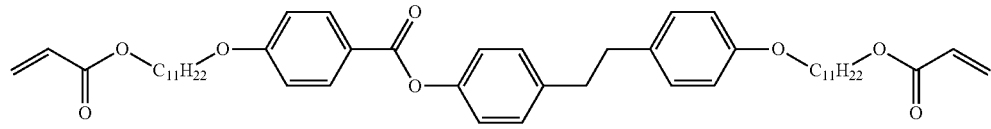
(LC-57)
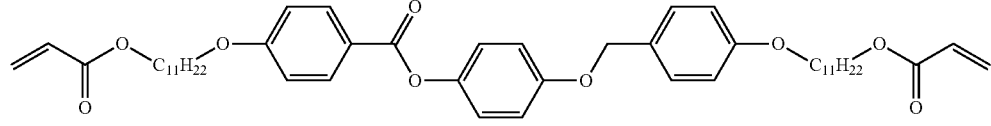
(LC-58)
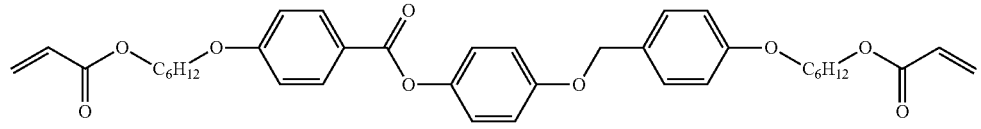
(LC-59)
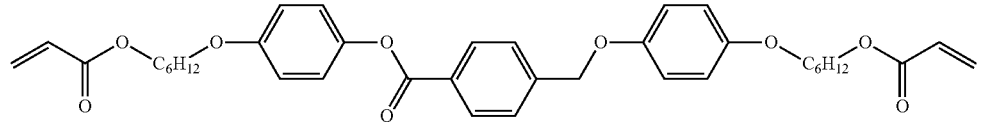
(LC-60)
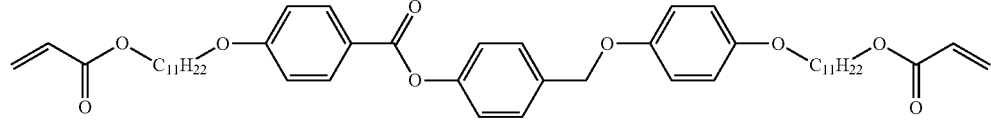
(LC-61)
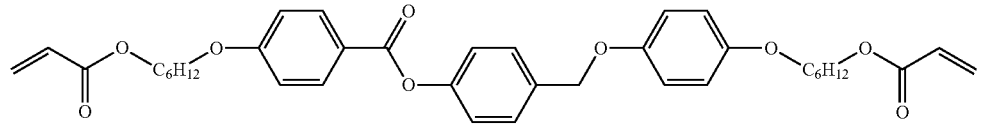
(LC-62)
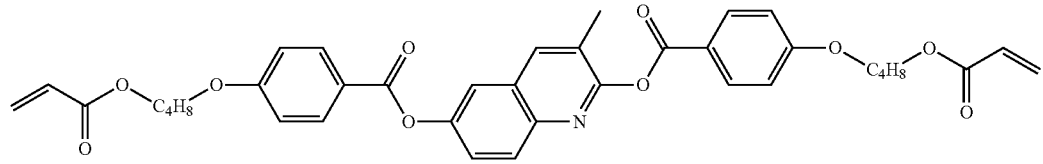
(LC-63)
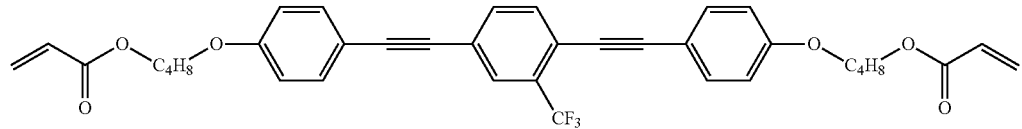
(LC-64)
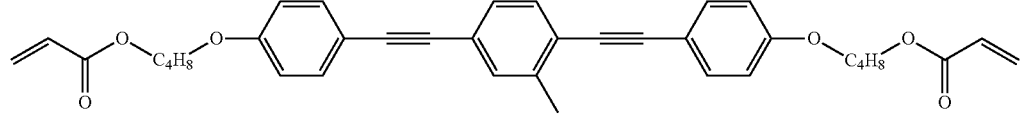
(LC-65)
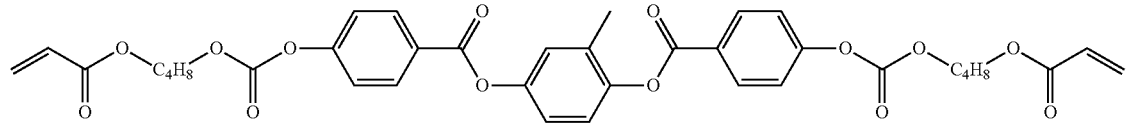
(LC-65)

-continued
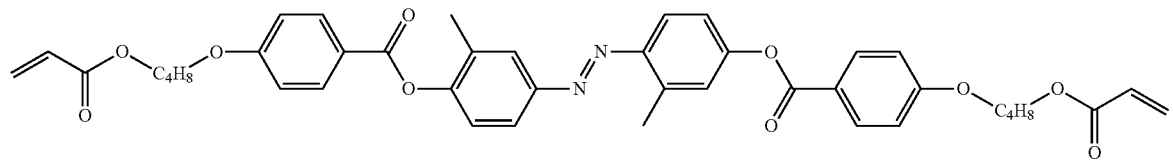
(LC-66)
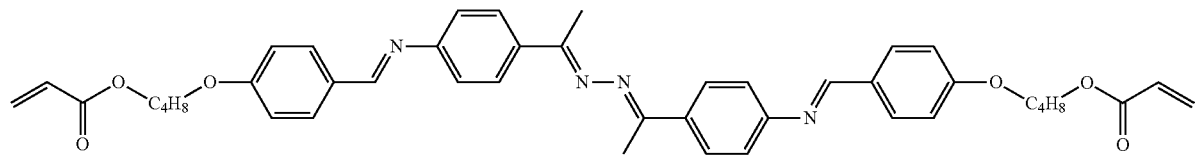
(LC-67)
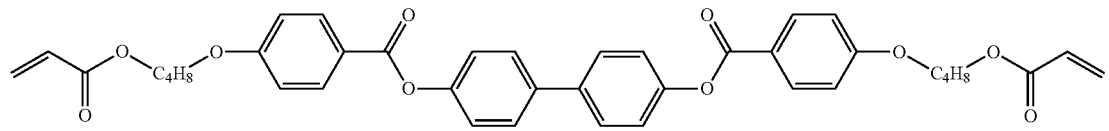
(LC-68)
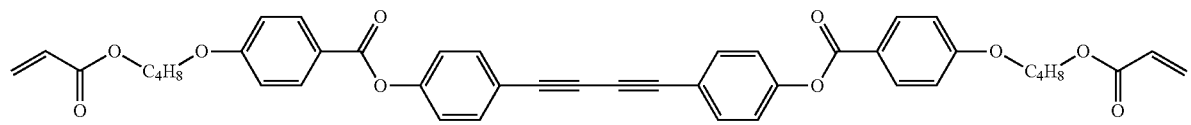
(LC-69)
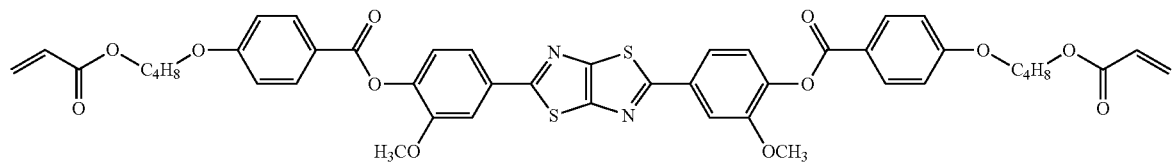
(LC-70)
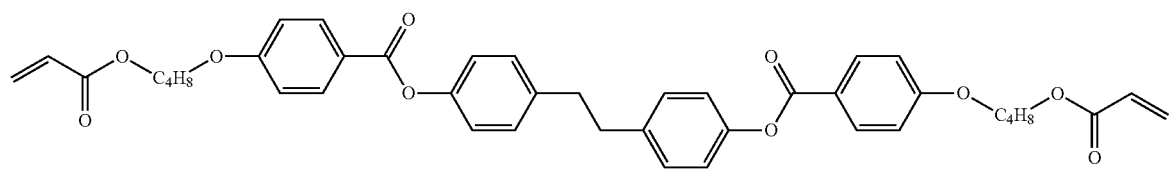
(LC-71)
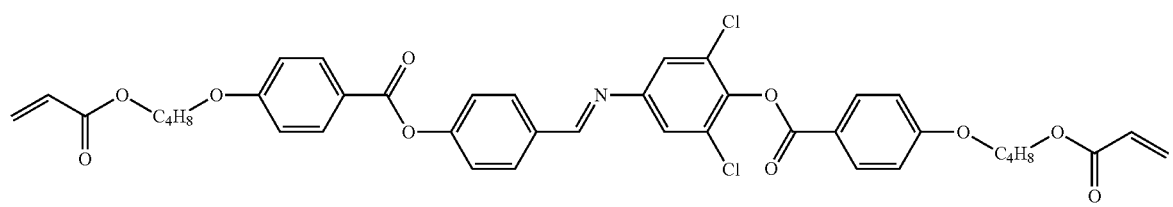
(LC-72)
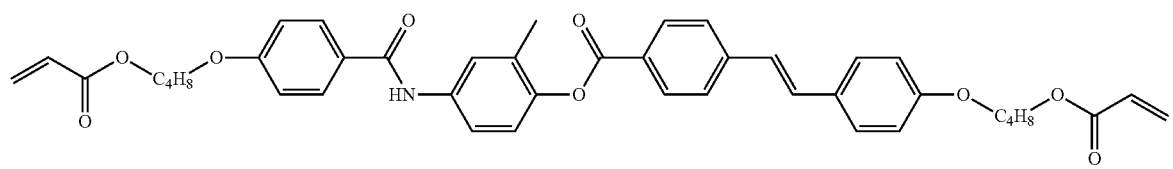
(LC-73)

-continued

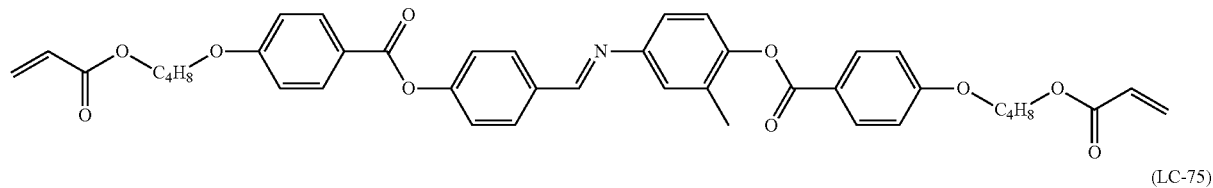
(LC-74)

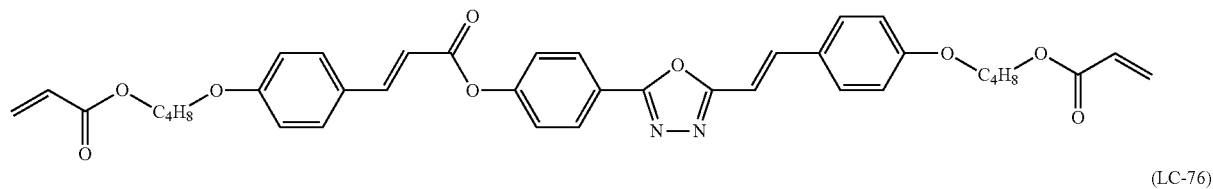
(LC-75)

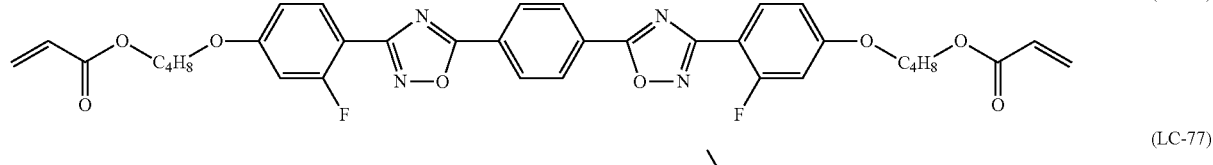
(LC-76)

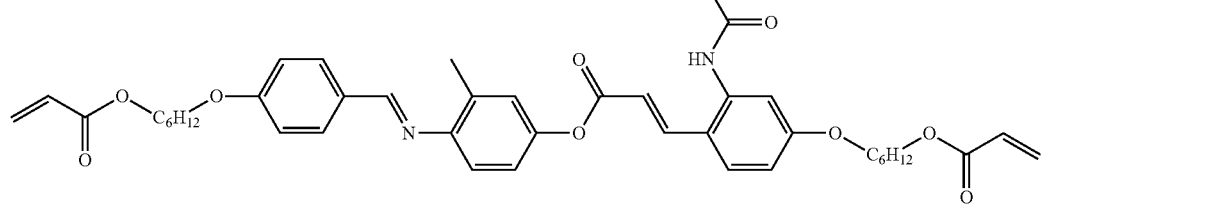
(LC-77)

The high-molecular-weight liquid crystalline compound is preferably a homopolymer or a copolymer, including a repeating unit described below, and may be any of a random polymer, a block polymer, a graft polymer, or a star polymer.

(Repeating Unit (1))

It is preferable that the high-molecular-weight liquid crystalline compound includes a repeating unit represented by Formula (1) (hereinafter, also referred to as "repeating unit (1)").

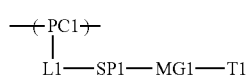
(1)

In Formula (1), PC1 represents a main chain of the repeating unit, L1 represents a single bond or a divalent linking group, SP1 represents a spacer group, MG1 represents the mesogen group MG in Formula (LC) described above, and T1 represents a terminal group.

Examples of the main chain of the repeating unit, represented by PC1, include groups represented by Formulae (P1-A) to (P1-D). Among these, from the viewpoint of diversity and handleability of a monomer serving as a raw material, a group represented by Formula (P1-A) is preferable.

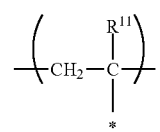
(P1-A)

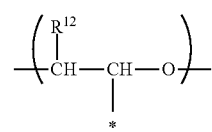
(P1-B)

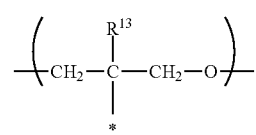
(P1-C)

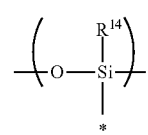
(P1-D)

In Formulae (P1-A) to (P1-D), "*" represents a bonding position to L1 in Formula (1). In Formulae (P1-A) to (P1-D), $R^{11}$, $R^{12}$, $R^{13}$, and $R^{14}$ each independently represent a hydrogen atom, a halogen atom, a cyano group, an alkyl group having 1 to 10 carbon atoms, or an alkoxy group having 1 to 10 carbon atoms. The above-described alkyl group may be a linear or branched alkyl group, or an alkyl group having a cyclic structure (cycloalkyl group). In addition, the number of carbon atoms in the above-described alkyl group is preferably 1 to 5.

It is preferable that the group represented by Formula (P1-A) is one unit of a partial structure of poly(meth)acrylic acid ester, which is obtained by polymerization of (meth) acrylic acid ester.

It is preferable that the group represented by Formula (P1-B) is an ethylene glycol unit formed by ring-opening polymerization of an epoxy group of a compound having the epoxy group.

It is preferable that the group represented by Formula (P1-C) is a propylene glycol unit formed by ring-opening polymerization of an oxetane group of a compound having the oxetane group.

It is preferable that the group represented by Formula (P1-D) is a siloxane unit of a polysiloxane obtained by polycondensation of a compound having at least one of an alkoxysilyl group or a silanol group. Here, examples of the compound having at least one of an alkoxysilyl group or a silanol group include a compound having a group represented by Formula $SiR^{14}(OR^{15})_2$—. In the formula, $R^{14}$ has the same definition as that for $R^{14}$ in Formula (P1-D), and a plurality of $R^{15}$'s each independently represent a hydrogen atom or an alkyl group having 1 to 10 carbon atoms.

The divalent linking group represented by L1 is the same divalent linking group as LW in Formula (W1) described above, and examples of preferred aspects thereof include —C(O)O—, —OC(O)—, —O—, —S—, —C(O)NR$^{16}$—, —NR$^{16}$C(O)—, —S(O)$_2$—, and —NR$^{17}$—. In the formulae, $R^{16}$ and $R^{17}$ each independently represent a hydrogen atom or an alkyl group having 1 to 6 carbon atoms, which may have a substituent (for example, the substituent W described above). In the specific examples of the divalent linking group, the bonding site on the left side is bonded to PC1 and the bonding site on the right side is bonded to SP1.

In a case where PC1 represents the group represented by Formula (P1-A), it is preferable that L1 is a group represented by —C(O)O— or —C(O)NR$^{16}$—.

In a case where PC1 represents the group represented by any of Formulae (P1-B) to (P1-D), it is preferable that L1 is a single bond.

The spacer group represented by SP1 represents the same groups as S1 and S2 in Formula (LC) described above, and from the viewpoint of the alignment degree, a group having at least one structure selected from the group consisting of an oxyethylene structure, an oxypropylene structure, a polysiloxane structure, and an alkylene fluoride structure, or a linear or branched alkylene group having 2 to 20 carbon atoms is preferable. However, the above-described alkylene group may include —O—, —S—, —O—CO—, —CO—O—, —O—CO—O—, —CO—NR— (R represents an alkyl group having 1 to 10 carbon atoms), or —S(O)$_2$—.

From the viewpoint of easily expressing liquid crystallinity and availability of raw materials, it is more preferable that the spacer group represented by SP1 is a group having at least one structure selected from the group consisting of an oxyethylene structure, an oxypropylene structure, a polysiloxane structure, and an alkylene fluoride structure.

Here, the oxyethylene structure represented by SP1 is preferably a group represented by *—(CH$_2$—CH$_2$O)$_{n1}$—* is preferable. In the formula, n1 represents an integer of 1 to 20, and * represents a bonding position to L1 or MG1. From the viewpoint that the effect of the present invention is more excellent, n1 is preferably an integer of 2 to 10, more preferably an integer of 2 to 6, and most preferably an integer of 2 to 4.

In addition, the oxypropylene structure represented by SP1 is preferably a group represented by *—(CH(CH$_3$)—CH$_2$O)$_{n2}$—*. In the formula, n2 represents an integer of 1 to 3, and * represents a bonding position to L1 or MG1.

In addition, the polysiloxane structure represented by SP1 is preferably a group represented by *—(Si(CH$_3$)$_2$—O)$_{n3}$—*. In the formula, n3 represents an integer of 6 to 10, and * represents a bonding position to L1 or MG1.

In addition, the alkylene fluoride structure represented by SP1 is preferably a group represented by *—(CF$_2$—CF$_2$)$_{n4}$—*. In the formula, n4 represents an integer of 6 to 10, and * represents a bonding position to L1 or MG1.

Examples of the terminal group represented by T1 include a hydrogen atom, a halogen atom, a cyano group, a nitro group, a hydroxy group, —SH, a carboxyl group, a boronic acid group, —SO$_3$H, —PO$_3$H$_2$, —NR$^{11}$R$^{12}$ (R$^{11}$ and R$^{12}$ each independently represent a hydrogen atom, a substituted or unsubstituted alkyl group having 1 to 10 carbon atoms, a cycloalkyl group, or an aryl group), an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an acyloxy group having 1 to 10 carbon atoms, an acylamino group having 1 to 10 carbon atoms, an alkoxycarbonyl group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a crosslinkable group-containing group.

Examples of the above-described crosslinkable group-containing group include -L-CL described above. L represents a single bond or a divalent linking group. Specific examples of the linking group are the same as those for LW and SPW described above. CL represents a crosslinkable group, examples thereof include the group represented by Q1 or Q2 described above, and the above-described crosslinkable group represented by any of Formulae (P-1) to (P-30) is preferable. In addition, T1 may be a group obtained by combining two or more of these groups.

From the viewpoint that the effect of the present invention is more excellent, T1 is preferably an alkoxy group having 1 to 10 carbon atoms, more preferably an alkoxy group having 1 to 5 carbon atoms, and still more preferably a methoxy group. These terminal groups may be further substituted with the groups or polymerizable groups described in JP2010-244038A.

From the viewpoint that the effect of the present invention is more excellent, the number of atoms in the main chain of T1 is preferably 1 to 20, more preferably 1 to 15, still more preferably 1 to 10, and particularly preferably 1 to 7. In a case where the number of atoms in the main chain of T1 is 20 or less, the alignment degree of the light absorption anisotropic layer is further improved. Here, the "main chain" of T1 means the longest molecular chain bonded to M1, and the number of hydrogen atoms is not included in the number of atoms in the main chain of T1. For example, in a case where T1 is an n-butyl group, the number of atoms in the main chain is 4, and in a case where T1 is an sec-butyl group, the number of atoms in the main chain is 3.

A content of the repeating unit (1) is preferably 40% to 100% by mass and more preferably 50% to 95% by mass with respect to all repeating units (100% by mass) of the high-molecular-weight liquid crystalline compound.

In a case where the content of the repeating unit (1) is 40% by mass or more, an excellent light absorption anisotropic layer can be obtained due to favorable aligning properties. In addition, in a case where the content of the repeating unit (1) is 100% by mass or less, an excellent light absorption anisotropic layer can be obtained due to favorable aligning properties.

The high-molecular-weight liquid crystalline compound may include only one of the repeating unit (1), or two or more kinds of the repeating units (1). In a case where the high-molecular-weight liquid crystalline compound includes two or more kinds of repeating units (1), the above-described content of the repeating unit (1) indicates the total content of the repeating units (1).

In Formula (1), a difference ($|\log P_1 - \log P_2|$) between a log P value of PC1, L1, and SP1 (hereinafter, also referred to as "log $P_1$") and a log P value of MG1 (hereinafter, also referred to as "log $P_2$") is preferably 4 or more, and from the viewpoint of further improving the alignment degree of the light absorption anisotropic layer, it is more preferably 4.25 or more and still more preferably 4.5 or more.

In addition, from the viewpoint of adjusting the liquid crystal phase transition temperature and the synthetic suitability, the upper limit value of the above-described difference is preferably 15 or less, more preferably 12 or less, and still more preferably 10 or less.

Here, the log P value is an index for expressing properties of hydrophilicity and hydrophobicity of a chemical structure, and is also referred to as a hydrophilic-hydrophobic parameter. The log P value can be calculated using software such as ChemBioDraw Ultra or HSPiP (Ver. 4.1.07). In addition, the log P value can be acquired experimentally by the method of the OECD Guidelines for the Testing of Chemicals, Sections 1, Test No. 117, or the like. In the present invention, a value calculated by inputting the structural formula of a compound to HSPiP (Ver. 4.1.07) is adopted as the log P value unless otherwise specified.

The above-described log $P_1$ indicates the log P value of PC1, L1, and SP1 as described above. The expression "log P value of PC1, L1, and SP1" indicates the log P value of a structure in which PC1, L1, and SP1 are integrated, which is not the sum of the log P values of PC1, L1, and SP1. Specifically, the log $P_1$ is calculated by inputting a series of structural formulae of PC1 to SP1 in Formula (1) into the above-described software.

However, in the calculation of the log $P_1$, with regard to a part of the group represented by PC1 in the series of structural formulae of PC1 to SP1, the structure of the group represented by PC1 itself (for example, Formulae (P1-A) to (P1-D) described above) may be used, or a structure of a group which can be PC1 after polymerization of a monomer used to obtain the repeating unit represented by Formula (1) may be used.

Here, specific examples of the latter (the group which can be PC1) are as follows. In a case where PC1 is obtained by polymerization of (meth)acrylic acid ester, PC1 is a group represented by $CH_2=C(R^1)-$ ($R^1$ represents a hydrogen atom or a methyl group). In addition, in a case where PC1 is obtained by polymerization of ethylene glycol, PC1 is ethylene glycol, and in a case where PC1 is obtained by polymerization of propylene glycol, PC1 is propylene glycol. In addition, in a case where PC1 is obtained by condensation polymerization of silanol, PC1 is silanol (a compound represented by Formula $Si(R^2)_3(OH)$; a plurality of $R^2$'s each independently represent a hydrogen atom or an alkyl group, and at least one of the plurality of $R^2$'s represents an alkyl group).

The above-described difference between log $P_1$ and log $P_2$ is preferably 4 or more, and the log $P_1$ may be less than the log $P_2$ or may be more than the log $P_2$.

Here, the log P value of a general mesogen group (the log $P_2$ described above) tends to be in a range of 4 to 6. In a case where the log $P_1$ is less than the log $P_2$, the value of log $P_1$ is preferably 1 or less and more preferably 0 or less. On the other hand, in a case where the log $P_1$ is more than the log $P_2$, the value of log $P_1$ is preferably 8 or more and more preferably 9 or more.

In a case where PC1 in Formula (1) is obtained by polymerization of (meth)acrylic acid ester and the log $P_1$ is less than the log $P_2$, the log P value of SP1 in Formula (1) is preferably 0.7 or less and more preferably 0.5 or less. On the other hand, in a case where PC1 in Formula (1) is obtained by polymerization of (meth)acrylic acid ester and the log $P_1$ is more than the log $P_2$, the log P value of SP1 in Formula (1) is preferably 3.7 or more and more preferably 4.2 or more.

Examples of the structure having a log P value of 1 or less include an oxyethylene structure and an oxypropylene structure. Examples of the structure having a log P value of 6 or more include a polysiloxane structure and an alkylene fluoride structure.

From the viewpoint of improving the alignment degree, it is preferable that the high-molecular-weight liquid crystalline compound has a repeating unit having an electron-donating property and/or an electron-withdrawing property at a terminal. More specifically, it is more preferable that the high-molecular-weight liquid crystalline compound includes a repeating unit (21) having a mesogen group and an electron-withdrawing group which is present at the terminal of the mesogen group and has a σp value of more than 0, and a repeating unit (22) having a mesogen group and a group which is present at the terminal of the mesogen group and has a σp value of 0 or less. As described above, in a case where the high-molecular-weight liquid crystalline compound includes the repeating unit (21) and the repeating unit (22), the alignment degree of the light absorption anisotropic layer to be formed using the high-molecular-weight liquid crystalline compound is further improved as compared with a case where the high-molecular-weight liquid crystalline compound has only one of the repeating unit (21) or the repeating unit (22). The details of the reason for this are not clear, but it is presumed as follows. That is, it is presumed that, since opposite dipole moments generated in the repeating unit (21) and the repeating unit (22) cause intermolecular interactions, an interaction between the mesogen groups in a minor axis direction is strengthened, and an orientation in which the liquid crystals are aligned is more uniform, and as a result, the degree of order of the liquid crystals is considered to be high. Accordingly, it is presumed that the aligning properties of the organic dichroic coloring agent are enhanced, and thus the alignment degree of the light absorption anisotropic layer to be formed increases.

The repeating units (21) and (22) described above may be the repeating unit represented by Formula (1) described above.

The repeating unit (21) has a mesogen group and an electron-withdrawing group which is present at the terminal of the mesogen group and has a σp value of more than 0.

The above-described electron-withdrawing group is a group which is positioned at the terminal of the mesogen group and has a σp value of more than 0. Examples of the electron-withdrawing group (group having a σp value of more than 0) include a group represented by EWG in Formula (LCP-21) described below, and specific examples thereof are also the same as those described below.

The σp value of the above-described electron-withdrawing group is more than 0, and from the viewpoint of further increasing the alignment degree of the light absorption anisotropic layer, it is preferably 0.3 or more and more preferably 0.4 or more. From the viewpoint that the uniformity of alignment is excellent, the upper limit of the σp value of the above-described electron-withdrawing group is preferably 1.2 or less and more preferably 1.0 or less.

The σp value is a Hammett's substituent constant σp value (also simply referred to as "σp value") and is a parameter showing the intensity of the electron-withdrawing property and the electron-donating property of a substituent, which numerically expresses the effect of the substituent on the acid dissociation equilibrium constant of substituted benzoic acid. The Hammett's substituent constant σp value in the present specification indicates the substituent constant σ in a case where the substituent is positioned at the para-position of benzoic acid.

As the Hammett's substituent constant σp value of each group in the present specification, a value described in the document "Hansch et al., Chemical Reviews, 1991, Vol, 91, No. 2, pp. 165 to 195" are adopted. With regard to a group in which the Hammett's substituent constant σp value is not described in the document above, the Hammett's substituent constant σp value can be calculated using software "ACD/Chem Sketch (ACD/Labs 8.00 Release Product Version: 8.08)" based on a difference between the pKa of benzoic acid and the pKa of a benzoic acid derivative having a substituent at the para-position.

The repeating unit (21) is not particularly limited as long as it has, at a side chain thereof, the mesogen group and the electron-withdrawing group which present at the terminal of the mesogen group and has a σp value of more than 0, but from the viewpoint of further increasing the alignment degree of the light absorption anisotropic layer, a repeating unit represented by Formula (LCP-21) is preferable.

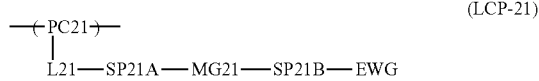

(LCP-21)

In Formula (LCP-21), PC21 represents a main chain of a repeating unit, and more specifically represents the same structure as that for PC1 in Formula (1) described above; L21 represents a single bond or a divalent linking group, and more specifically represents the same structure as that for L1 in Formula (1) described above; SP21A and SP21B each independently represent a single bond or a spacer group, and more specifically represent the same structure as that for SP1 in Formula (1) described above; MG21 represents a mesogen structure, and more specifically represents the mesogen group MG in Formula (LC) described above; and EWG represents an electron-withdrawing group having a σp value of more than 0.

The spacer group represented by SP21A and SP21B represent the same groups as Formulae S1 and S2 described above, and a group having at least one structure selected from the group consisting of an oxyethylene structure, an oxypropylene structure, a polysiloxane structure, and an alkylene fluoride structure, or a linear or branched alkylene group having 2 to 20 carbon atoms is preferable. However, the above-described alkylene group may include —O—, —O—CO—, —CO—O—, or —O—CO—O—.

From the viewpoint of easily expressing liquid crystallinity and availability of raw materials, it is preferable that the spacer group represented by SP1 has at least one structure selected from the group consisting of an oxyethylene structure, an oxypropylene structure, a polysiloxane structure, and an alkylene fluoride structure.

It is preferable that SP21B is a single bond or a linear or branched alkylene group having 2 to 20 carbon atoms. However, the above-described alkylene group may include —O—, —O—CO—, —CO—O—, or —O—CO—O—.

Among these, from the viewpoint of further increasing the alignment degree of the light absorption anisotropic layer, the spacer group represented by SP21B is preferably a single bond. In other words, it is preferable that the repeating unit (21) has a structure in which EWG which the electron-withdrawing group in Formula (LCP-21) is directly linked to MG21 which is the mesogen group in Formula (LCP-21). In this manner, it is presumed that, in a case where the electron-withdrawing group is directly linked to the mesogen group, the intermolecular interaction due to an appropriate dipole moment works more effectively in the high-molecular-weight liquid crystalline compound, and the orientation in which the liquid crystals are aligned is more uniform, and as a result, the degree of order of the liquid crystals and the alignment degree are considered to be high.

EWG represents an electron-withdrawing group having a σp value of more than 0. Examples of the electron-withdrawing group having a σp value of more than 0 include an ester group (specifically, a group represented by *—C(O)O—R$^E$), a (meth)acryloyl group, a (meth)acryloyloxy group, a carboxy group, a cyano group, a nitro group, a sulfo group, —S(O)(O)—OR$^E$, —S(O)(O)—R$^E$, —O—S(O)(O)—R$^E$, an acyl group (specifically, a group represented by *—C(O)R$^E$), an acyloxy group (specifically, a group represented by *—OC(O)R$^E$), an isocyanate group (—N=C(O)), *—C(O)N(R$^F$)$_2$, a halogen atom, and an alkyl group substituted with any of these groups (preferably having 1 to 20 carbon atoms). In each of the above-described groups, * represents a bonding position to SP21B. R$^E$ represents an alkyl group having 1 to 20 carbon atoms (preferably 1 to 4 carbon atoms and more preferably 1 or 2 carbon atoms). R$^F$'s each independently represents a hydrogen atom or an alkyl group having 1 to 20 carbon atoms (preferably 1 to 4 carbon atoms and more preferably 1 or 2 carbon atoms).

Among the above-described groups, from the viewpoint of further exhibiting the effect of the present invention, it is preferable that EWG is a group represented by *—C(O)O—R$^E$, a (meth)acryloyloxy group, a cyano group, or a nitro group.

From the viewpoint that the high-molecular-weight liquid crystalline compound and the organic dichroic coloring agent can be uniformly aligned while maintaining a high alignment degree of the light absorption anisotropic layer, a content of the repeating unit (21) is preferably 60% by mass or less, more preferably 50% by mass or less, and still more preferably 45% by mass or less with respect to all repeating units (100% by mass) of the high-molecular-weight liquid crystalline compound.

From the viewpoint of further exhibiting the effect of the present invention, the lower limit of the content of the repeating unit (21) is preferably 1% by mass or more and more preferably 3% by mass or more with respect to all repeating units (100% by mass) of the high-molecular-weight liquid crystalline compound.

In the present invention, the content of each repeating unit included in the high-molecular-weight liquid crystalline compound is calculated based on the charged amount (mass) of each monomer used for obtaining each repeating unit.

The high-molecular-weight liquid crystalline compound may include only one of the repeating unit (21), or two or more kinds of the repeating units (21). In a case where the high-molecular-weight liquid crystalline compound includes two or more kinds of repeating units (21), there is an advantage in that solubility of the high-molecular-weight liquid crystalline compound in a solvent is improved and the liquid crystal phase transition temperature is easily adjusted. In the case where the high-molecular-weight liquid crystalline compound includes two or more kinds of repeating units (21), it is preferable that the total amount thereof is within the above-described range.

In the case where the high-molecular-weight liquid crystalline compound includes two or more kinds of repeating units (21), a repeating unit (21) which does not include a crosslinkable group in EWG and a repeating unit (21) which includes a polymerizable group in EWG may be used in combination.

In this manner, curing properties of the light absorption anisotropic layer are further improved. As the crosslinkable group, a vinyl group, a butadiene group, a (meth)acryloyl group, a (meth)acrylamide group, a vinyl acetate group, a fumaric acid ester group, a styryl group, a vinylpyrrolidone group, a maleic acid anhydride, a maleimide group, a vinyl ether group, an epoxy group, or an oxetanyl group is preferable.

In this case, from the viewpoint of balance between the curing properties and the alignment degree of the light absorption anisotropic layer, a content of the repeating unit (21) including a polymerizable group in EWG is preferably 1% to 30% by mass with respect to all repeating units (100% by mass) of the high-molecular-weight liquid crystalline compound.

Hereinafter, examples of the repeating unit (21) are shown below, but the repeating unit (21) is not limited to the following repeating units.

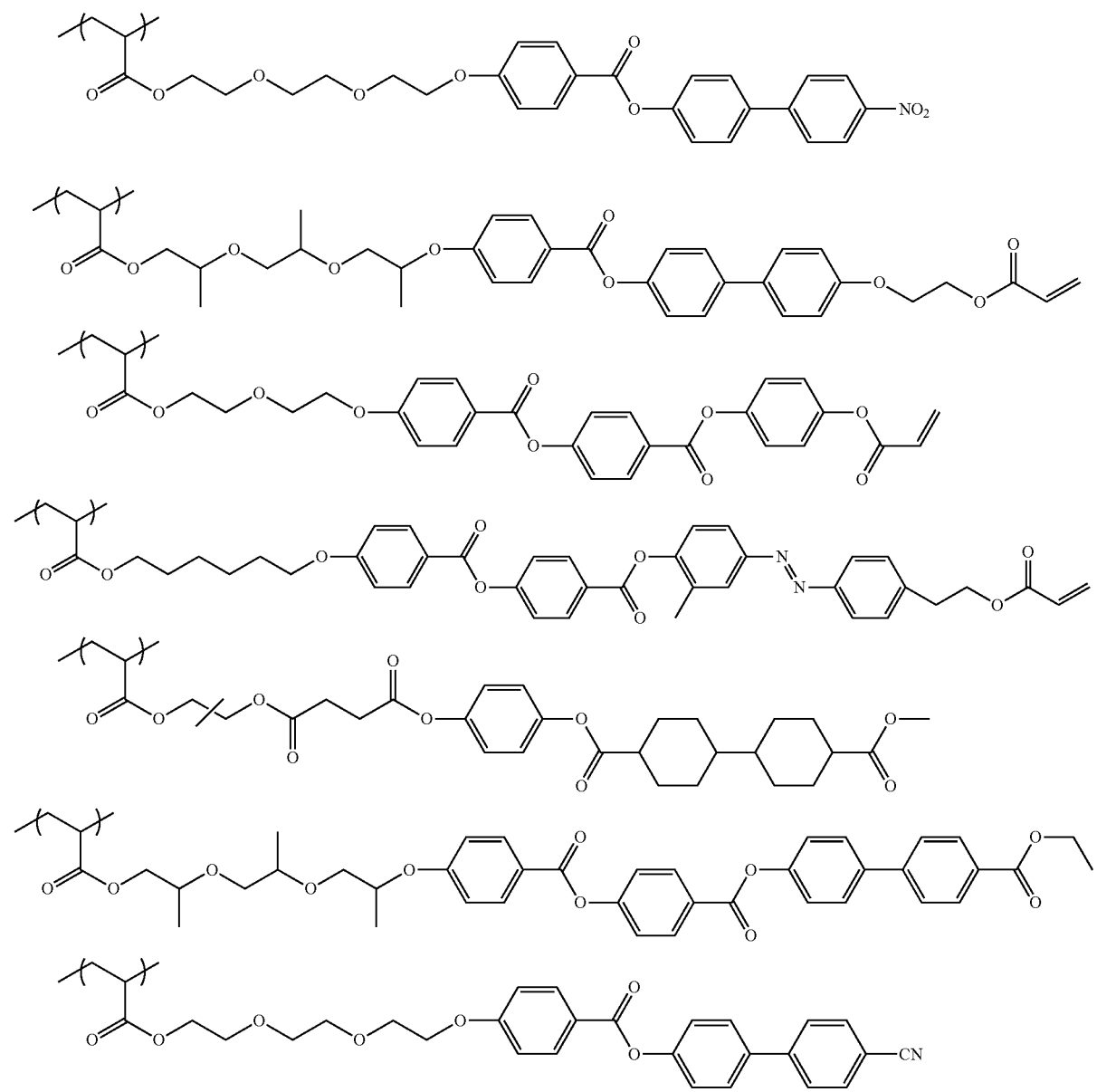

-continued
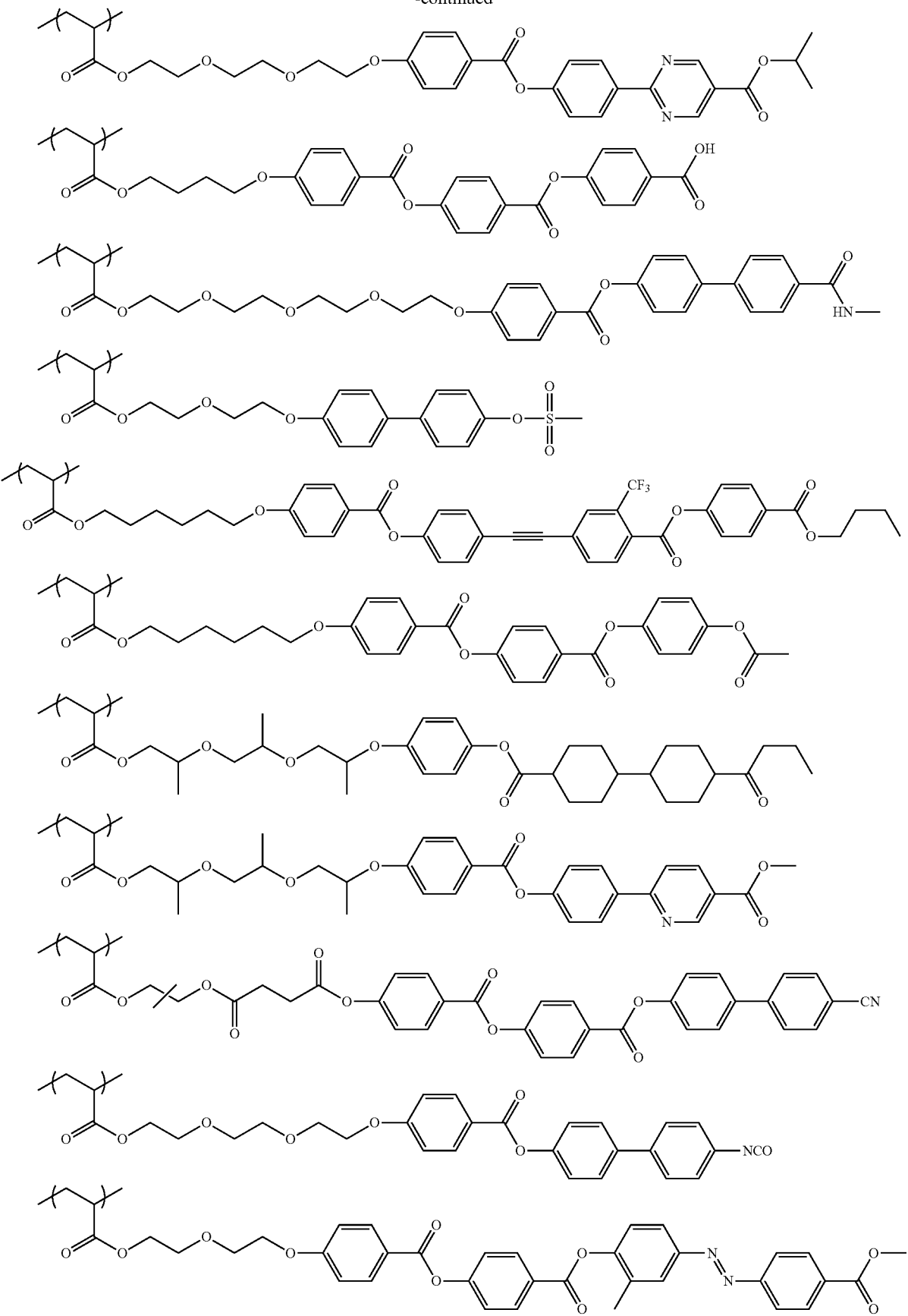

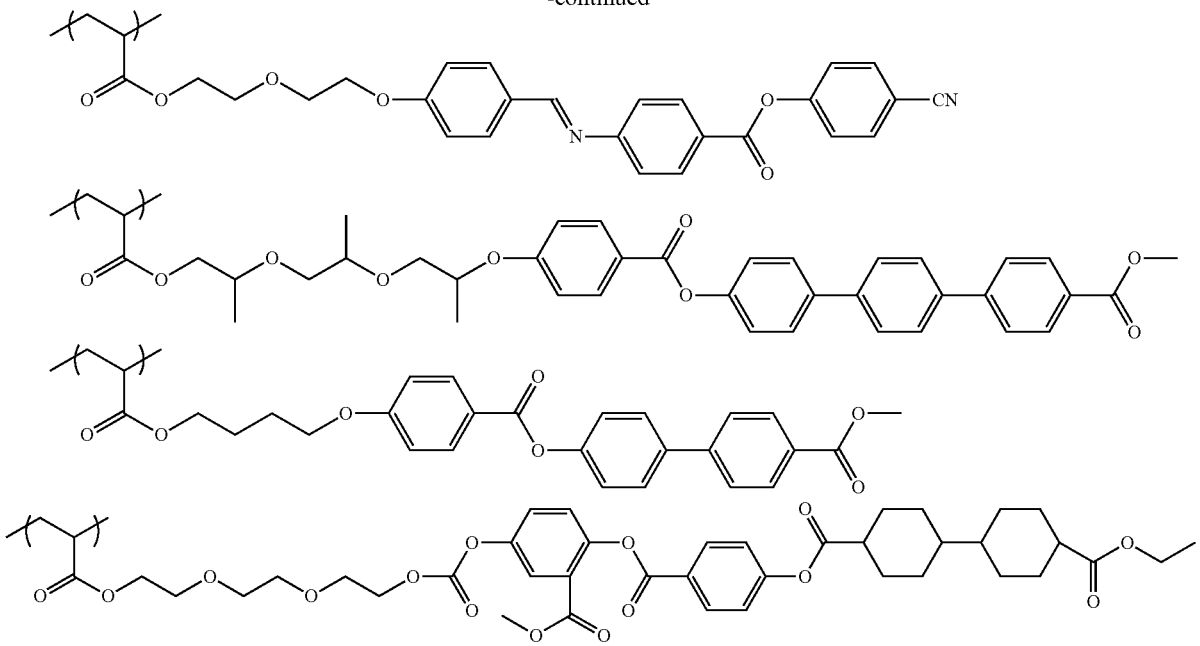

As a result of intensive studies on composition (content ratio) and electron-donating property and electron-withdrawing property of the terminal groups in the repeating unit (21) and the repeating unit (22), the present inventors have found that the alignment degree of the light absorption anisotropic layer is further increased by decreasing the content ratio of the repeating unit (21) in a case where the electron-withdrawing property of the electron-withdrawing group of the repeating unit (21) is high (that is, in a case where the σp value is large) and that the alignment degree of the light absorption anisotropic layer is further increased by increasing the content ratio of the repeating unit (21) in a case where the electron-withdrawing property of the electron-withdrawing group of the repeating unit (21) is low (that is, in a case where the σp value is close to 0).

The details of the reason for this are not clear, but it is presumed as follows. That is, it is presumed that, since the intermolecular interaction due to an appropriate dipole moment works in the high-molecular-weight liquid crystalline compound, the orientation in which the liquid crystals are aligned is more uniform, and as a result, the degree of order of the liquid crystals and the alignment degree of the light absorption anisotropic layer are considered to be high.

Specifically, the product of the σp value of the above-described electron-withdrawing group (EWG in Formula (LCP-21)) in the repeating unit (21) and the content ratio (on a mass basis) of the repeating unit (21) to the high-molecular-weight liquid crystalline compound is preferably 0.020 to 0.150, more preferably 0.050 to 0.130, and still more preferably 0.055 to 0.125. In a case where the above-described product is within the above-described range, the alignment degree of the light absorption anisotropic layer is further increased.

The repeating unit (22) has a mesogen group and a group which is present at the terminal of the mesogen group and has a σp value of 0 or less. In a case where the high-molecular-weight liquid crystalline compound has the repeating unit (22), the high-molecular-weight liquid crystalline compound and the organic dichroic coloring agent can be uniformly aligned.

The mesogen group is a group representing a main skeleton of a liquid crystal molecule which contributes to liquid crystal formation, the details thereof are as described in MG of Formula (LCP-22) described below, and specific examples thereof are also the same as described below.

The above-described group is positioned at the terminal of the mesogen group and has a σp value of 0 or less. Examples of the above-described group (a group having a σp value of 0 or less) include a hydrogen atom having a σp value of 0, and a group (electron-donating group) which has a σp value of less than 0 and is represented by T22 in Formula (LCP-22) described below. Among the above-described groups, specific examples of the group (electron-donating group) having a σp value of less than 0 are the same as those for T22 in Formula (LCP-22) described below.

The σp value of the above-described group is 0 or less, and from the viewpoint that the uniformity of alignment is more excellent, it is preferably less than 0, more preferably −0.1 or less, and still more preferably −0.2 or less. The lower limit value of the σp value of the above-described group is preferably −0.9 or more and more preferably −0.7 or more.

The repeating unit (22) is not particularly limited as long as it has, at a side chain thereof, the mesogen group and the group which is present at the terminal of the mesogen group and has a σp value of 0 or less, and from the viewpoint of further increasing the uniformity of alignment of liquid crystal, a repeating unit represented by Formula (LCP-22), which does not correspond to the above-described repeating unit represented by Formula (LCP-21), is preferable.

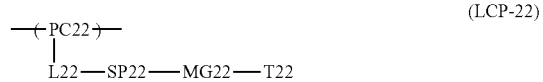

(LCP-22)

In Formula (LCP-22), PC22 represents a main chain of the repeating unit, and more specifically represents the same structure as that for PC1 in Formula (1) described above;

L22 represents a single bond or a divalent linking group, and more specifically represents the same structure as that for L1 in Formula (1) described above; SP22 represents a spacer group, and more specifically represents the same structure as that for SP1 in Formula (1) described above; MG22 represents a mesogen structure, and more specifically represents the same structure as the mesogen group MG in Formula (LC) described above; and T22 represents an electron-donating group having a Hammett's substituent constant σp value of less than 0.

T22 represents an electron-donating group having a σp value of less than 0. Examples of the electron-donating group having a σp value of less than 0 include a hydroxy group, an alkyl group having 1 to 10 carbon atoms, an alkoxy group having 1 to 10 carbon atoms, and an alkylamino group having 1 to 10 carbon atoms.

In a case where the number of atoms in the main chain of T22 is 20 or less, the alignment degree of the light absorption anisotropic layer is further improved. Here, the "main chain" of T22 means the longest molecular chain bonded to MG22, and the number of hydrogen atoms is not included in the number of atoms in the main chain of T22. For example, in a case where T22 is an n-butyl group, the number of atoms in the main chain is 4, and in a case where T22 is an sec-butyl group, the number of atoms in the main chain is 3.

Hereinafter, examples of the repeating unit (22) are shown below, but the repeating unit (22) is not limited to the following repeating units.

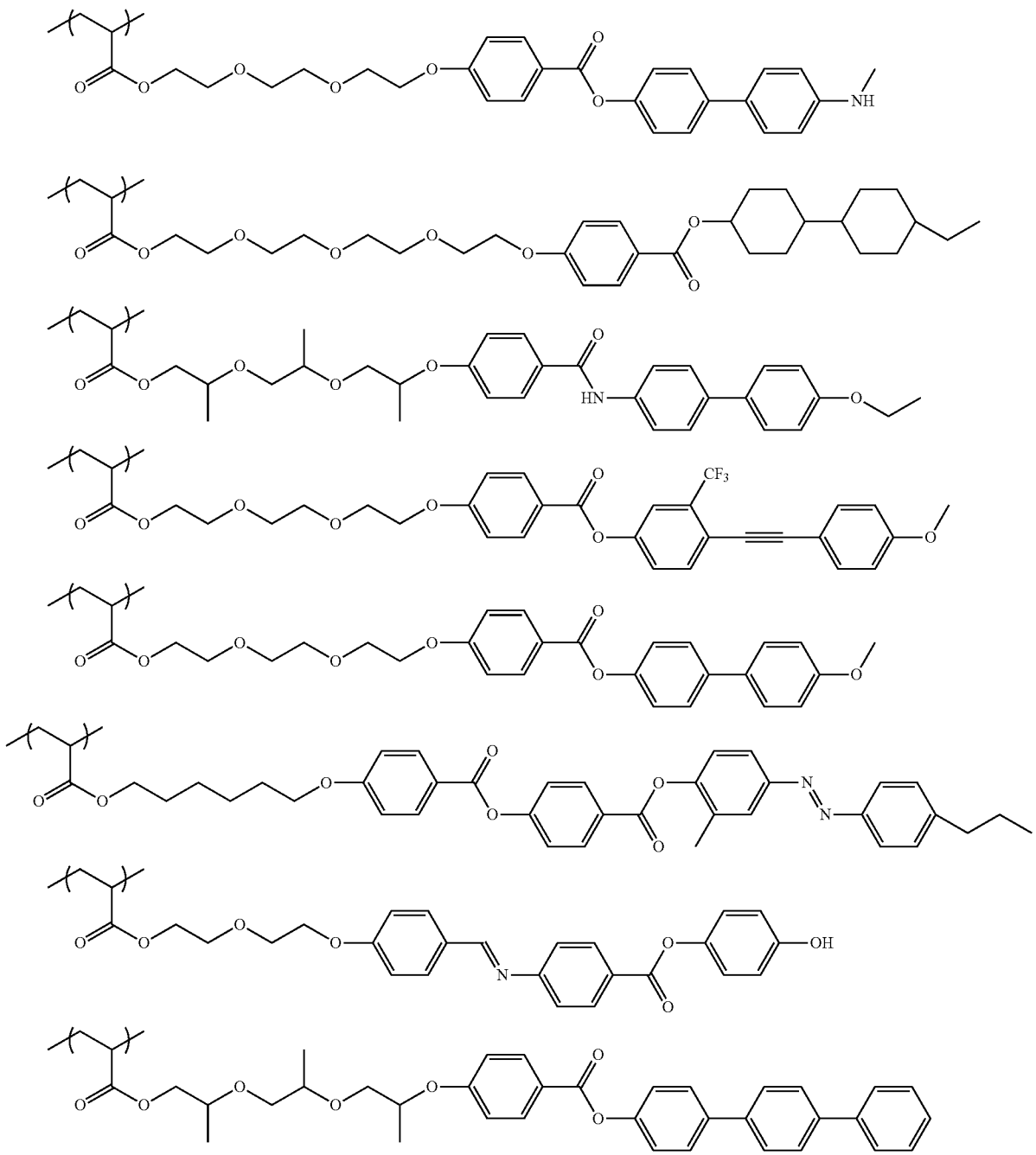

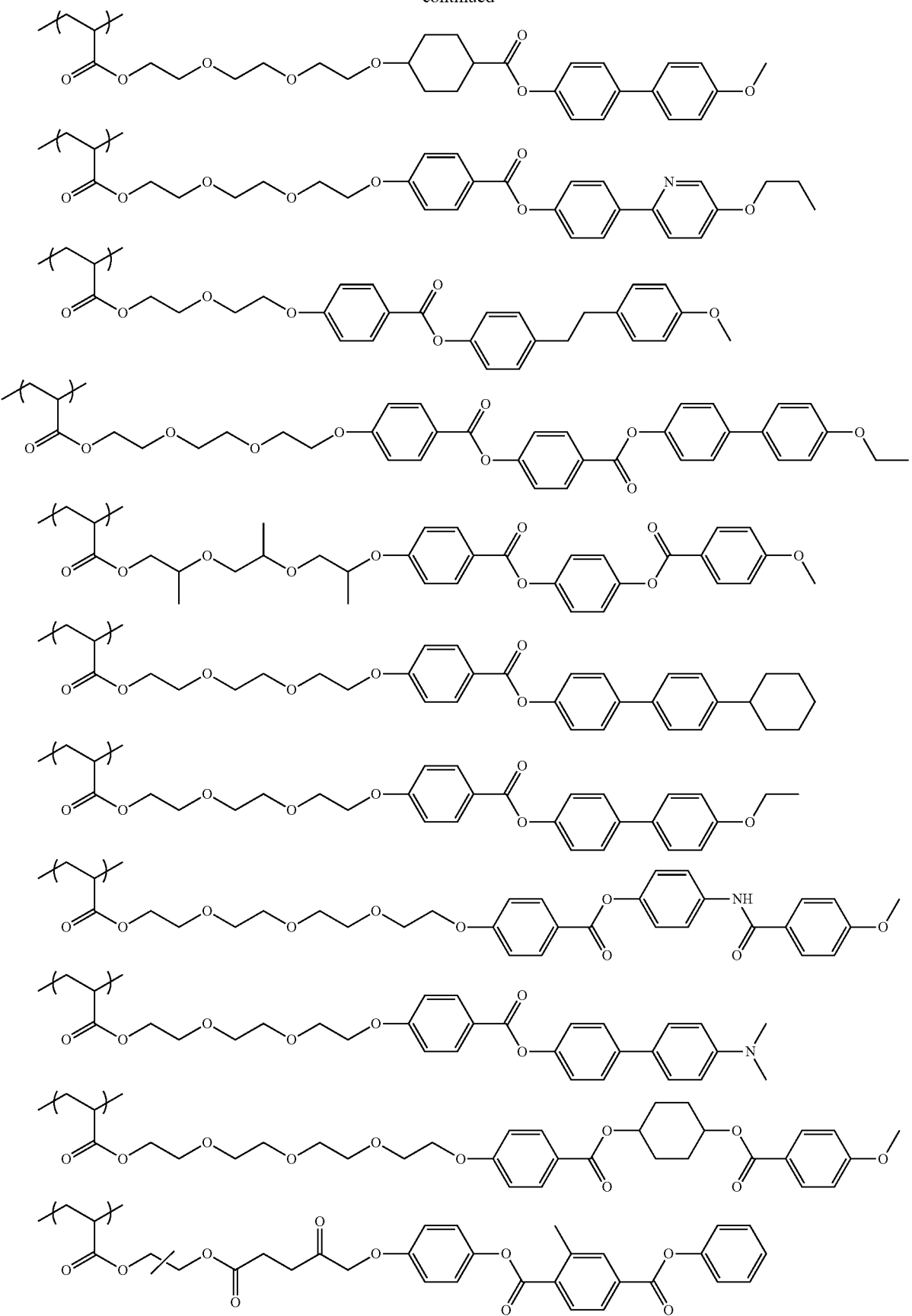

-continued

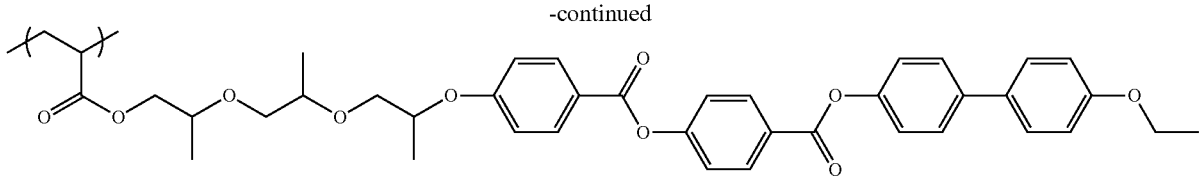

It is preferable that the structures of the repeating unit (21) and the repeating unit (22) have a part in common. It is presumed that the liquid crystals are uniformly aligned as the structures of repeating units are more similar to each other. In this manner, the alignment degree of the light absorption anisotropic layer is further improved.

Specifically, from the viewpoint of further increasing the alignment degree of the light absorption anisotropic layer, it is preferable to satisfy at least one of a condition that SP21A of Formula (LCP-21) has the same structure as that for SP22 of Formula (LCP-22), a condition that MG21 of Formula (LCP-21) has the same structure as that for MG22 of Formula (LCP-22), or a condition that L21 of Formula (LCP-21) has the same structure as that for L22 of Formula (LCP-22); more preferable to satisfy two or more of the conditions; and particularly preferable to satisfy all the conditions.

From the viewpoint that the uniformity of alignment is excellent, a content of the repeating unit (22) is preferably 50% by mass or more, more preferably 55% or more, and still more preferably 60% or more with respect to all repeating units (100% by mass) of the high-molecular-weight liquid crystalline compound.

From the viewpoint of improving the alignment degree, the upper limit value of the content of the repeating unit (22) is preferably 99% by mass or less and more preferably 97% by mass or less with respect to all repeating units (100% by mass) of the high-molecular-weight liquid crystalline compound.

The high-molecular-weight liquid crystalline compound may include only one of the repeating unit (22), or two or more kinds of the repeating units (22). In a case where the high-molecular-weight liquid crystalline compound includes two or more kinds of repeating units (22), there is an advantage in that solubility of the high-molecular-weight liquid crystalline compound in a solvent is improved and the liquid crystal phase transition temperature is easily adjusted. In the case where the high-molecular-weight liquid crystalline compound includes two or more kinds of repeating units (22), it is preferable that the total amount thereof is within the above-described range.

From the viewpoint of improving solubility in a general-purpose solvent, the high-molecular-weight liquid crystalline compound can include a repeating unit (3) not containing a mesogen group. Particularly, in order to improve the solubility while suppressing a decrease in alignment degree, it is preferable that the repeating unit (3) not containing a mesogen group is a repeating unit having a molecular weight of 280 or less. As described above, the reason why the solubility is improved while a decrease in alignment degree is suppressed by including the repeating unit having a molecular weight of 280 or less, which does not contain a mesogen group, is presumed as follows.

That is, it is considered that, in a case where the high-molecular-weight liquid crystalline compound includes the repeating unit (3) not containing a mesogen group in a molecular chain thereof, since a solvent is likely to enter the high-molecular-weight liquid crystalline compound, the solubility is improved, but the alignment degree is decreased due to the non-mesogenic repeating unit (3). However, it is presumed that, since the molecular weight of the above-described repeating unit is small, the alignment of the repeating unit (1), the repeating unit (21), or the repeating unit (22) described above, which contains the mesogen group, is unlikely to be disturbed, and thus the decrease in the alignment degree is suppressed.

It is preferable that the above-described repeating unit (3) is a repeating unit having a molecular weight of 280 or less.

The molecular weight of the repeating unit (3) does not indicate a molecular weight of a monomer used to obtain the repeating unit (3), but indicates the molecular weight of the repeating unit (3) in a state of being incorporated into the high-molecular-weight liquid crystalline compound by polymerization of the monomer.

The molecular weight of the repeating unit (3) is preferably 280 or less, more preferably 180 or less, and still more preferably 100 or less. The lower limit value of the molecular weight of the repeating unit (3) is commonly 40 or more, and preferably 50 or more. In a case where the molecular weight of the repeating unit (3) is 280 or less, a light absorption anisotropic layer having more excellent solubility of the high-molecular-weight liquid crystalline compound and having a higher alignment degree can be obtained.

Specific examples of the repeating unit (3) include a repeating unit which does not include a crosslinkable group (for example, an ethylenically unsaturated group) (hereinafter, also referred to as "repeating unit (3-1)"), and a repeating unit which includes the crosslinkable group (hereinafter, also referred to as "repeating unit (3-2)").

Specific examples of a monomer used for polymerization of the repeating unit (3-1) include acrylic acid [72.1], α-alkylacrylic acids (such as methacrylic acid [86.1] and itaconic acid [130.1]), esters and amides derived from these acids (such as N-i-propylacrylamide [113.2], N-n-butylacrylamide [127.2], N-t-butylacrylamide [127.2], N,N-dimethylacrylamide [99.1], N-methylmethacrylamide [99.1], acrylamide [71.1], methacrylamide [85.1], diacetoneacrylamide [169.2], acryloylmorpholine [141.2], N-methylol acrylamide [101.1], N-methylol methacrylamide [115.1], methyl acrylate [86.0], ethyl acrylate [100.1], hydroxyethyl acrylate [116.1], n-propyl acrylate [114.1], i-propyl acrylate [114.2], 2-hydroxypropyl acrylate [130.1], 2-methyl-2-nitropropyl acrylate [173.2], n-butyl acrylate [128.2], i-butyl acrylate [128.2], t-butyl acrylate [128.2], t-pentyl acrylate [142.2], 2-methoxyethyl acrylate [130.1], 2-ethoxyethyl acrylate [144.2], 2-ethoxyethoxyethyl acrylate [188.2], 2,2,2-trifluoroethyl acrylate [154.1], 2,2-dimethylbutyl acrylate [156.2], 3-methoxybutyl acrylate [158.2], ethyl carbitol acrylate [188.2], phenoxyethyl acrylate [192.2], n-pentyl acrylate [142.2], n-hexyl acrylate [156.2], cyclohexyl acrylate [154.2], cyclopentyl acrylate [140.2], benzyl acrylate [162.2], n-octyl acrylate [184.3], 2-ethylhexyl acrylate [184.3], 4-methyl-2-propylpentyl acrylate [198.3], methyl methacrylate [100.1], 2,2,2-trifluoroethyl methacrylate [168.1], hydroxyethyl methacrylate [130.1], 2-hydroxypropyl methacrylate [144.2], n-butyl methacrylate [142.2], i-butyl methacrylate [142.2], sec-butyl methacrylate [142.2], n-octyl methacrylate [198.3], 2-ethylhexyl methacrylate [198.3], 2-methoxyethyl methacrylate [144.2], 2-ethoxyethyl methacrylate [158.2], benzyl methacrylate [176.2], 2-norbornyl methyl methacrylate [194.3], 5-norbornen-2-ylmethyl methacrylate [194.3], and dimethylaminoethyl methacrylate [157.2]), vinyl esters (such as vinyl acetate [86.1]), esters derived from maleic acid or fumaric acid (such as dimethyl maleate [144.1] and diethyl fumarate [172.2]), maleimides (such as N-phenylmaleimide [173.2]), maleic acid [116.1], fumaric acid [116.1], p-styrenesulfonic acid [184.1], acrylonitrile [53.1], methacrylonitrile [67.1], dienes (such as butadiene [54.1], cyclopentadiene [66.1], and isoprene [68.1]), aromatic vinyl compounds (such as styrene [104.2], p-chlorostyrene [138.6], t-butylstyrene [160.3], and α-methylstyrene [118.2]), N-vinylpyrrolidone [111.1], N-vinyloxazolidone [113.1], N-vinyl succinimide [125.1], N-vinylformamide [71.1], N-vinyl-N-methylformamide [85.1], N-vinylacetamide [85.1], N-vinyl-N-methylacetamide [99.1], 1-vinylimidazole [94.1], 4-vinylpyridine [105.2], vinylsulfonic acid [108.1], sodium vinyl sulfonate [130.2], sodium allyl sulfonate [144.1], sodium methallyl sulfonate [158.2], vinylidene chloride [96.9], vinyl alkyl ethers (such as methyl vinyl ether [58.1]), ethylene [28.0], propylene [42.1], 1-butene [56.1], and isobutene [56.1]. The numerical value in [ ] indicates the molecular weight of the monomer.

The above-described monomer may be used alone, or in combination of two or more kinds thereof.

Among the above-described monomers, acrylic acid, α-alkylacrylic acids, esters and amides derived from these acids, acrylonitrile, methacrylonitrile, or aromatic vinyl compounds are preferable.

As monomers other than the above-described monomers, compounds described in Research Disclosure No. 1955 (July, 1980) can be used.

Hereinafter, specific examples of the repeating unit (3-1) and molecular weights thereof are shown below, but the present invention is not limited to these specific examples.

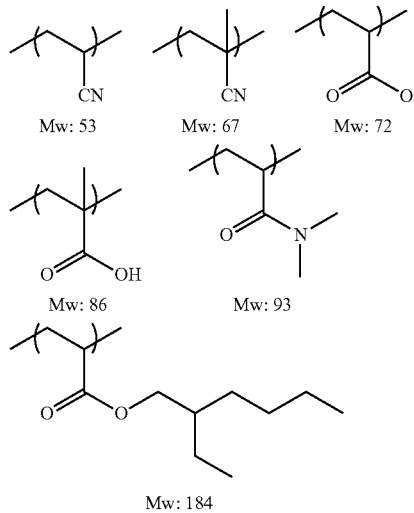

Mw: 53  Mw: 67  Mw: 72

Mw: 86  Mw: 93

Mw: 184

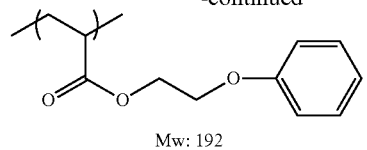

Mw: 192

Specific examples of the crosslinkable group in the repeating unit (3-2) include the crosslinkable groups represented by Formulae (P-1) to (P-30) described above. Among these, a vinyl group, a butadiene group, a (meth)acryloyl group, a (meth)acrylamide group, a vinyl acetate group, a fumaric acid ester group, a styryl group, a vinylpyrrolidone group, a maleic acid anhydride, a maleimide group, a vinyl ether group, an epoxy group, or an oxetanyl group is more preferable.

From the viewpoint of easily carrying out the polymerization, it is preferable that the repeating unit (3-2) is a repeating unit represented by Formula (3).

(3)

In Formula (3), PC32 represents a main chain of a repeating unit, and more specifically represents the same structure as that for PC1 in Formula (1) described above; L32 represents a single bond or a divalent linking group, and more specifically represents the same structure as that for L1 in Formula (1) described above; and P32 represents a crosslinkable group represented by any of Formulae (P-1) to (P-30).

Hereinafter, specific examples of the repeating unit (3-2) and weight-average molecular weights (Mw) thereof are shown below, but the present invention is not limited to these specific examples.

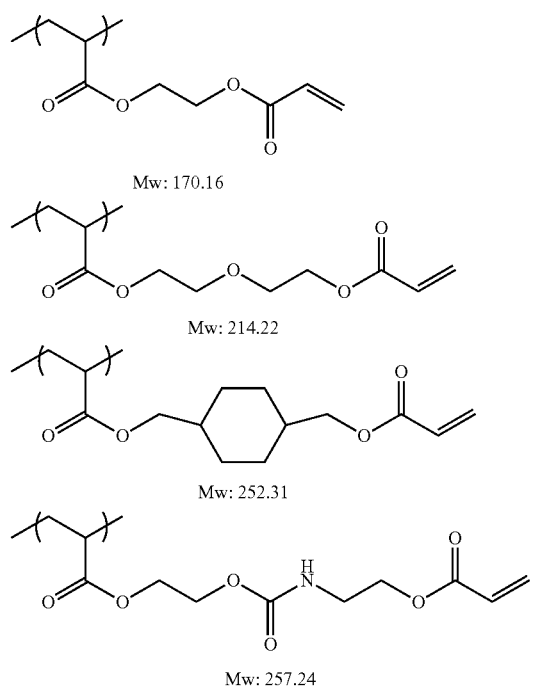

Mw: 170.16

Mw: 214.22

Mw: 252.31

Mw: 257.24

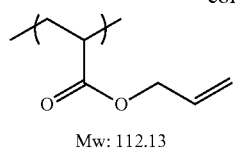

Mw: 112.13

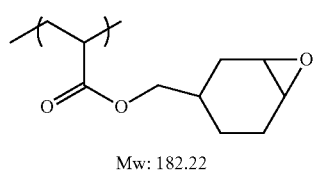

Mw: 182.22

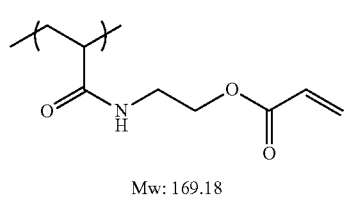

Mw: 169.18

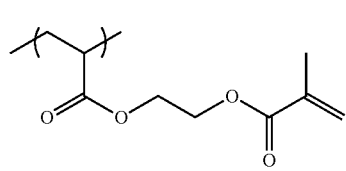

Mw: 184.19

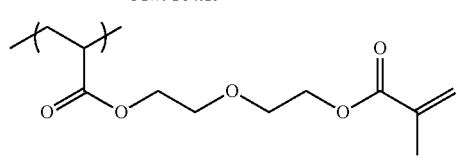

Mw: 228.24

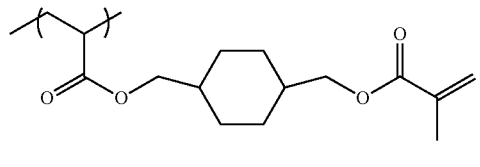

Mw: 226.34

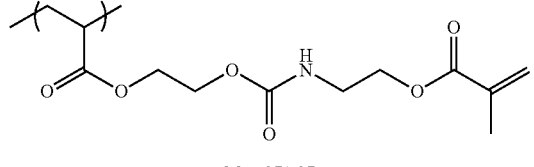

Mw: 271.27

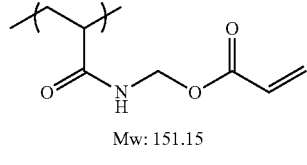

Mw: 151.15

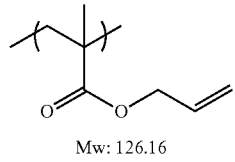

Mw: 126.16

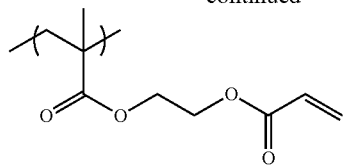

Mw: 184.19

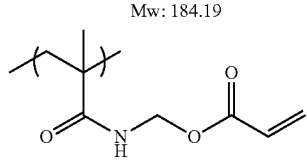

Mw: 169.18

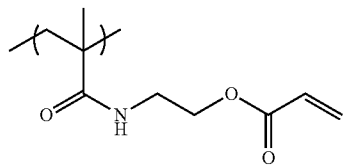

Mw: 183.21

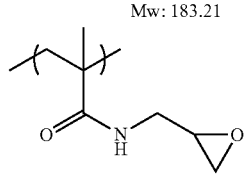

Mw: 142.15

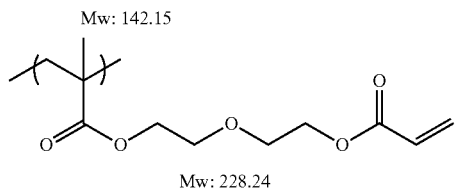

Mw: 228.24

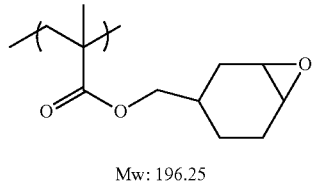

Mw: 196.25

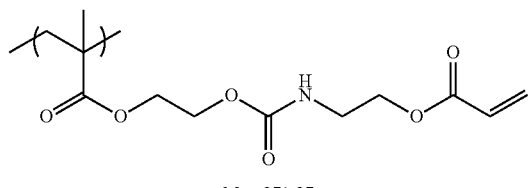

Mw: 271.27

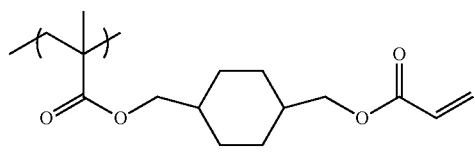

Mw: 266.34

A content of the repeating unit (3) is preferably less than 14% by mass, more preferably 7% by mass or less, and still more preferably 5% by mass or less with respect to all repeating units (100% by mass) of the high-molecular-weight liquid crystalline compound. The lower limit value of the content of the repeating unit (3) is preferably 2% by mass or more and more preferably 3% by mass or more with respect to all repeating units (100% by mass) of the high-molecular-weight liquid crystalline compound. In a case where the content of the repeating unit (3) is less than 14% by mass, the alignment degree of the light absorption anisotropic layer is further improved. In a case where the content of the repeating unit (3) is 2% by mass or more, the solubility of the high-molecular-weight liquid crystalline compound is further improved.

The high-molecular-weight liquid crystalline compound may include only one of the repeating unit (3), or two or more kinds of the repeating units (3). In the case where the high-molecular-weight liquid crystalline compound includes two or more kinds of repeating units (3), it is preferable that the total amount thereof is within the above-described range.

From the viewpoint of improving adhesiveness and planar uniformity, the high-molecular-weight liquid crystalline compound may include a repeating unit (4) having a flexible structure with a long molecular chain (SP4 in Formula (4) described below). The reason for this is presumed as follows.

That is, in a case where the high-molecular-weight liquid crystalline compound has such a flexible structure with a long molecular chain, entanglement of the molecular chains constituting the high-molecular-weight liquid crystalline compound is likely to occur, and aggregation destruction of the light absorption anisotropic layer (specifically, destruction of the light absorption anisotropic layer itself) is suppressed. As a result, it is presumed that adhesiveness between the light absorption anisotropic layer and an underlayer (for example, a base material or an alignment layer) is improved. In addition, it is considered that a decrease in planar uniformity occurs due to low compatibility between the organic dichroic coloring agent and the high-molecular-weight liquid crystalline compound. That is, it is considered that, in a case where the compatibility between the organic dichroic coloring agent and the high-molecular-weight liquid crystalline compound is not sufficient, a planar defect (alignment defect) having the organic dichroic coloring agent to be precipitated as a nucleus occurs. On the other hand, it is presumed that, in the case where the high-molecular-weight liquid crystalline compound has such a flexible structure with a long molecular chain, a light absorption anisotropic layer in which the precipitation of the organic dichroic coloring agent is suppressed and the planar uniformity is excellent is obtained. Here, the expression "planar uniformity is excellent" denotes that the alignment defect occurring in a case where the liquid crystal composition containing the high-molecular-weight liquid crystalline compound is repelled on the underlayer (for example, the base material or the alignment layer) is less likely to occur.

The above-described repeating unit (4) is a repeating unit represented by Formula (4).

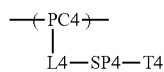
(4)

In Formula (4), PC4 represents a main chain of a repeating unit, and more specifically represents the same structure as that for PC1 in Formula (1) described above; L4 represents a single bond or a divalent linking group, and more specifically represents the same structure as that for L1 in Formula (1) described above (preferably a single bond); SP4 represents an alkylene group having 10 or more atoms in the main chain; and T4 represents a terminal group, and more specifically represents the same structure as that for T1 in Formula (1) described above.

Specific examples and suitable aspects of PC4 are the same as those for PC1 in Formula (1), and thus the description thereof will not be repeated.

From the viewpoint of further exhibiting the effect of the present invention, L4 is preferably a single bond.

In Formula (4), SP4 represents an alkylene group having 10 or more atoms in the main chain. Here, one or more of —CH$_2$—'s constituting the alkylene group represented by SP4 may be replaced with "SP—C" described above, and particularly preferably replaced with at least one group selected from the group consisting of —O—, —S—, —N(R$^{21}$)—, —C(=O)—, —C(=S)—, —C(R$^{22}$)=C(R$^{23}$)—, an alkynylene group, —Si(R$^{24}$)(R$^{25}$)—, —N=N—, —C(R$^{26}$)=N—N=C(R$^{27}$)—, —C(R$^{28}$)=N—, and —S(=O)$_2$—. In addition, R$^{21}$ to R$^{28}$ each independently represent a hydrogen atom, a halogen atom, a cyano group, a nitro group, or a linear or branched alkyl group having 1 to 10 carbon atoms. In addition, the hydrogen atoms included in one or more of —CH$_2$—'s constituting the alkylene group represented by SP4 may be replaced with "SP-IT" described above.

The number of atoms in the main chain of SP4 is 10 or more, and from the viewpoint of obtaining a light absorption anisotropic layer in which at least one of the adhesiveness or the planar uniformity is more excellent, the number of atoms thereof is preferably 15 or more and more preferably 19 or more. In addition, from the viewpoint of obtaining a light absorption anisotropic layer with a more excellent alignment degree, the upper limit of the number of atoms in the main chain of SP4 is preferably 70 or less, more preferably 60 or less, and still more preferably 50 or less.

Here, the "main chain" of SP4 means a partial structure required for directly linking L4 and T4 to each other, and the "number of atoms in the main chain" means the number of atoms constituting the partial structure.

In other words, the "main chain" of SP4 is a partial structure in which the number of atoms linking L4 and T4 to each other is the smallest. For example, in a case where SP4 is a 3,7-dimethyldecanyl group, the number of atoms in the main chain is 10, and in a case where SP4 is a 4,6-dimethyldodecanyl group, the number of atoms in the main chain is 12. In addition, in Formula (4-1), the inside of the frame shown by the dotted quadrangle corresponds to SP4, and the number of atoms in the main chain of SP4 (corresponding to the total number of atoms circled by the dotted line) is 11.

(4-1)

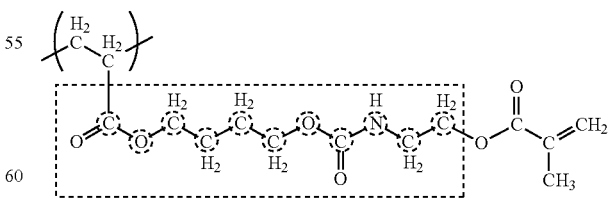

The alkylene group represented by SP4 may be linear or branched.

From the viewpoint of obtaining a light absorption anisotropic layer with a more excellent alignment degree, the number of carbon atoms in the alkylene group represented by SP4 is preferably 8 to 80, more preferably 15 to 80, still more preferably 25 to 70, and particularly preferably 25 to 60.

From the viewpoint of obtaining a light absorption anisotropic layer with more excellent adhesiveness and planar uniformity, it is preferable that one or more of —CH$_2$—'s constituting the alkylene group represented by SP4 are replaced with "SP—C" described above.

In addition, in a case of a plurality of —CH$_2$—'s constituting the alkylene group represented by SP4, from the viewpoint of obtaining a light absorption anisotropic layer with more excellent adhesiveness and planar uniformity, it is more preferable that only some of the plurality of —CH$_2$—'s are replaced with "SP—C" described above.

Among "SP—C", at least one group selected from the group consisting of —O—, —S—, —N(R$^{21}$)—, —C(=O)—, —C(=S)—, —C(R$^{22}$)=C(R$^{23}$)—, an alkynylene group, —Si(R$^{24}$)(R$^{25}$)—, —N=N—, —C(R$^{26}$)=N—N=C(R$^{27}$)—, —C(R$^{28}$)=N—, and —S(=O)$_2$— is preferable; and from the viewpoint of obtaining a light absorption anisotropic layer with more excellent adhesiveness and planar uniformity, at least one group selected from the group consisting of —O—, —N(R$^{21}$)—, —C(=O)—, and —S(=O)$_2$— is more preferable, and at least one group selected from the group consisting of —O—, —N(R$^{21}$)—, and —C(=O)— is particularly preferable. R$^{21}$ to R$^{28}$ each independently represent a hydrogen atom, a halogen atom, a cyano group, a nitro group, or a linear or branched alkyl group having 1 to 10 carbon atoms.

Particularly, it is preferable that SP4 is a group having at least one selected from the group consisting of an oxyalkylene structure in which one or more of —CH$_2$—'s constituting an alkylene group are replaced with —O—, an ester structure in which one or more of —CH$_2$—CH$_2$—'s constituting an alkylene group are replaced with —O— or —C(=O)—, and a urethane bond in which one or more of —CH$_2$—CH$_2$—CH$_2$—'s constituting an alkylene group are replaced with —O—, —C(=O)—, or —NH—.

The hydrogen atoms included in one or more of —CH$_2$—'s constituting the alkylene group represented by SP4 may be replaced with "SP—H" described above. In this case, one or more hydrogen atoms included in —CH$_2$— may be replaced with "SP—H". That is, only one hydrogen atom included in —CH$_2$— may be replaced with "SP—H", or all (two) hydrogen atoms included in —CH$_2$— may be replaced with "SP—H".

Among "SP—H", at least one group selected from the group consisting of a halogen atom, a cyano group, a nitro group, a hydroxy group, a linear alkyl group having 1 to 10 carbon atoms, a branched alkyl group having 1 to 10 carbon atoms, and a halogenated alkyl group having 1 to 10 carbon atoms is preferable; and at least one group selected from the group consisting of a hydroxy group, a linear alkyl group having 1 to 10 carbon atoms, and a branched alkyl group having 1 to 10 carbon atoms is more preferable.

As described above, T4 represents the same terminal group as that for T1, and is preferably a hydrogen atom, a methyl group, a hydroxy group, a carboxy group, a sulfonic acid group, a phosphoric acid group, a boronic acid group, an amino group, a cyano group, a nitro group, a phenyl group which may have a substituent, or -L-CL (L represents a single bond or a divalent linking group, and specific examples of the divalent linking group are the same as those for LW and SPW described above; CL represents a crosslinkable group, examples thereof include the group represented by Q1 or Q2 described above, and a crosslinkable group represented by any of Formulae (P-1) to (P-30) is preferable), in which CL is preferably a vinyl group, a butadiene group, a (meth)acryloyl group, a (meth)acrylamide group, a vinyl acetate group, a fumaric acid ester group, a styryl group, a vinylpyrrolidone group, a maleic acid anhydride, a maleimide group, a vinyl ether group, an epoxy group, or an oxetanyl group.

The epoxy group may be an epoxycycloalkyl group, and from the viewpoint that the effect of the present invention is more excellent, the number of carbon atoms in a cycloalkyl group moiety of the epoxycycloalkyl group is preferably 3 to 15, more preferably 5 to 12, and still more preferably 6 (that is, it is still more preferable that the epoxycycloalkyl group is an epoxycyclohexyl group).

Examples of a substituent of the oxetanyl group include an alkyl group having 1 to 10 carbon atoms, and from the viewpoint that the effect of the present invention is more excellent, an alkyl group having 1 to 5 carbon atoms is preferable. The alkyl group as the substituent of the oxetanyl group may be linear or branched, but is preferably linear from the viewpoint that the effect of the present invention is more excellent.

Examples of a substituent of the phenyl group include a boronic acid group, a sulfonic acid group, a vinyl group, and an amino group, and from the viewpoint that the effect of the present invention is more excellent, a boronic acid group is preferable.

Specific examples of the repeating unit (4) include the following structures, but the present invention is not limited thereto. In the following specific examples, n1 represents an integer of 2 or more, and n2 represents an integer of 1 or more.

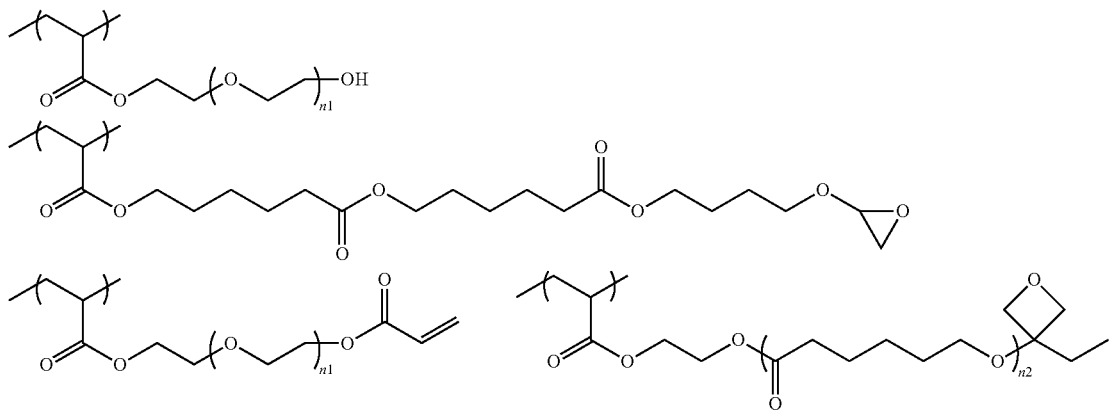

-continued

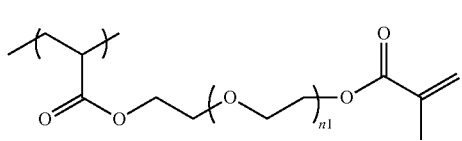
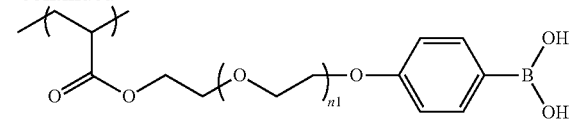
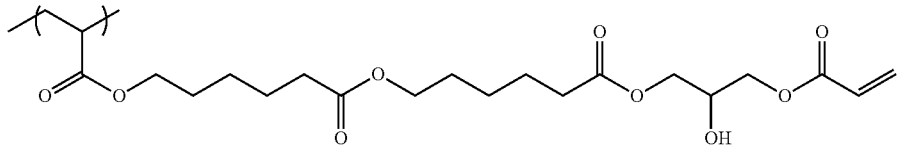
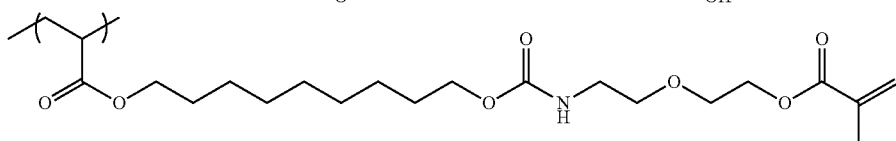
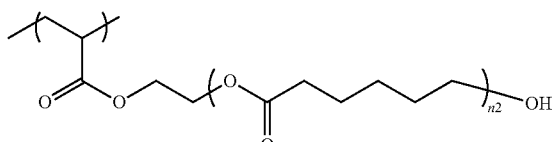
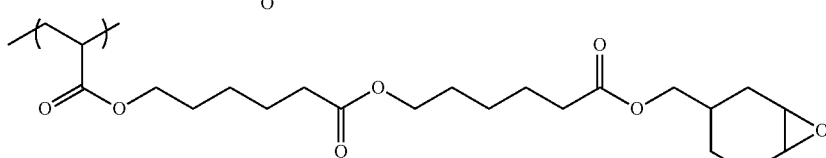
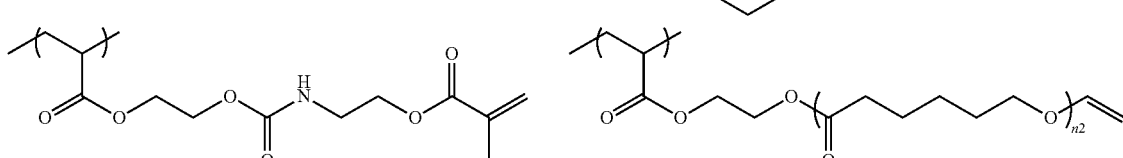
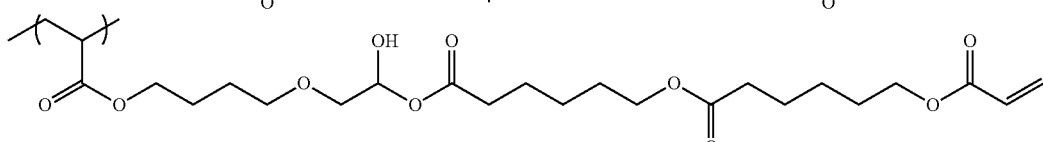
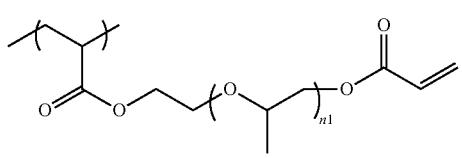

A content of the repeating unit (4) is preferably 200 to 200% by mass and more preferably 3% to 18% by mass with respect to all repeating units (100% by mass) of the high-molecular-weight liquid crystalline compound. In a case where the content of the repeating unit (4) is 20% by mass or more, a light absorption anisotropic layer having more excellent adhesiveness is obtained. In addition, in a case where the content of the repeating unit (4) is 20% by mass or less, a light absorption anisotropic layer having more excellent planar uniformity is obtained.

The high-molecular-weight liquid crystalline compound may include only one of the repeating unit (4), or two or more kinds of the repeating units (4). In a case where the high-molecular-weight liquid crystalline compound includes two or more kinds of repeating units (4), the above-described content of the repeating unit (4) indicates the total content of the repeating units (4).

From the viewpoint of the planar uniformity, the high-molecular-weight liquid crystalline compound can include a repeating unit (5) to be introduced by polymerizing a polyfunctional monomer. Particularly, in order to improve the planar uniformity while suppressing a decrease in alignment degree, it is preferable that the high-molecular-weight liquid crystalline compound includes 10% by mass or less of the repeating unit (5) to be introduced by polymerizing a polyfunctional monomer with respect to all repeating units (100% by mass) of the high-molecular-weight liquid crystalline compound. As described above, the reason why the planar uniformity can be improved while a decrease in alignment degree is suppressed by including 10% by mass or less of the repeating unit (5) is presumed as follows.

The repeating unit (5) is a unit to be introduced to the high-molecular-weight liquid crystalline compound by polymerizing a polyfunctional monomer. Therefore, it is considered that the high-molecular-weight liquid crystalline compound includes a high-molecular-weight body in which a three-dimensional crosslinking structure is formed by the repeating unit (5). Here, since the content of the repeating unit (5) is small, the content of the high-molecular-weight body including the repeating unit (5) is considered to be very small.

It is presumed that a light absorption anisotropic layer in which cissing of a composition for forming the light absorption anisotropic layer is suppressed and the planar uniformity is excellent is obtained due to the presence of a very small amount of the high-molecular-weight body with the three-dimensional crosslinking structure formed as described above.

In addition, it is presumed that the effect of suppressing a decrease in alignment degree can be maintained because the content of the high-molecular-weight body is very small.

It is preferable that the above-described repeating unit (5) to be introduced by polymerizing a polyfunctional monomer is a repeating unit represented by Formula (5).

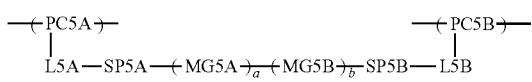

(5)

In Formula (5), PC5A and PC5B represent the main chain of the repeating unit, and more specifically represent the same structure as that for PC1 in Formula (1) described above; L5A and L5B represent a single bond or a divalent linking group, and more specifically represents the same structure as that for L1 in Formula (1) described above; SP5A and SP5B represent a spacer group, and more specifically represents the same structure as that for SP1 in Formula (1) described above; MG5A and MG5B represent a mesogen structure, and more specifically represent the same structure as that for the mesogen group MG in Formula (LC) described above; and a and b represent an integer of 0 or 1.

PC5A and PC5B may be the same group or groups different from each other, but from the viewpoint of further improving the alignment degree of the light absorption anisotropic layer, it is preferable that PC5A and PC5B are the same group.

Both L5A and L5B may be a single bond, the same group, or groups different from each other, but from the viewpoint of further improving the alignment degree of the light absorption anisotropic layer, both L5A and L5B are preferably a single bond or the same group, and more preferably the same group.

Both SP5A and SP5B may be a single bond, the same group, or groups different from each other, but from the viewpoint of further improving the alignment degree of the light absorption anisotropic layer, both SP5A and SP5B are preferably a single bond or the same group, and more preferably the same group.

Here, the same group in Formula (5) means that the chemical structures thereof are the same regardless of the orientation in which each group is bonded. For example, even in a case where SP5A is *—$CH_2$—$CH_2$—O—** (* represents a bonding position to L5A, and ** represents a bonding position to MG5A) and SP5B is *—O—$CH_2$—$CH_2$—** (* represents a bonding position to MG5B, and ** represents a bonding position to L5B), SP5A and SP5B are the same group.

a and b are each independently an integer of 0 or 1, and preferably 1 from the viewpoint of further improving the alignment degree of the light absorption anisotropic layer.

a and b may be the same or different from each other, but from the viewpoint of further improving the alignment degree of the light absorption anisotropic layer, it is preferable that both a and b are 1.

From the viewpoint of further improving the alignment degree of the light absorption anisotropic layer, the sum of a and b is preferably 1 or 2 (that is, the repeating unit represented by Formula (5) has a mesogen group), and more preferably 2.

From the viewpoint of further improving the alignment degree of the light absorption anisotropic layer, it is preferable that the partial structure represented by -(MG5A)$_a$-(MG5B)$_b$— has a cyclic structure. In this case, from the viewpoint of further improving the alignment degree of the light absorption anisotropic layer, the number of cyclic structures in the partial structure represented by -(MG5A2)$_a$-(MG5B)$_b$— is preferably 2 or more, more preferably 2 to 8, still more preferably 2 to 6, and particularly preferably 2 to 4.

From the viewpoint of further improving the alignment degree of the light absorption anisotropic layer, the mesogen groups represented by MG5A and MG5B each independently preferably include one or more cyclic structures, more preferably include 2 to 4 cyclic structures, still more preferably include 2 or 3 cyclic structures, and particularly preferably include 2 cyclic structures.

Specific examples of the cyclic structure include an aromatic hydrocarbon group, a heterocyclic group, and an alicyclic group, and among these, an aromatic hydrocarbon group or an alicyclic group is preferable.

MG5A and MG5B may be the same group or groups different from each other, but from the viewpoint of further improving the alignment degree of the light absorption anisotropic layer, it is preferable that MG5A and MG5B are the same group.

As the mesogen group represented by MG5A and MG5B, from the viewpoint of expressing the liquid crystallinity, adjusting a liquid crystal phase transition temperature, availability of raw materials, and synthetic suitability, and from the viewpoint that the effect of the present invention is more excellent, the mesogen group MG in Formula (LC) described above is preferable.

Particularly, in the repeating unit (5), it is preferable that PC5A and PC5B are the same group, both L5A and L5B are a single bond or the same group, both SP5A and SP5B are a single bond or the same group, and MG5A and MG5B are the same group. In this manner, the alignment degree of the light absorption anisotropic layer is further improved.

A content of the repeating unit (5) is preferably 10% by mass or less, more preferably 0.001% to 5% by mass, and still more preferably 0.05% to 3% by mass with respect to the content (100% by mass) of all repeating units of the high-molecular-weight liquid crystalline compound.

The high-molecular-weight liquid crystalline compound may include only one of the repeating unit (5), or two or more kinds of the repeating units (5). In the case where the high-molecular-weight liquid crystalline compound includes two or more kinds of repeating units (5), it is preferable that the total amount thereof is within the above-described range.

The high-molecular-weight liquid crystalline compound may be a star-shaped polymer. The star-shaped polymer in the present invention means a polymer having three or more polymer chains extending from the nucleus, and is specifically a polymer represented by Formula (6).

The star-shaped polymer represented by Formula (6) as the high-molecular-weight liquid crystalline compound can form a light absorption anisotropic layer having a high alignment degree while having high solubility (excellent solubility in a solvent).

(6)

In Formula (6), $n_A$ represents an integer of 3 or greater, and preferably an integer of 4 or more. The upper limit value of $n_A$ is not limited thereto, but is commonly 12 or less and preferably 6 or less.

A plurality of PI's each independently represent a polymer chain having any of the repeating units represented by Formulae (1), (21), (22), (3), (4), and (5) described above. However, at least one of the plurality of PI's represents a polymer chain having the repeating unit represented by Formula (1) described above.

A represents an atomic group which is the nucleus of the star-shaped polymer. Specific examples of A include structures obtained by removing hydrogen atoms from thiol groups of a polyfunctional thiol compound, described in paragraphs [0052] to [0058] of JP2011-074280A, paragraphs [0017] to [0021] of JP2012-189847A, paragraphs [0012] to [0024] of JP2013-031986A, and paragraphs [0118] to [0142] of JP2014-104631A. In this case, A and PI are bonded to each other through a sulfide bond.

The number of thiol groups in the above-described polyfunctional thiol compound from which A is derived is preferably 3 or more and more preferably 4 or more. The upper limit value of the number of thiol groups in the polyfunctional thiol compound is commonly 12 or less and preferably 6 or less.

Specific examples of the polyfunctional thiol compound are shown below.

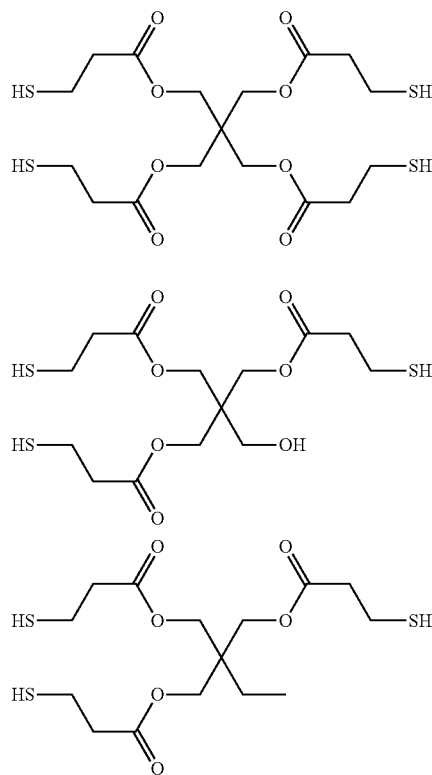

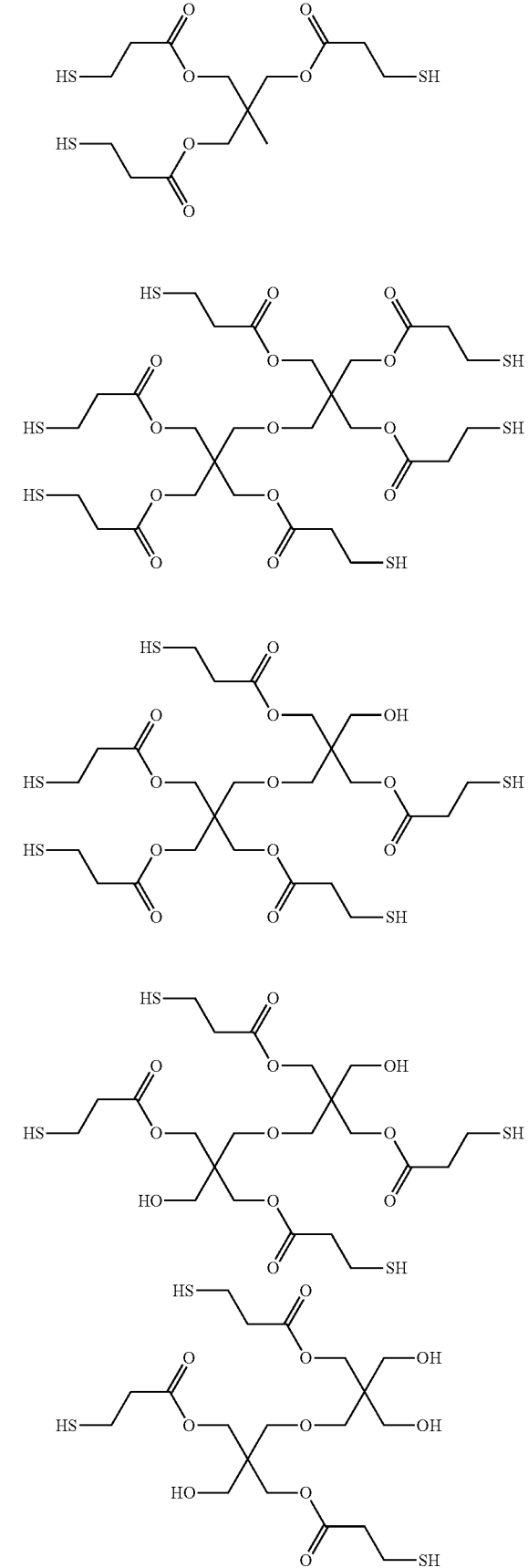

-continued

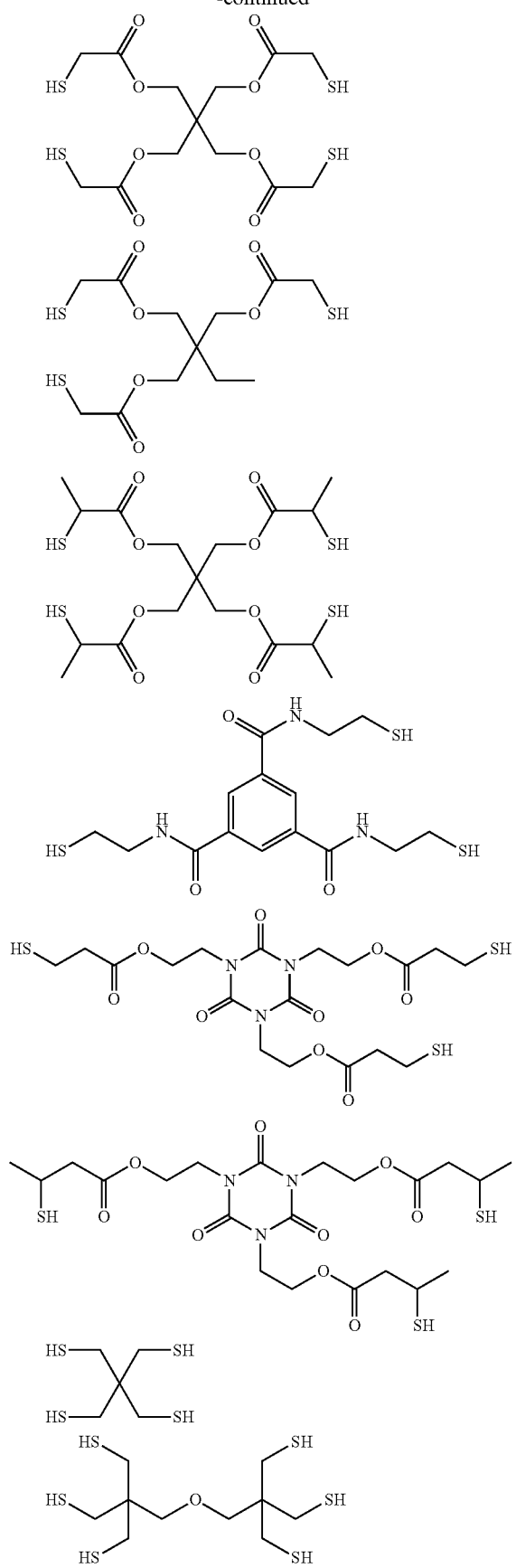

-continued

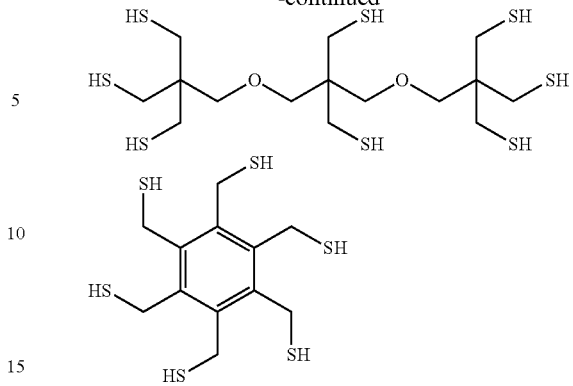

From the viewpoint of improving the alignment degree, the high-molecular-weight liquid crystalline compound may be a thermotropic liquid crystal and a crystalline polymer.

A thermotropic liquid crystal is a liquid crystal which shows transition to a liquid crystal phase due to a change in temperature.

The thermotropic liquid crystal may exhibit any of a nematic phase or a smectic phase, but from the viewpoint that the alignment degree of the light absorption anisotropic layer is further increased and haze is unlikely to be observed (haze is better), it is preferable that the thermotropic liquid crystal exhibits at least a nematic phase.

A temperature range showing the nematic phase is preferably room temperature (23° C.) to 450° C. from the viewpoint that the alignment degree of the light absorption anisotropic layer is further increased and the haze is unlikely to be observed, and more preferably 40° C. to 400° C. from the viewpoint of handleability and manufacturing suitability.

The crystalline polymer is a polymer showing a transition to a crystal phase due to a change in temperature. The crystalline polymer may show a glass transition other than the transition to the crystal phase.

From the viewpoint that the alignment degree of the light absorption anisotropic layer is further increased and the haze is unlikely to be observed, it is preferable that the crystalline polymer is a high-molecular-weight liquid crystalline compound which has a transition from a crystal phase to a liquid crystal phase in a case of being heated (glass transition may be present in the middle of the transition), or a high-molecular-weight liquid crystalline compound which has a transition to a crystal phase in a case where the temperature is lowered after entering a liquid crystal state by being heated (glass transition may be present in the middle of the transition).

The presence or absence of crystallinity of the high-molecular-weight liquid crystalline compound is evaluated as follows.

Two light absorption anisotropic layers of an optical microscope (ECLIPSE E600 POL, manufactured by Nikon Corporation) are arranged to be orthogonal to each other, and a sample table is set between the two light absorption anisotropic layers. A small amount of the high-molecular-weight liquid crystalline compound is placed on slide glass, and the slide glass is set on a hot stage placed on the sample table. While the state of the sample is observed, the temperature of the hot stage is increased to a temperature at which the high-molecular-weight liquid crystalline compound exhibits liquid crystallinity, and the high-molecular-weight liquid crystalline compound is allowed to enter a liquid crystal state. After the high-molecular-weight liquid crystalline compound enters the liquid crystal state, the behavior of the liquid crystal phase transition is observed while the temperature of the hot stage is gradually lowered, and the temperature of the liquid crystal phase transition is recorded. In a case where the high-molecular-weight liquid crystalline compound exhibits a plurality of liquid crystal phases (for example, a nematic phase and a smectic phase), all the transition temperatures are also recorded.

Next, approximately 5 mg of a sample of the high-molecular-weight liquid crystalline compound is put into an aluminum pan, and the pan is covered and set on a differential scanning calorimeter (DSC) (an empty aluminum pan is used as a reference). The high-molecular-weight liquid crystalline compound measured in the above-described manner is heated to a temperature at which the compound exhibits a liquid crystal phase, and the temperature is maintained for 1 minute. Thereafter, the calorific value is measured while the temperature is lowered at a rate of 10° C./min. An exothermic peak is confirmed from the obtained calorific value spectrum.

As a result, in a case where an exothermic peak is observed at a temperature other than the liquid crystal phase transition temperature, it can be said that the exothermic peak is a peak due to crystallization and the high-molecular-weight liquid crystalline compound has crystallinity.

On the other hand, in a case where an exothermic peak is not observed at a temperature other than the liquid crystal phase transition temperature, it can be said that the high-molecular-weight liquid crystalline compound does not have crystallinity.

A method of obtaining the crystalline polymer is not particularly limited, but as a specific example, a method of using a high-molecular-weight liquid crystalline compound including the above-described repeating unit (1) is preferable, and a method of using a suitable aspect among high-molecular-weight liquid crystalline compounds having the described above repeating unit (1) is more preferable.

From the viewpoint that the alignment degree of the light absorption anisotropic layer is further increased and the haze is unlikely to be observed, the crystallization temperature of the high-molecular-weight liquid crystalline compound is preferably −50° C. or higher and lower than 150° C., more preferably 120° C. or lower, still more preferably −20° C. or higher and lower than 120° C., and particularly preferably 95° C. or lower. From the viewpoint of reducing haze, the above-described crystallization temperature of the high-molecular-weight liquid crystalline compound is preferably lower than 150° C.

The crystallization temperature is a temperature of an exothermic peak due to crystallization in the above-described DSC.

From the viewpoint that the effect of the present invention is more excellent, a weight-average molecular weight (Mw) of the high-molecular-weight liquid crystalline compound is preferably 1000 to 500,000 and more preferably 2,000 to 300,000. In a case where the Mw of the high-molecular-weight liquid crystalline compound is within the above-described range, the high-molecular-weight liquid crystalline compound is easily handled.

In particular, from the viewpoint of suppressing cracking during coating, the weight-average molecular weight (Mw) of the high-molecular-weight liquid crystalline compound is preferably 10,000 or more and more preferably 10,000 to 300,000.

In addition, from the viewpoint of temperature latitude of the alignment degree, the weight-average molecular weight (Mw) of the high-molecular-weight liquid crystalline compound is preferably less than 10,000 and preferably 2,000 or more and less than 10,000.

Here, the weight-average molecular weight and the number-average molecular weight in the present invention are values measured by a gel permeation chromatography (GPC) method.

Solvent (eluent): N-methylpyrrolidone
Device name: TOSOH HLC-8220GPC
Column: using three columns of TOSOH TSKgel Super AWM-H (6 mm×15 cm) connected
Column temperature: 25° C.
Sample concentration: 0.1% by mass
Flow rate: 0.35 mL/min
Calibration curve: TSK standard polystyrene (manufactured by TOSOH Corporation), calibration curves of 7 samples with Mw of 2,800,000 to 1,050 (Mw/Mn=1.03 to 1.06) are used The high-molecular-weight liquid crystalline compound may exhibit nematic or smectic liquid crystallinity, but it is preferable that the high-molecular-weight liquid crystalline compound exhibits at least the nematic liquid crystallinity.

The temperature range at which the nematic phase is exhibited is preferably 0° C. to 450° C., and from the viewpoint of handleability and manufacturing suitability, preferably 30° C. to 400° C.

From the viewpoint that the effect of the present invention is more excellent, a content of the rod-like liquid crystalline compound is preferably 10% to 97% by mass, more preferably 40% to 95% by mass, and still more preferably 60% to 95% by mass with respect to the total mass of the light absorption anisotropic layer A.

In a case where the rod-like liquid crystalline compound includes a high-molecular-weight liquid crystalline compound, a content of the high-molecular-weight liquid crystalline compound is preferably 10 to 99 parts by mass, more preferably 30 to 95 parts by mass, and still more preferably 40 to 90 parts by mass with respect to the total mass (100 parts by mass) of the rod-like liquid crystalline compound.

In a case where the rod-like liquid crystalline compound includes a low-molecular-weight liquid crystalline compound, a content of the low-molecular-weight liquid crystalline compound is preferably 1 to 90 parts by mass, more preferably 5 to 70 parts by mass, and still more preferably 10 to 60 parts by mass with respect to the total mass (100 parts by mass) of the rod-like liquid crystalline compound.

In a case where the rod-like liquid crystalline compound includes both the high-molecular-weight liquid crystalline compound and the low-molecular-weight liquid crystalline compound, from the viewpoint that the effect of the present invention is more excellent, a mass ratio (low-molecular-weight liquid crystalline compound/high-molecular-weight liquid crystalline compound) of the content of the low-molecular-weight liquid crystalline compound to the content of the high-molecular-weight liquid crystalline compound is preferably 5/95 to 70/30 and more preferably 10/90 to 50/50.

A content of the liquid crystalline compound is preferably 25 to 2000 parts by mass, more preferably 100 to 1300 parts by mass, and still more preferably 200 to 900 parts by mass with respect to 100 parts by mass of the content of the dichroic substance in the total mass of the light absorption anisotropic layer. In a case where the content of the liquid crystalline compound is within the above-described ranges, the alignment degree of the light absorption anisotropic layer is further improved.

The liquid crystalline compound may be contained only one kind or two or more kinds. In a case of containing two or more kinds of liquid crystalline compounds, the above-described content of the liquid crystalline compounds indicates the total content of the liquid crystalline compounds.
[Organic Dichroic Coloring Agent]

The organic dichroic coloring agent used in the present invention (hereinafter, may be simply referred to as "dichroic substance") is not particularly limited, but is preferably an organic dichroic coloring agent absorbing visible light and more preferably an organic dichroic coloring agent having a maximal absorption wavelength in the visible light region (wavelength of approximately 400 to 700 nm).

An organic dichroic coloring agent which is particularly preferably used is a dichroic azo coloring agent compound.

The dichroic azo coloring agent compound is not particularly limited, and known dichroic azo coloring agents in the related art can be used, but compounds described below are preferably used.

In the present invention, the dichroic azo coloring agent compound means a coloring agent having different absorbances depending on directions.

The dichroic azo coloring agent compound may or may not exhibit liquid crystallinity.

In a case where the dichroic azo coloring agent compound exhibits liquid crystallinity, any of nematic properties or smectic properties may be exhibited. The temperature range at which the liquid crystal phase is exhibited is preferably room temperature (approximately 20° C. to 28° C.) to 300° C., and from the viewpoint of handleability and manufacturing suitability, more preferably 50° C. to 200° C.

In the present invention, from the viewpoint of adjusting tint, the light absorption anisotropic layer contains preferably at least one coloring agent compound having a maximal absorption wavelength in a wavelength range of 560 to 700 nm (hereinafter, also abbreviated as "first dichroic azo coloring agent compound") and at least one coloring agent compound having a maximal absorption wavelength in a wavelength range of 455 nm or more and less than 560 nm (hereinafter, also abbreviated as "second dichroic azo coloring agent compound"), and specifically, it is more preferable to contain at least a dichroic azo coloring agent compound represented by Formula (1) and a dichroic azo coloring agent compound represented by Formula (2).

In the present invention, three or more kinds of dichroic azo coloring agent compounds may be used in combination. For example, from the viewpoint of making color of the light absorption anisotropic layer close to black, it is preferable to use the first dichroic azo coloring agent compound, the second dichroic azo coloring agent compound, and at least one coloring agent compound having a maximal absorption wavelength in a wavelength range of 380 nm or more and less than 455 nm (hereinafter, also abbreviated as "third dichroic azo coloring agent compound") in combination.

In the present invention, from the viewpoint of improving pressing resistance, it is preferable that the dichroic azo coloring agent compound has a crosslinkable group.

Specific examples of the crosslinkable group include a (meth)acryloyl group, an epoxy group, an oxetanyl group, and a styryl group, and among these, a (meth)acryloyl group is preferable.

(First Dichroic Azo Coloring Agent Compound)

It is preferable that the first dichroic azo coloring agent compound is a compound having a chromophore which is a nucleus and a side chain bonded to a terminal of the chromophore.

Specific examples of the chromophore include an aromatic ring group (such as an aromatic hydrocarbon group and an aromatic heterocyclic group) and an azo group, and a structure having both the aromatic ring group and the azo group is preferable, and a bisazo structure having the aromatic heterocyclic group (preferably a thienothiazole group) and two azo groups is more preferable.

The side chain is not particularly limited, and examples thereof include a group represented by L3, R2, or L4 in Formula (1) described later.

The first dichroic azo coloring agent compound is a dichroic azo coloring agent compound having a maximal absorption wavelength in a wavelength range of 560 to 700 nm, and from the viewpoint of adjusting the tint of the light absorption anisotropic layer, it is preferably a dichroic azo coloring agent compound having a maximal absorption wavelength in a wavelength range of 560 to 650 nm and more preferably a dichroic azo coloring agent compound having a maximal absorption wavelength in a wavelength range of 560 to 640 nm.

In the present invention, a coloring agent having a high absorbance on the visible light long wavelength side and low absorption in the infrared region is preferable.

The maximal absorption wavelength (nm) of the dichroic azo coloring agent compound in the present specification is acquired from an ultraviolet visible spectrum in a wavelength range of 380 to 800 nm, which is measured with a spectrophotometer using a solution prepared by dissolving the dichroic azo coloring agent compound in a good solvent.

In the present invention, from the viewpoint of further improving the alignment degree of the light absorption anisotropic layer to be formed and of less absorption in the infrared region, it is preferable that the first dichroic azo coloring agent compound is a compound represented by Formula (1).

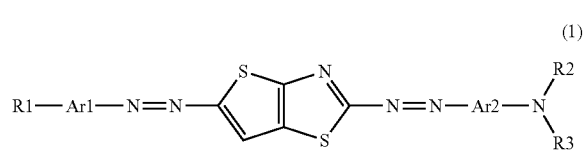

In Formula (1), Ar1 and Ar2 each independently represent a phenylene group which may have a substituent or a naphthylene group which may have a substituent, and a phenylene group is preferable.

In Formula (1), R1 represents a hydrogen atom, a linear or branched alkyl group having 1 to 20 carbon atoms, which may have a substituent, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group.

—CH$_2$— constituting the above-described alkyl group may be substituted with —O—, —CO—, —C(O)—O—, —O—C(O)—, —Si(CH$_3$)$_2$—O—Si(CH$_3$)$_2$—, —N(R1')—, —N(R1')—CO—, —CO—N(R1')—, —N(R1')—C(O)—O—, —O—C(O)—N(R1')—, —N(R1')—C(O)—N(R1')—, —CH=CH—, —C≡C—, —N=N—, —C(R1')=CH—C(O)—, or —O—C(O)—O—.

In a case where R1 represents a group other than a hydrogen atom, the hydrogen atom in each group may be substituted with a halogen atom, a nitro group, a cyano group, —N(R1')₂, an amino group, —C(R1')=C(R1')—NO₂, —C(R1')=C(R1')—CN, or —C(R1')=C(CN)₂.

R1' represents a hydrogen atom or a linear or branched alkyl group having 1 to 6 carbon atoms. In a case where a plurality of (R1')'s are present in each group, these may be the same or different from each other.

In Formula (1), R2 and R3 each independently represent a hydrogen atom, a linear or branched alkyl group having 1 to 20 carbon atoms, which may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group.

—CH₂— constituting the above-described alkyl group may be substituted with —O—, —S—, —C(O)—, —C(O)—O—, —O—C(O)—, —C(O)—S—, —S—C(O)—, —Si(CH₃)₂—O—Si(CH₃)₂—, —NR2'-, —NR2'-CO—, —CO—NR2'-, —NR2'-C(O)—O—, —O—C(O)—NR2'-, —NR2'-C(O)—NR2'-, —CH=CH—, —C≡C—, —N=N—, —C(R2')=CH—C(O)—, or —O—C(O)—O—.

In a case where $R^2$ and $R^3$ represent a group other than a hydrogen atom, the hydrogen atom of each group may be substituted with a halogen atom, a nitro group, a cyano group, a —OH group, —N(R2')₂, an amino group, —C(R2')=C(R2')-NO₂, —C(R2')=C(R2')-CN, or —C(R2')=C(CN)₂.

R2' represents a hydrogen atom or a linear or branched alkyl group having 1 to 6 carbon atoms. In a case where a plurality of (R2')'s are present in each group, these may be the same or different from each other.

R2 and R3 may be bonded to each other to form a ring, or R2 or R3 may be bonded to Ar2 to form a ring.

From the viewpoint of light resistance, it is preferable that R1 represents an electron-withdrawing group and R2 and R3 represent a group having a low electron-donating property.

Specific examples of R1 in such a group include an alkylsulfonyl group, an alkylcarbonyl group, an alkyloxycarbonyl group, an acyloxy group, an alkylsulfonylamino group, an alkylsulfamoyl group, an alkylsulfinyl group, and an alkylureido group, and examples of R2 and R3 in such a group include groups having the following structures. The groups having the following structures are shown in a form having a nitrogen atom to which R2 and R3 are bonded in Formula (1).

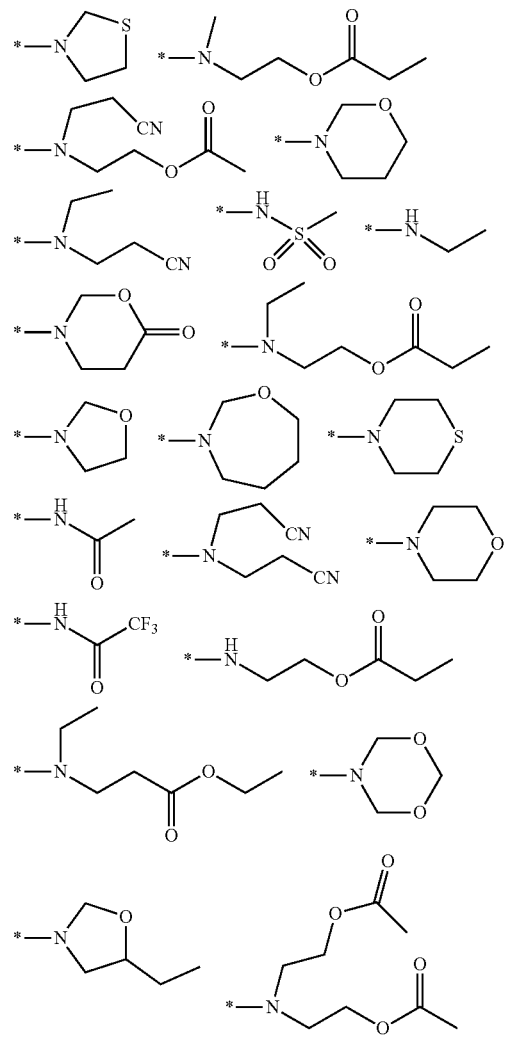

Specific examples of the first dichroic azo coloring agent compound are shown below, but the present invention is not limited thereto.

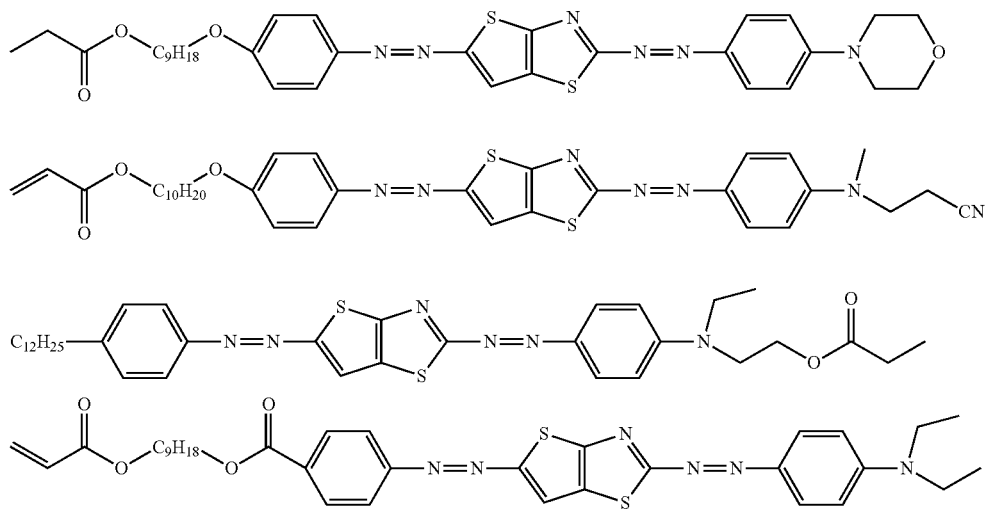

-continued
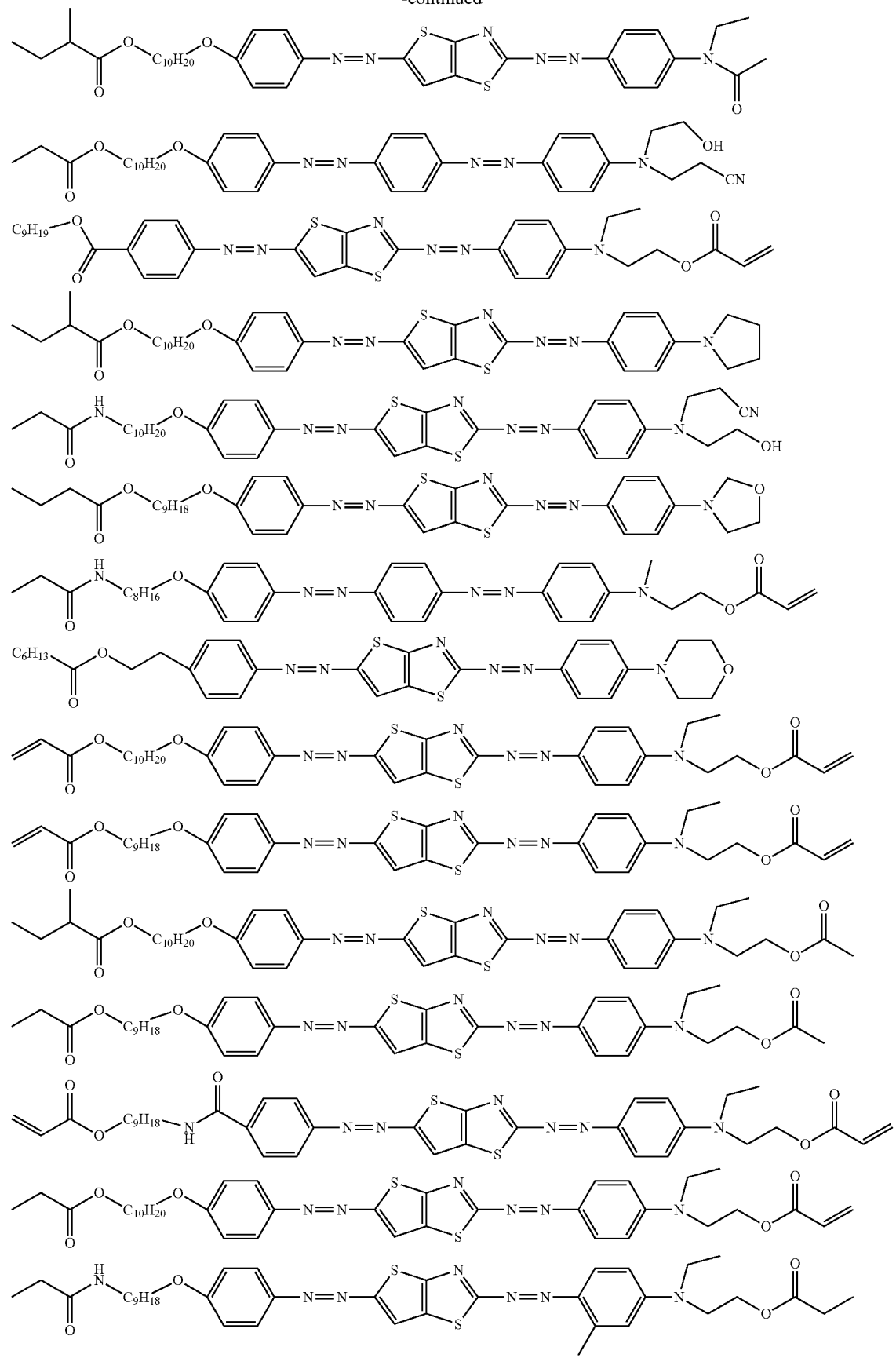

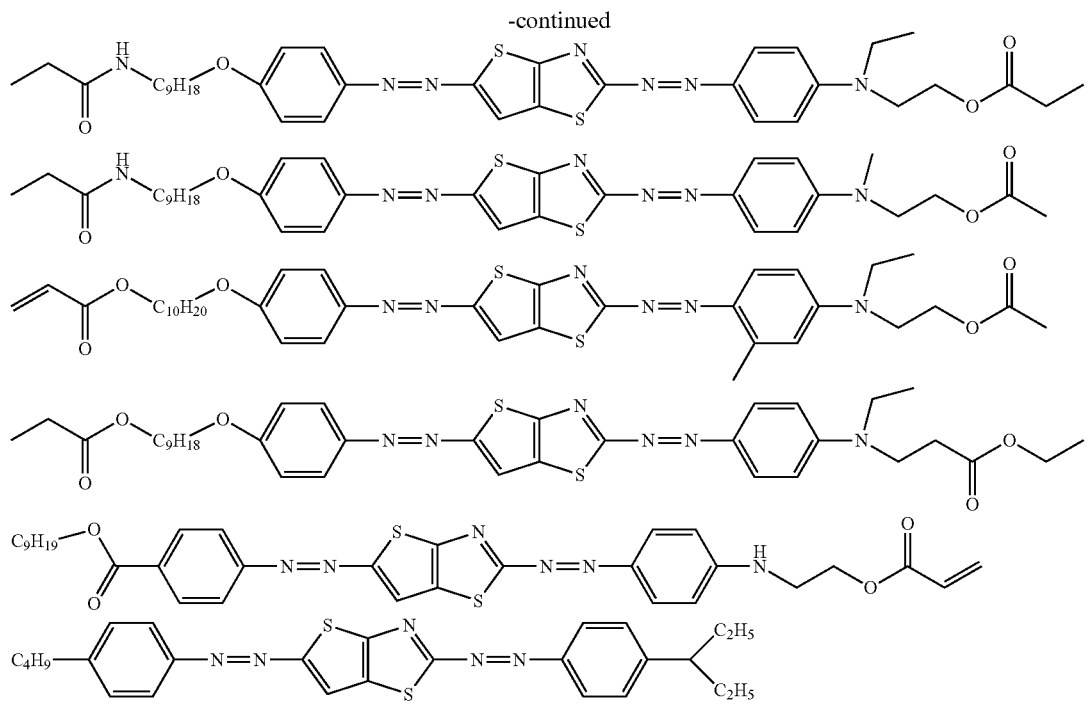

(Second Dichroic Azo Coloring Agent Compound)

The second dichroic azo coloring agent compound is a compound different from the first dichroic azo coloring agent compound, and specifically, a chemical structure thereof is different from that of the first dichroic azo coloring agent compound.

It is preferable that the second dichroic azo coloring agent compound is a compound having a chromophore which is a nucleus of a dichroic azo coloring agent compound and a side chain bonded to a terminal of the chromophore.

Specific examples of the chromophore include an aromatic ring group (such as an aromatic hydrocarbon group and an aromatic heterocyclic group) and an azo group, and a structure having both the aromatic hydrocarbon group and the azo group is preferable, and a trisazo structure having the aromatic hydrocarbon group and two or three azo groups is more preferable.

The side chain is not particularly limited, and examples thereof include a group represented by R4, R5, or R6 in Formula (2) described later.

The second dichroic azo coloring agent compound is a dichroic azo coloring agent compound having a maximal absorption wavelength in a wavelength range of 455 nm or more and less than 560 nm, and from the viewpoint of adjusting the tint of the light absorption anisotropic layer, it is preferably a dichroic azo coloring agent compound having a maximal absorption wavelength in a wavelength range of 455 to 555 nm and more preferably a dichroic azo coloring agent compound having a maximal absorption wavelength in a wavelength range of 455 to 550 nm.

In particular, the tint of the light absorption anisotropic layer is easily adjusted by using the first dichroic azo coloring agent compound having a maximal absorption wavelength of 560 to 700 nm and the second dichroic azo coloring agent compound having a maximal absorption wavelength of 455 nm or more and less than 560 nm.

From the viewpoint of further improving the alignment degree of the light absorption anisotropic layer, it is preferable that the second dichroic azo coloring agent compound is a compound represented by Formula (2).

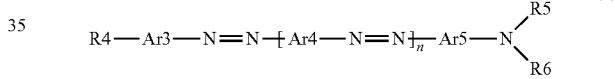

In Formula (2), n represents 1 or 2.

In Formula (2), Ar3, Ar4, and Ar5 each independently represent a phenylene group which may have a substituent, a naphthylene group which may have a substituent, or a heterocyclic group which may have a substituent.

The heterocyclic group may be aromatic or non-aromatic.

Examples of atoms other than carbon, constituting the aromatic heterocyclic group, include a nitrogen atom, a sulfur atom, and an oxygen atom. In a case where the aromatic heterocyclic group has a plurality of atoms other than carbon, constituting a ring, these atoms may be the same or different from each other.

Specific examples of the aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

In Formula (2), R4 has the same definition as that for R1 in Formula (1).

In Formula (2), R5 and R6 each have the same definition as that for R2 and R3 in Formula (1).

From the viewpoint of light resistance, it is preferable that R4 represents an electron-withdrawing group and R5 and R6 represent a group having a low electron-donating property.

Among such groups, specific examples of the case where R4 represents an electron-withdrawing group are the same as the specific examples of the case where R1 represents an electron-withdrawing group; and specific examples of the case where R5 and R6 represent a group having a low electron-donating property are the same as the specific examples of the case where R2 and R3 represent a group having a low electron-donating property.

Specific examples of the second dichroic azo coloring agent compound are shown below, but the present invention is not limited thereto.

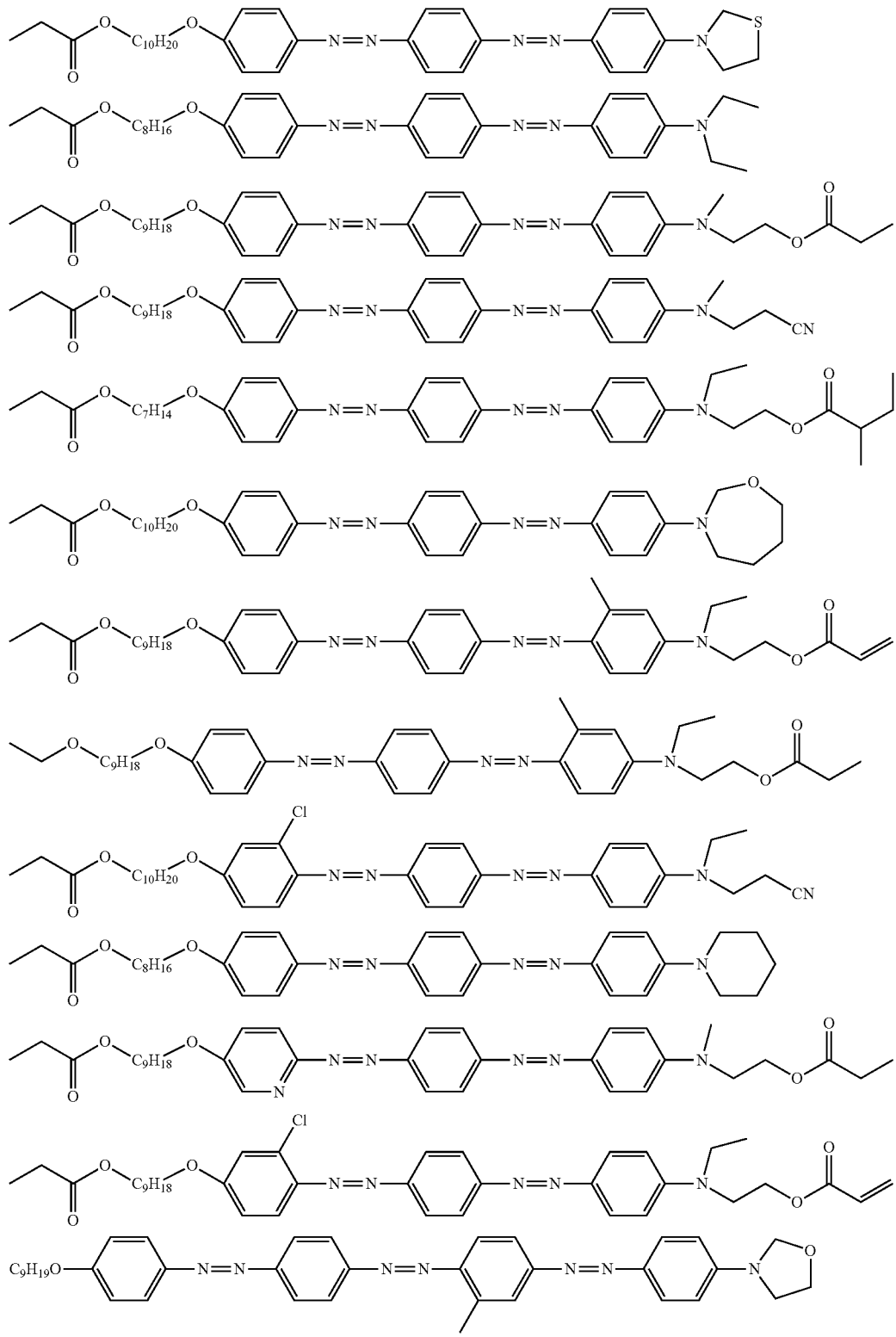

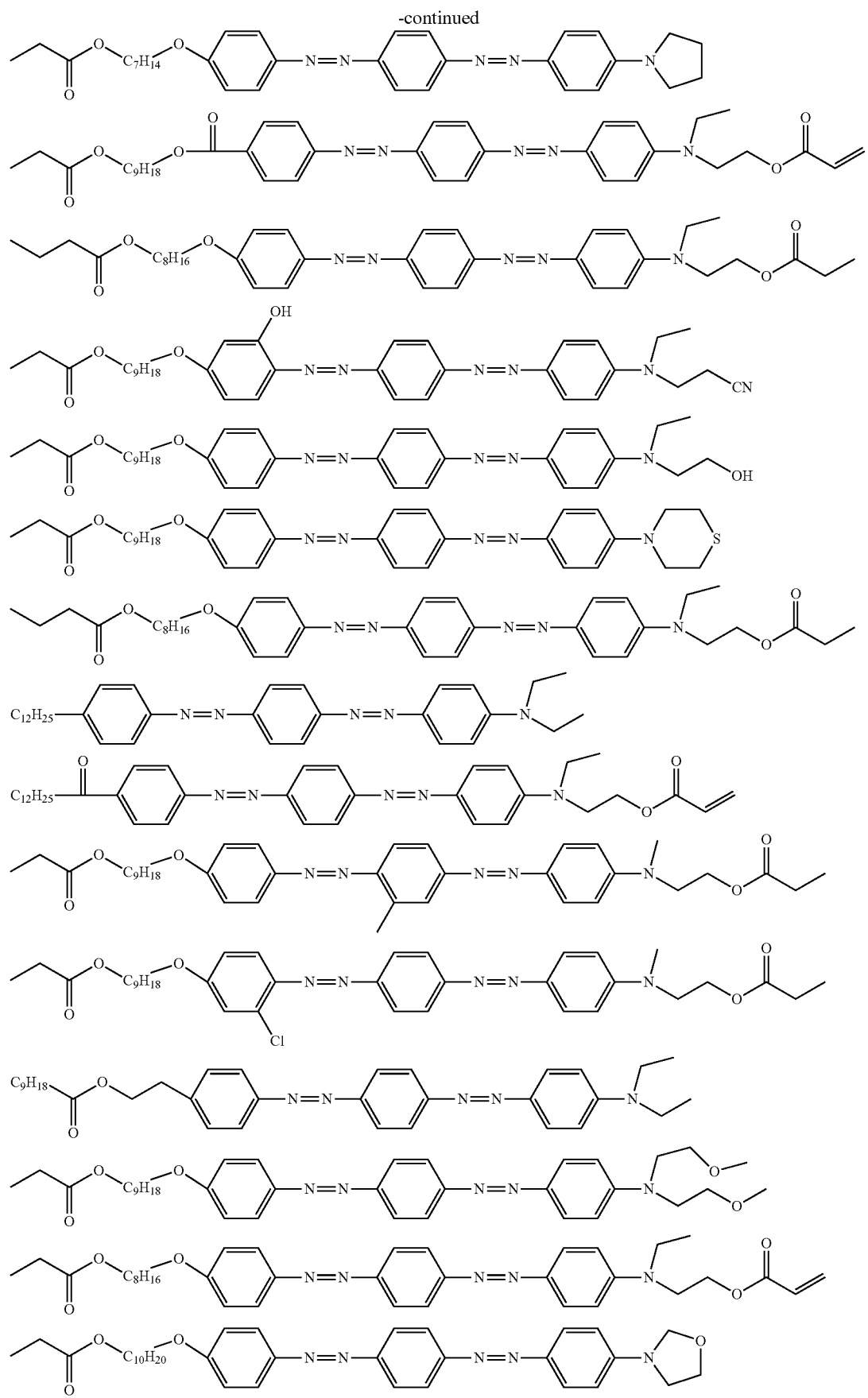

-continued
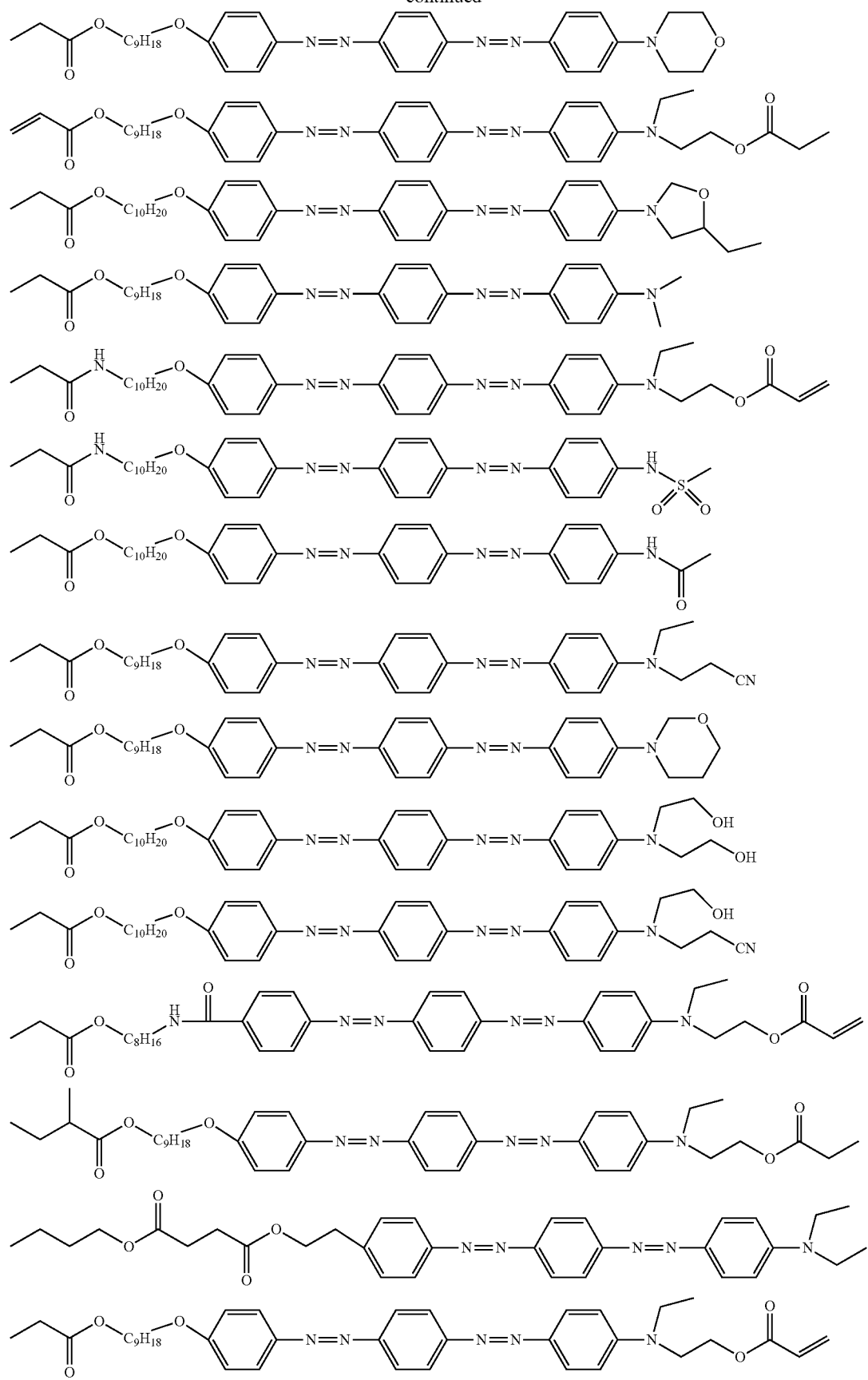

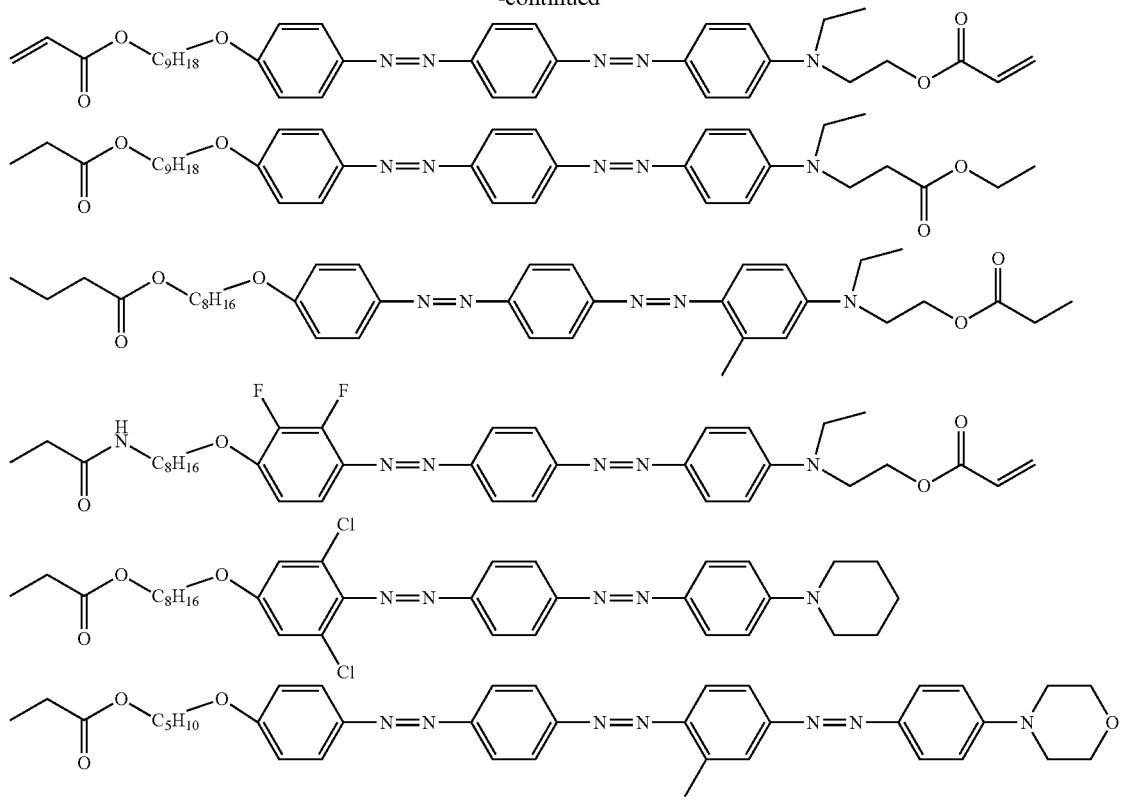

(Difference in Log P Value)

A log P value is an index expressing hydrophilicity and hydrophobicity of a chemical structure. An absolute value of a difference (hereinafter, also referred to as "difference in log P value") between a log P value of a side chain of the first dichroic azo coloring agent compound and a log P value of a side chain of the second dichroic azo coloring agent compound is preferably 2.30 or less, more preferably 2.0 or less, still more preferably 1.5 or less, and particularly preferably 1.0 or less. In a case where the difference in log P value is 2.30 or less, since affinity between the first dichroic azo coloring agent compound and the second dichroic azo coloring agent compound is enhanced and an arrangement structure is more easily formed, the alignment degree of the light absorption anisotropic layer is further improved. In a case where the coloring agent forms the arrangement structure, a Bragg peak (peak derived from Bragg reflection) is observed by X-ray diffraction measurement. A half-width of the peak is preferably 1 Å or less.

In a case where the first dichroic azo coloring agent compound or the second dichroic azo coloring agent compound has a plurality of side chains, it is preferable that at least one difference in log P value satisfies the above-described value.

Here, the side chain of the first dichroic azo coloring agent compound and the side chain of the second dichroic azo coloring agent compound mean a group bonded to the terminal of the above-described chromophore. For example, R1, R2, and R3 in Formula (1) are the side chain in a case where the first dichroic azo coloring agent compound is the compound represented by Formula (1), and R4, R5, and R6 in Formula (2) are the side chain in a case where the second dichroic azo coloring agent compound is the compound represented by Formula (2). In particular, in a case where the first dichroic azo coloring agent compound is the compound represented by Formula (1) and the second dichroic azo coloring agent compound is the compound represented by Formula (2), it is preferable that at least one difference in log P value among the difference in log P value between R1 and R4, the difference in log P value between R1 and R5, the difference in log P value between R2 and R4, and the difference in log P value between R2 and R5 satisfies the above-described value.

Here, the log P value is an index for expressing properties of hydrophilicity and hydrophobicity of a chemical structure, and is also referred to as a hydrophilic-hydrophobic parameter. The log P value can be calculated using software such as ChemBioDraw Ultra or HSPiP (Ver. 4.1.07). In addition, the log P value can be acquired experimentally by the method of the OECD Guidelines for the Testing of Chemicals, Sections 1, Test No. 117, or the like. In the present invention, a value calculated by inputting the structural formula of a compound to HSPiP (Ver. 4.1.07) is adopted as the log P value unless otherwise specified.

(Third Dichroic Azo Coloring Agent Compound)

The third dichroic azo coloring agent compound is a dichroic azo coloring agent compound other than the first dichroic azo coloring agent compound and the second dichroic azo coloring agent compound, and specifically, a chemical structure thereof is different from those of the first dichroic azo coloring agent compound and the second dichroic azo coloring agent compound. In a case where the light absorption anisotropic layer contains the third dichroic azo coloring agent compound, there is an advantage that the tint of the light absorption anisotropic layer is easily adjusted.

The maximal absorption wavelength of the third dichroic azo coloring agent compound is 380 nm or more and less than 455 nm, preferably 385 to 454 nm.

As the third dichroic azo coloring agent compound, a dichroic azo coloring agent represented by Formula (6) is preferable.

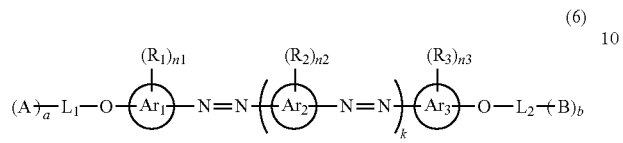

(6)

In Formula (6), A and B each independently represent a crosslinkable group.

In Formula (6), a and b each independently represent 0 or 1. From the viewpoint that the alignment degree at a wavelength of 420 nm is excellent, it is preferable that both a and b represent 0.

In Formula (6), $L_1$ represents a monovalent substituent in a case where a is 0, and $L_1$ represents a single bond or a divalent linking group in a case where a is 1. In addition, $L_2$ represents a monovalent substituent in a case where b is 0, and $L_2$ represents a single bond or a divalent linking group in a case where b is 1.

In Formula (6), $Ar_1$ represents an (n1+2)-valent aromatic hydrocarbon group or heterocyclic group, $Ar_2$ represents an (n2+2)-valent aromatic hydrocarbon group or heterocyclic group, and $Ar_3$ represents an (n3+2)-valent aromatic hydrocarbon group or heterocyclic group.

In Formula (6), $R_1$, $R_2$, and $R_3$ each independently represent a monovalent substituent. A plurality of $R_1$'s may be the same or different from each other in a case of "n1≥2", a plurality of $R_2$'s may be the same or different from each other in a case of "n2≥2", and a plurality of $R_3$'s may be the same or different from each other in a case of "n3≥2".

In Formula (6), k represents an integer of 1 to 4. In a case of "k≥2", a plurality of $Ar_2$'s may be the same or different from each other, and a plurality of $R_2$'s may be the same or different from each other.

In Formula (6), n1, n2, and n3 each independently represent an integer of 0 to 4. Here, an expression of "n1+n2+n3≥0" is satisfied in a case of "k=1", and an expression of "n1+n2+n3≥1" is satisfied in a case of "k≥2".

In Formula (6), examples of the crosslinkable group represented by A and B include polymerizable groups described in paragraphs [0040] to [0050] of JP2010-244038A. Among these, an acryloyl group, a methacryloyl group, an epoxy group, an oxetanyl group, or a styryl group is preferable from the viewpoint of improving reactivity and synthetic suitability, and an acryloyl group or a methacryloyl group is more preferable from the viewpoint of further improving solubility.

In Formula (6), $L_1$ represents a monovalent substituent in a case where a is 0, and $L_1$ represents a single bond or a divalent linking group in a case where a is 1. In addition, $L_2$ represents a monovalent substituent in a case where b is 0, and $L_2$ represents a single bond or a divalent linking group in a case where b is 1.

As the monovalent substituent represented by $L_1$ and $L_2$, a group to be introduced to increase the solubility of the dichroic substance or a group having an electron-donating property or an electron-withdrawing property, which is to be introduced to adjust the color tone of the coloring agent, is preferable.

Examples of the substituent include:

an alkyl group (preferably an alkyl group having 1 to 20 carbon atoms, more preferably an alkyl group having 1 to 12 carbon atoms, and still more preferably an alkyl group having 1 to 8 carbon atoms, and examples thereof a methyl group, an ethyl group, an isopropyl group, a tert-butyl group, an n-octyl group, an n-decyl group, an n-hexadecyl group, a cyclopropyl group, a cyclopentyl group, and a cyclohexyl group);

an alkenyl group (preferably an alkenyl group having 2 to 20 carbon atoms, more preferably an alkenyl group having 2 to 12 carbon atoms, and still preferably an alkenyl group having 2 to 8 carbon atoms, and examples thereof include a vinyl group, an allyl group, a 2-butenyl group, and a 3-pentenyl group);

an alkynyl group (preferably an alkynyl group having 2 to 20 carbon atoms, more preferably an alkynyl group 2 to 12 carbon atoms, and still more preferably an alkynyl group having 2 to 8 carbon atoms, and examples thereof include a propargyl group and a 3-pentynyl group);

an aryl group (preferably an aryl group having 6 to 30 carbon atoms, more preferably an aryl group having 6 to 20 carbon atoms, and still more preferably an aryl group having 6 to 12 carbon atoms, and examples thereof include a phenyl group, a 2,6-diethylphenyl group, a 3,5-ditrifluoromethylphenyl group, a naphthyl group, and a biphenyl group);

a substituted or unsubstituted amino group (preferably an amino group having 0 to 20 carbon atoms, more preferably an amino group having 0 to 10 carbon atoms, and still more preferably an amino group having 0 to 6 carbon atoms, and examples thereof include an unsubstituted amino group, a methylamino group, a dimethylamino group, a diethylamino group, and an anilino group);

an alkoxy group (preferably an alkoxy group having 1 to 20 carbon atoms and more preferably an alkoxy group having 1 to 15 carbon atoms, and examples thereof include a methoxy group, an ethoxy group, and a butoxy group);

an oxycarbonyl group (preferably an oxycarbonyl group having 2 to 20 carbon atoms, more preferably an oxycarbonyl group having 2 to 15 carbon atoms, and still more preferably an oxycarbonyl group having 2 to 10 carbon atoms, and examples thereof include a methoxycarbonyl group, an ethoxycarbonyl group, and a phenoxycarbonyl group);

an acyloxy group (preferably an acyloxy group having 2 to 20 carbon atoms, more preferably an acyloxy group having 2 to 10 carbon atoms, and still more preferably an acyloxy group having 2 to 6 carbon atoms, and examples thereof include an acetoxy group and a benzoyloxy group);

an acylamino group (preferably an acylamino group having 2 to 20 carbon atoms, more preferably an acylamino group having 2 to 10 carbon atoms, and still more preferably an acylamino group having 2 to 6 carbon atoms, and examples thereof include an acetylamino group and a benzoylamino group);

an alkoxycarbonylamino group (preferably an alkoxycarbonylamino group having 2 to 20 carbon atoms, more preferably an alkoxycarbonylamino group having 2 to 10 carbon atoms, and still more preferably an alkoxycarbonylamino group having 2 to 6 carbon atoms, and examples thereof include a methoxycarbonylamino group);

an aryloxycarbonylamino group (preferably an aryloxycarbonylamino group having 7 to 20 carbon atoms, more preferably an aryloxycarbonylamino group having 7 to 16 carbon atoms, and still more preferably an aryloxycarbonylamino group having 7 to 12 carbon atoms, and examples thereof include a phenyloxycarbonylamino group);

a sulfonylamino group (preferably a sulfonylamino group having 1 to 20 carbon atoms, more preferably a sulfonylamino group having 1 to 10 carbon atoms, and still more preferably a sulfonylamino group having 1 to 6 carbon atoms, and examples thereof include a methanesulfonylamino group and a benzenesulfonylamino group);

a sulfamoyl group (preferably a sulfamoyl group having 0 to 20 carbon atoms, more preferably a sulfamoyl group having 0 to 10 carbon atoms, and still more preferably a sulfamoyl group having 0 to 6 carbon atoms, and examples thereof include a sulfamoyl group, a methylsulfamoyl group, a dimethylsulfamoyl group, and a phenylsulfamoyl group);

a carbamoyl group (preferably a carbamoyl group having 1 to 20 carbon atoms, more preferably a carbamoyl group having 1 to 10 carbon atoms, and still more preferably a carbamoyl group having 1 to 6 carbon atoms, and examples thereof include an unsubstituted carbamoyl group, a methylcarbamoyl group, a diethylcarbamoyl group, and a phenylcarbamoyl group);

an alkylthio group (preferably an alkylthio group having 1 to 20 carbon atoms, more preferably an alkylthio group having 1 to 10 carbon atoms, and still more preferably an alkylthio group having 1 to 6 carbon atoms, and examples thereof include a methylthio group and an ethylthio group);

an arylthio group (preferably an arylthio group having 6 to 20 carbon atoms, more preferably an arylthio group having 6 to 16 carbon atoms, and still more preferably an arylthio group having 6 to 12 carbon atoms, and examples thereof include a phenylthio group);

a sulfonyl group (preferably a sulfonyl group having 1 to 20 carbon atoms, more preferably a sulfonyl group having 1 to 10 carbon atoms, and still more preferably a sulfonyl group having 1 to 6 carbon atoms, and examples thereof include a mesyl group and a tosyl group);

a sulfinyl group (preferably a sulfinyl group having 1 to 20 carbon atoms, more preferably a sulfinyl group having 1 to 10 carbon atoms, and still more preferably a sulfinyl group having 1 to 6 carbon atoms, and examples thereof include a methanesulfinyl group and a benzenesulfinyl group);

a ureido group (preferably a ureido group having 1 to 20 carbon atoms, more preferably a ureido group having 1 to 10 carbon atoms, and still more preferably a ureido group having 1 to 6 carbon atoms, and examples thereof include an unsubstituted ureido group, a methylureido group, and a phenylureido group);

a phosphoric acid amide group (preferably a phosphoric acid amide group having 1 to 20 carbon atoms, more preferably a phosphoric acid amide group having 1 to 10 carbon atoms, and still more preferably a phosphoric acid amide group having 1 to 6 carbon atoms, and examples thereof include a diethylphosphoric acid amide group and a phenylphosphoric acid amide group);

a heterocyclic group (preferably a heterocyclic group having 1 to 30 carbon atoms and more preferably a heterocyclic group having 1 to 12 carbon atoms, examples thereof include a heterocyclic group having a heteroatom such as a nitrogen atom, an oxygen atom, or a sulfur atom, and examples of such a heterocyclic group include an imidazolyl group, a pyridyl group, a quinolyl group, a furyl group, a piperidyl group, a morpholino group, a benzoxazolyl group, a benzimidazolyl group, and a benzothiazolyl group);

a silyl group (preferably a silyl group having 3 to 40 carbon atoms, more preferably a silyl group having 3 to 30 carbon atoms, and still more preferably a silyl group having 3 to 24 carbon atoms, and examples thereof include a trimethylsilyl group and a triphenylsilyl group);

a halogen atom (examples thereof include a fluorine atom, a chlorine atom, a bromine atom, and an iodine atom);

a hydroxy group, a mercapto group, a cyano group, a nitro group, a hydroxamic acid group, a sulfino group, a hydrazino group, an imino group, and an azo group.

These substituents may be further substituted with these substituents. In addition, in a case where two or more substituents are present, these may be the same or different from each other. Furthermore, if possible, these substituents may be bonded to each other to form a ring.

Examples of a group in which the above-described substituent is further substituted with the above-described substituent include an $R_B\text{—}(O\text{—}R_A)_{na}\text{—}$ group which is a group in which an alkoxy group is substituted with an alkyl group. Here, in the formula, $R_A$ represents an alkylene group having 1 to 5 carbon atoms, $R_B$ represents an alkyl group having 1 to 5 carbon atoms, and na represents an integer of 1 to 10 (preferably an integer of 1 to 5 and more preferably an integer of 1 to 3).

Among these, as the monovalent substituent represented by $L_1$ and $L_2$, an alkyl group, an alkenyl group, an alkoxy group, or a group in which these groups are further substituted with these groups (for example, $R_B\text{—}(O\text{—}R_A)_{na}\text{—}$ group described above) is preferable; and an alkyl group, an alkoxy group, or a group in which these groups are further substituted with these groups (for example, $R_B\text{—}(O\text{—}R_A)_{na}\text{—}$ group described above) is more preferable.

Examples of the divalent linking group represented by $L_1$ and $L_2$ include —O—, —S—, —CO—, —COO—, —OCO—, —O—CO—O—, —CO—NRN—, —O—CO—NRN—, —NRN—CO—NRN—, —SO$_2$—, —SO—, an alkylene group, a cycloalkylene group, an alkenylene group, and a group obtained by combining two or more of these groups.

Among these, a group obtained by combining an alkylene group with one or more groups selected from the group consisting of —O—, —COO—, —OCO— and —O—CO—O— is preferable.

Here, $R_N$ represents a hydrogen atom or an alkyl group. In a case where a plurality of $R_N$'s are present, the plurality of $R_N$'s may be the same or different from each other.

From the viewpoint of further improving the solubility of the dichroic substance, the number of atoms in a main chain of at least one of $L_1$ or $L_2$ is preferably 3 or more, more preferably 5 or more, still more preferably 7 or more, and particularly preferably 10 or more. In addition, the upper limit value of the number of atoms in the main chain is preferably 20 or less and more preferably 12 or less.

On the other hand, from the viewpoint of further improving the alignment degree of the light absorption anisotropic layer, the number of atoms in the main chain of at least one of $L_1$ or $L_2$ is preferably 1 to 5.

Here, in a case where A is present in Formula (6), the "main chain" of $L_1$ denotes a portion required for directly linking "A" with the "O" atom linked to $L_1$, and the "number of atoms in the main chain" denotes the number of atoms constituting the portion. Similarly, in a case where B is present in Formula (6), the "main chain" of $L_2$ denotes a portion required for directly linking "B" with the "O" atom linked to $L_2$, and the "number of atoms in the main chain" denotes the number of atoms constituting the portion. The "number of atoms in the main chain" does not include the number of atoms in a branched chain described below.

In addition, in a case where A is not present, the "number of atoms in the main chain" of $L_1$ denotes the number of atoms in $L_1$ which does not have a branched chain. In a case where B is not present, the "number of atoms in the main chain" of $L_2$ denotes the number of atoms in $L_2$ which does not have a branched chain.

Specifically, in Formula (D1), the number of atoms in the main chain of $L_1$ (the number of atoms in the dotted frame on the left side of Formula (D1)) is 5, and the number of atoms in the main chain of $L_2$ (the number of atoms in the dotted frame on the right side of Formula (D1)) is 5. In addition, in Formula (D10), the number of atoms in the main chain of $L_1$ (the number of atoms in the dotted frame on the left side of Formula (D10)) is 7, and the number of atoms in the main chain of $L_2$ (the number of atoms in the dotted frame on the right side of Formula (D10)) is 5.

Formula (6), the "branched chain" of $L_2$ denotes a portion other than the longest atomic chain (that is, the main chain) extending from the "O" atom linked to $L_2$ in Formula (6), which is a starting point.

The number of atoms in the branched chain is preferably 3 or less. In a case where the number of atoms in the branched chain is 3 or less, there is an advantage that the alignment degree of the light absorption anisotropic layer is further improved. The number of atoms in the branched chain does not include the number of hydrogen atoms.

In Formula (6), An represents an (n1+2)-valent (for example, a trivalent in a case where n1 is 1) aromatic hydrocarbon group or heterocyclic group, $Ar_2$ represents an (n2+2)-valent (for example, a trivalent in a case where n2 is 1) aromatic hydrocarbon group or heterocyclic group, and $Ar_3$ represents an (n3+2)-valent (for example, a trivalent in a case where n3 is 1) aromatic hydrocarbon group or heterocyclic group. Here, $Ar_1$ to $Ar_3$ can be respectively rephrased as a divalent aromatic hydrocarbon group or a divalent heterocyclic group substituted with n1 to n3 substituents ($R_1$ to $R_3$ described below).

The divalent aromatic hydrocarbon group represented by $Ar_1$ to $Ar_3$ may be monocyclic or may have a bicyclic or higher-cyclic fused ring structure. From the viewpoint of further improving the solubility, the number of rings in the divalent aromatic hydrocarbon group is preferably 1 to 4, more preferably 1 or 2, and still more preferably 1 (that is, a phenylene group).

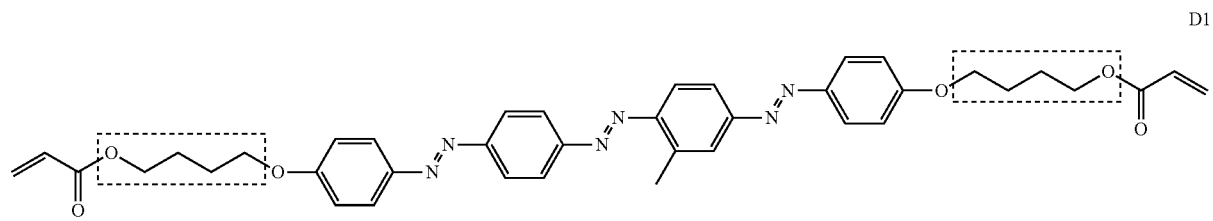

D1

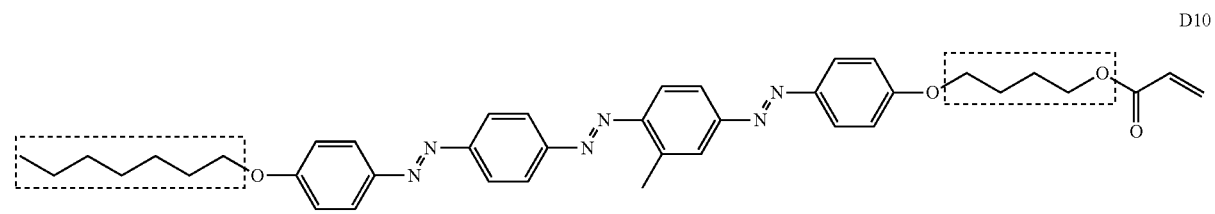

D10

$L_1$ and $L_2$ may have a branched chain.

Here, in a case where A is present in Formula (6), the "branched chain" of $L_1$ denotes a portion other than the portion required for directly linking "A" with the "O" atom linked to $L_1$ in Formula (6). Similarly, in a case where B is present in Formula (6), the "branched chain" of $L_2$ denotes a portion other than the portion required for directly linking "B" with the "O" atom linked to $L_2$ in Formula (6).

In addition, in a case where A is not present in Formula (6), the "branched chain" of $L_1$ denotes a portion other than the longest atomic chain (that is, the main chain) extending from the "O" atom linked to $L_1$ in Formula (6), which is the starting point. Similarly, in a case where B is not present in Specific examples of the divalent aromatic hydrocarbon group include a phenylene group, an azulene-diyl group, a naphthylene group, a fluorene-diyl group, an anthracene-diyl group, and a tetracene-diyl group. From the viewpoint of further improving the solubility, a phenylene group or a naphthylene group is preferable, and a phenylene group is more preferable.

Specific examples of the third dichroic azo coloring agent compound are shown below, but the present invention is not limited thereto. In the following specific examples, n represents an integer of 1 to 10.

107 108
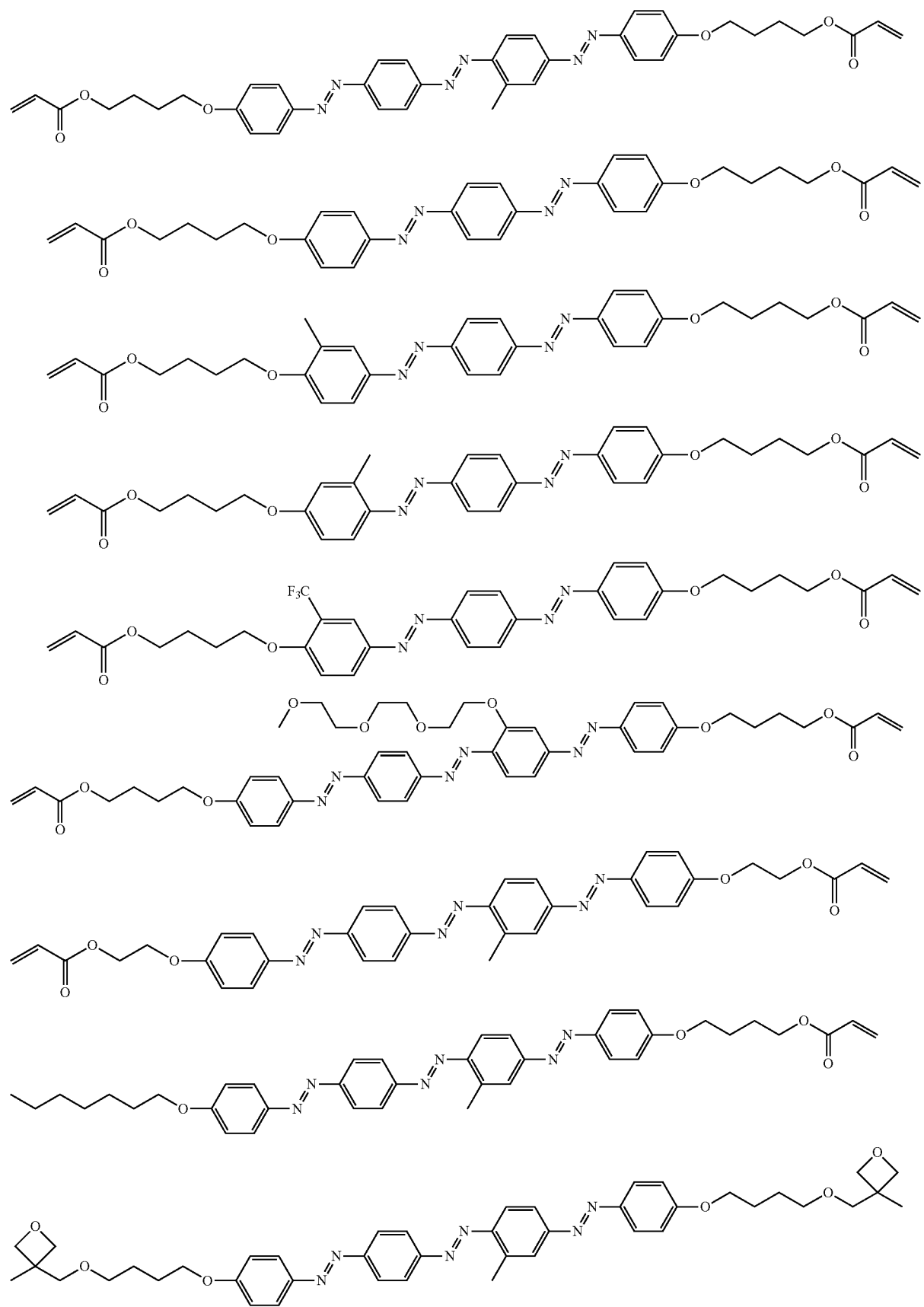

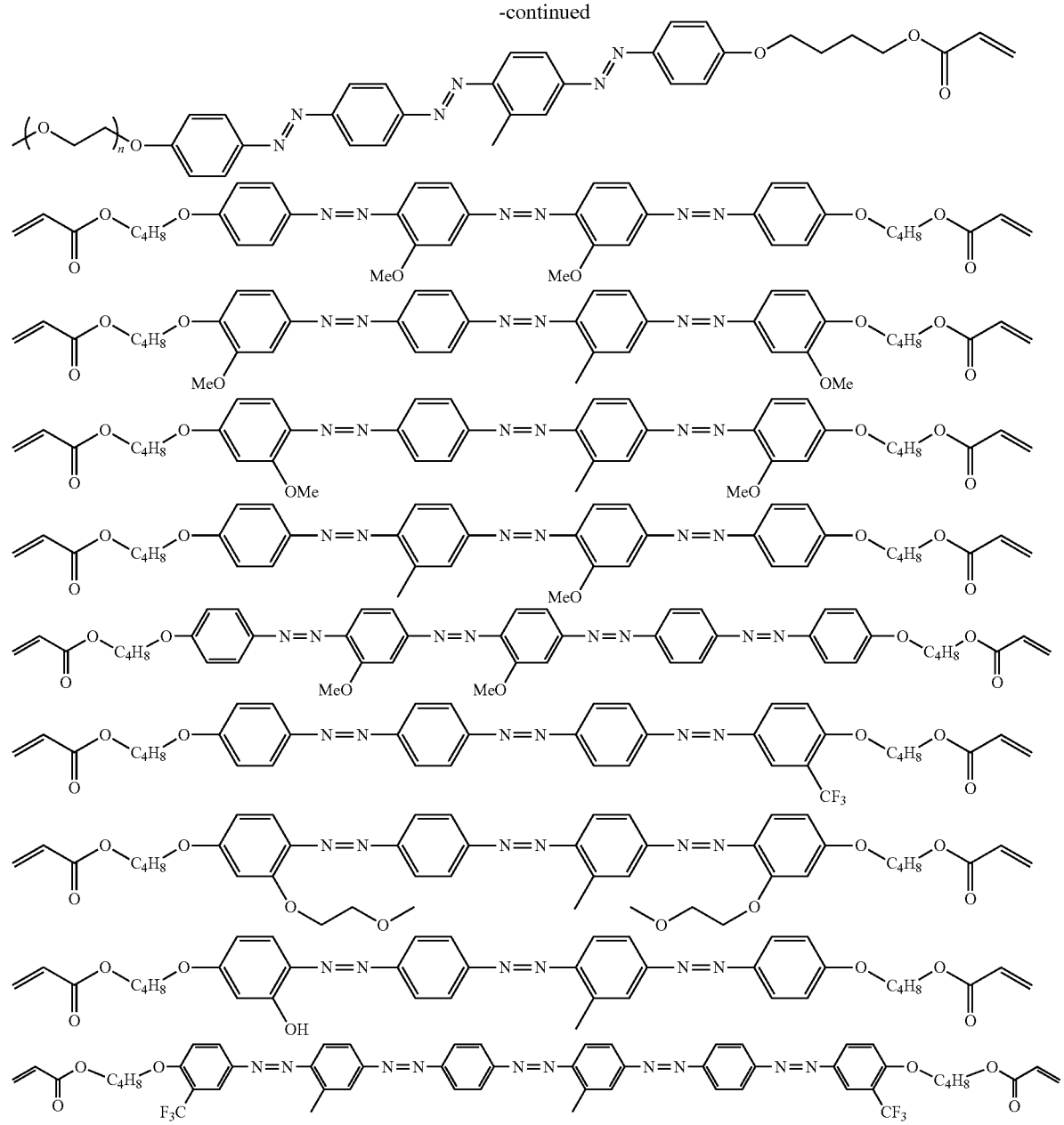
From the viewpoint that the alignment degree at a wavelength of 420 nm is excellent, it is preferable that the third dichroic azo coloring agent compound does not have a radically polymerizable group. Examples thereof include the following structures.
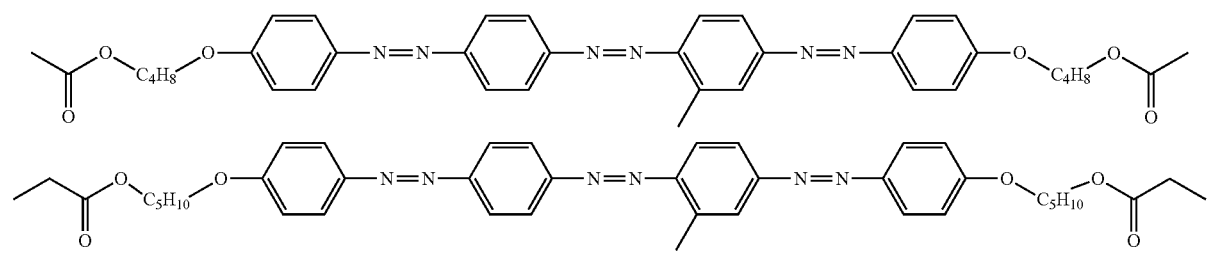

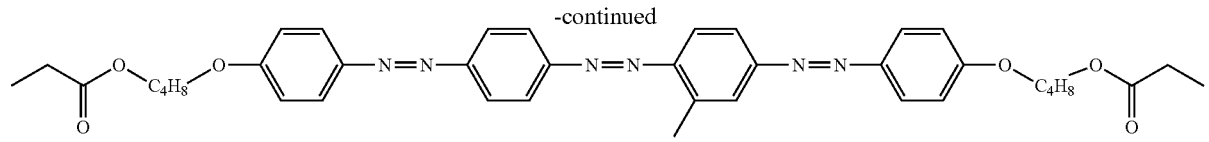

-continued

From the viewpoint that the alignment degree at a wavelength of 420 nm is particularly excellent, it is more preferable that the third dichroic azo coloring agent compound is a dichroic substance having a structure represented by Formula (1-1).

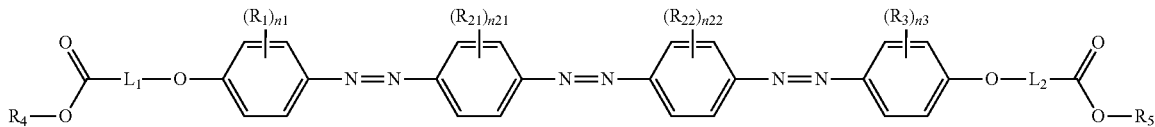

(1-1)

In Formula (1-1), $R_1$, $R_3$, $R_4$, $R_5$, n1, n3, $L_1$, and $L_2$ each have the same definition as that for $R_1$, $R_3$, $R_4$, $R_5$, n1, n3, $L_1$, and $L_2$ of Formula (1).

In Formula (1-1), $R_{21}$ and $R_{22}$ each independently have the same definition as that for $R_2$ in Formula (1).

In Formula (1-1), n21 and n22 each independently have the same definition as that for n2 in Formula (1).

An expression of "n1+n21+n22+n3≥1" is satisfied, and "n1+n21+n22+n3" is preferably 1 to 9 and more preferably 1 to 5.

Specific examples of the dichroic substance are shown below, but the present invention is not limited thereto.

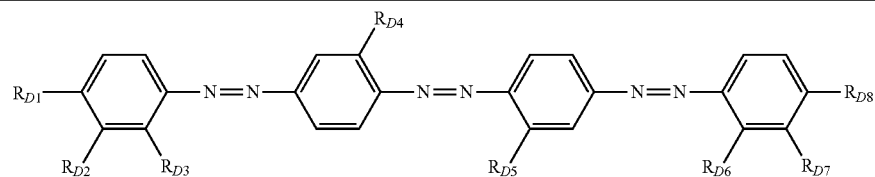

| No  | $R_{D1}$ | $R_{D2}$ | $R_{D3}$ | $R_{D4}$ | $R_{D5}$ | $R_{D6}$ | $R_{D7}$ | $R_{D8}$ |
|-----|----------|----------|----------|----------|----------|----------|----------|----------|
| D1  | OC$_4$H$_8$C(O)OCH$_2$CH$_3$ | H | H | H | CH$_3$ | H | H | OC$_4$H$_8$C(O)OCH$_2$CH$_3$ |
| D2  | OC$_4$H$_8$C(O)OCH$_3$ | H | H | H | CH$_3$ | H | H | OC$_4$H$_8$C(O)OCH$_3$ |
| D3  | OC$_4$H$_8$C(O)OCH$_2$CH$_3$ | H | H | H | CH$_3$ | H | H | OC$_{11}$H$_{23}$ |
| D4  | OC$_4$H$_8$C(O)OCH$_2$CH$_3$ | H | H | H | CH$_3$ | H | H | OC$_5$H$_{11}$ |
| D5  | OC$_4$H$_8$C(O)OCH$_2$CH$_3$ | H | H | H | CH$_3$ | H | H | OCH$_2$CH$_3$ |
| D6  | OC$_4$H$_8$C(O)OCH$_2$CH$_3$ | H | H | H | CH$_3$ | H | Cl | OC$_4$H$_8$C(O)OCH$_2$CH$_3$ |
| D7  | OC$_3$H$_6$C(O)OCH$_2$CH$_3$ | H | H | H | CH$_3$ | H | H | OC$_3$H$_6$C(O)OCH$_2$CH$_3$ |
| D8  | OC$_3$H$_6$C(O)OCH$_2$CH$_3$ | H | H | Cl | H | Cl | H | OC$_3$H$_6$C(O)OCH$_2$CH$_3$ |
| D9  | OC$_9$H$_{18}$C(O)OCH$_2$CH$_3$ | H | H | H | CH$_3$ | H | H | OC$_9$H$_{18}$C(O)OCH$_2$CH$_3$ |
| D10 | OC$_4$H$_8$C(O)OCH$_2$CH=CH$_2$ | H | H | H | CH$_3$ | H | H | OC$_4$H$_8$C(O)OCH$_2$CH=CH$_2$ |
| D11 | OC$_4$H$_8$C(O)OCH$_2$CH$_3$ | H | H | H | Cl | H | H | OC$_4$H$_8$C(O)OCH$_2$CH$_3$ |
| D12 | OC$_6$H$_4$C(O)OCH$_2$CH$_3$ | H | H | H | CH$_3$ | H | H | OC$_6$H$_4$C(O)OCH$_2$CH$_3$ |

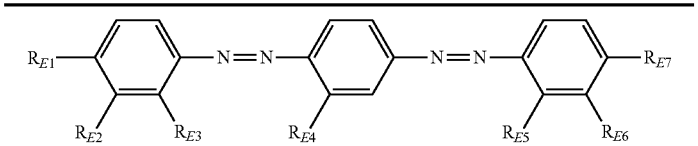

| No | $R_{E1}$ | $R_{E2}$ | $R_{E3}$ | $R_{E4}$ | $R_{E5}$ | $R_{E6}$ | $R_{E7}$ |
|----|----------|----------|----------|----------|----------|----------|----------|
| E1 | OC$_4$H$_8$C(O)OCH$_2$CH$_3$ | H | H | H | H | H | OC$_4$H$_8$C(O)OCH$_2$CH$_3$ |
| E2 | OC$_4$H$_8$C(O)OCH$_3$ | H | H | H | H | H | OC$_4$H$_8$C(O)OCH$_3$ |
| E3 | OC$_4$H$_8$C(O)OCH$_2$CH$_3$ | Cl | H | H | H | Cl | OC$_4$H$_8$C(O)OCH$_2$CH$_3$ |
| E4 | OC$_4$H$_8$C(O)OCH$_2$CH$_3$ | H | H | H | H | Cl | OC$_5$H$_{11}$ |

-continued

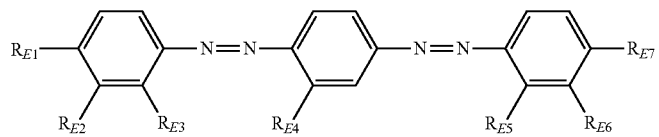

| No | $R_{E1}$ | $R_{E2}$ | $R_{E3}$ | $R_{E4}$ | $R_{E5}$ | $R_{E6}$ | $R_{E7}$ |
|---|---|---|---|---|---|---|---|
| E5 | $OC_4H_8C(O)OCH_2CH_3$ | H | H | $CH_3$ | H | H | $OCH_2CH_3$ |
| E6 | $OC_3H_6C(O)OCH_2CH_3$ | H | H | H | H | H | $OC_3H_6C(O)OCH_2CH_3$ |
| E7 | $OC_9H_{18}C(O)OCH_2CH_3$ | H | H | H | H | H | $OC_9H_{18}C(O)OCH_2CH_3$ |
| E8 | $OC_4H_8C(O)OCH_2CH=CH_2$ | H | H | H | H | H | $OC_4H_8C(O)OCH_2CH=CH_2$ |

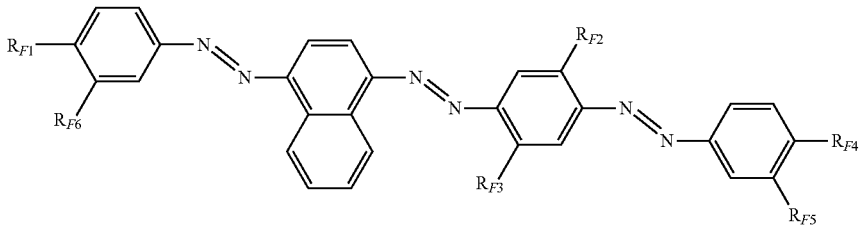

| No | $R_{F1}$ | $R_{F2}$ | $R_{F3}$ | $R_{F4}$ | $R_{F5}$ | $R_{F6}$ |
|---|---|---|---|---|---|---|
| F1 | $OC_4H_8C(O)OCH_2CH_3$ | H | H | $OC_4H_8C(O)OCH_2CH_3$ | H | H |
| F2 | $OC_4H_8C(O)OCH_3$ | H | $CH_3$ | $OC_4H_8C(O)OCH_3$ | H | H |
| F3 | $OC_3H_6C(O)OCH_2CH_3$ | H | H | $OC_3H_6C(O)OCH_2CH_3$ | H | Cl |

A content of the organic dichroic coloring agent is preferably 5 to 40 parts by mass, more preferably 15 to 30 parts by mass, still more preferably 18 to 28 parts by mass, and particularly preferably 20 to 26 parts by mass with respect to 100 parts by mass of the content of the liquid crystalline compound in the light absorption anisotropic layer.

A content of the organic dichroic coloring agent per 1 cm$^3$ of the light absorption anisotropic layer is preferably 35 to 300 mg/cm$^3$, more preferably 45 to 300 mg/cm$^3$, still more preferably 50 to 300 mg/cm$^3$, and particularly preferably 100 to 250 mg/cm.

In a case where the content of the organic dichroic coloring agent is within the above-described range, a light absorption anisotropic layer having a high alignment degree can be obtained even in a case where the light absorption anisotropic layer is formed into a thin film. Therefore, a light absorption anisotropic layer having excellent flexibility is likely to be obtained.

In addition, in a case where the content of the organic dichroic coloring agent is within the above-described range (in particular, the content of the organic dichroic coloring agent is 18 to 28 parts by mass with respect to 100 parts by mass of the liquid crystalline compound in the light absorption anisotropic layer), a light absorption anisotropic layer satisfying the expressions (1) to (3) is easily obtained.

A content of the first dichroic azo coloring agent compound is preferably 40 to 90 parts by mass and more preferably 45 to 75 parts by mass with respect to the total mass (100 parts by mass) of the organic dichroic coloring agent in the light absorption anisotropic layer.

A content of the second dichroic azo coloring agent compound is preferably 6 to 50 parts by mass and more preferably 8 to 35 parts by mass with respect to the total mass (100 parts by mass) of the organic dichroic coloring agent in the light absorption anisotropic layer.

A content of the third dichroic azo coloring agent compound is preferably 3 to 35 parts by mass and more preferably 5 to 35 parts by mass with respect to the total mass (100 parts by mass) of the organic dichroic coloring agent in the light absorption anisotropic layer.

A content ratio between the first dichroic azo coloring agent compound, the second dichroic azo coloring agent compound, and the third dichroic azo coloring agent compound used as necessary can be optionally set in order to adjust the tint of the light absorption anisotropic layer. However, the content ratio of the second dichroic azo coloring agent compound to the first dichroic azo coloring agent compound (second dichroic azo coloring agent compound/first dichroic azo coloring agent compound) is preferably 0.1 to 10, more preferably 0.1 to 2, and still more preferably 0.1 to 0.5 in terms of moles. In a case where the content ratio of the second dichroic azo coloring agent compound to the first dichroic azo coloring agent compound is within the above-described range, the alignment degree is increased.

The light absorption anisotropic layer according to the embodiment of the present invention can be produced, for example, by using a composition for forming a light absorption anisotropic layer, which contains the liquid crystalline compound and the organic dichroic coloring agent described above.

The composition for forming a light absorption anisotropic layer may contain a component other than the liquid crystalline compound and the organic dichroic coloring agent, and examples thereof include a solvent, a vertical alignment agent, an interface improver, a polymerizable component, and a polymerization initiator (such as a radical polymerization initiator). In this case, the light absorption anisotropic layer according to the embodiment of the present invention contains a solid component other than a liquid component (such as a solvent).

<Polymerization Initiator>

It is preferable that the liquid crystal composition contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A(JP-S60-105667A) and U.S. Pat. No. 4,239,850A), oxadiazole compounds (U.S. Pat. No. 4,212,970A), o-acyloxime compounds ([0065] of JP2016-27384A), and acylphosphine oxide compounds (JP1988-40799B (JP-S63-40799B), JP1993-29234B (JP-H5-29234B), JP1998-95788A (JP-H10-95788A), and JP1998-29997A (JP-H10-29997A)).

Commercially available products can also be used as such a photopolymerization initiator, and examples thereof include IRGACURE 184, IRGACURE 907, IRGACURE 369, IRGACURE 651, IRGACURE 819, IRGACURE OXE-01, and IRGACURE OXE-02, manufactured by BASF SE.

In a case where the liquid crystal composition contains a polymerization initiator, a content of the polymerization initiator is preferably 0.01 to 30 parts by mass and more preferably 0.1 to 15 parts by mass with respect to a total of 100 parts by mass of the above-described dichroic substance and the above-described liquid crystalline compound in the liquid crystal composition. The durability of the light absorption anisotropic layer is enhanced in a case where the content of the polymerization initiator is 0.01 parts by mass or more, and the alignment degree of the light absorption anisotropic layer is improved in a case where the content thereof is 30 parts by mass or less.

The polymerization initiator may be used alone or in combination of two or more kinds thereof. In a case of containing two or more kinds of polymerization initiators, it is preferable that the total amount thereof is within the above-described range.

<Surfactant>

It is preferable that the liquid crystal composition contains a surfactant.

In a case where the liquid crystal composition contains a surfactant, smoothness of a coated surface is improved, the alignment degree is further improved, and cissing and unevenness are suppressed so that in-plane uniformity is expected to be improved.

As the surfactant, a surfactant which allows the dichroic substance and the liquid crystalline compound to be horizontally aligned on the coated surface side is preferable, and examples thereof include compounds described in paragraphs [0155] to [0170] of WO2016/009648A and compounds (horizontal alignment agents) described in paragraphs [0253] to [0293] of JP2011-237513A.

The surfactant contained in the liquid crystal composition of the present invention may be a fluorine-containing polymer having a repeating structure B1 represented by Formula (B-1) and a repeating structure B2 having a fluorine atom.

(Repeating Structure B1)

The repeating structure B1 of the above-described fluorine-containing polymer is a repeating structure represented by Formula (B-1).

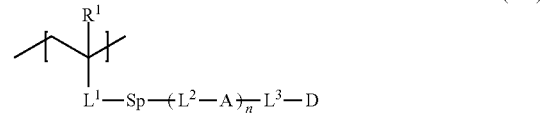

In Formula (B-1), $R^1$ represents a hydrogen atom, an alkyl group having 1 to 5 carbon atoms, or a halogen atom.

In addition, $L^1$ represents a single bond or —CO—.

In addition, Sp represents a linear or branched divalent hydrocarbon group having 1 to 20 carbon atoms. Here, one —CH$_2$— or two or more —CH$_2$—'s which are not adjacent to each other among —CH$_2$—'s constituting a part of the hydrocarbon group may be each independently substituted with —O—, —S—, —NH—, or —N(Q)-, and Q represents a substituent.

$L^2$ and $L^3$ each independently represent a single bond or a divalent linking group.

$R^1$ in Formula (B-1) is preferably a hydrogen atom or an alkyl group having 1 to 5 carbon atoms, and more preferably a hydrogen atom or a methyl group.

$L^1$ in Formula (B-1) is preferably —CO—.

Examples of the linear or branched divalent hydrocarbon group having 1 to 20 carbon atoms, represented by Sp in Formula (B-1), include a linear or branched divalent aliphatic hydrocarbon group having 1 to 20 carbon atoms, a divalent alicyclic hydrocarbon group having 3 to 20 carbon atoms, a divalent aromatic hydrocarbon group having 6 to 20 carbon atoms, and a divalent aromatic heterocyclic group having 6 to 20 carbon atoms. Among these, a linear or branched divalent aliphatic hydrocarbon group having 1 to 20 carbon atoms is preferable.

Here, as the divalent aliphatic hydrocarbon group having 1 to 20 carbon atoms, an alkylene group having 1 to 15 carbon atoms is preferable and an alkylene group having 1 to 8 carbon atoms is more preferable, and specific suitable examples thereof include a methylene group, an ethylene group, a propylene group, a butylene group, a pentylene group, a hexylene group, a methylhexylene group, and a heptylene group.

As described above, one —CH$_2$— or two or more —CH$_2$—'s which are not adjacent to each other among —CH$_2$—'s constituting a part of the linear or branched divalent hydrocarbon group having 1 to 20 carbon atoms as Sp may be each independently substituted with —O—, —S—, —NH—, or —N(Q)-. Examples of the substituent represented by Q include the above-described substituent W, and an alkyl group, an alkoxy group, or a halogen atom is preferable.

Examples of the divalent linking group represented by one aspect of $L^2$ and $L^3$ in Formula (B-1) include —C(O)O—, —OC(O)—, —O—, —S—, —C(O)NR$^{L1}$—, —NR$^{L1}$C(O)—, —SO$_2$—, and —NR$^{L1}$R$^{L2}$—. In the formulae, $R^{L1}$ and $R^{L2}$ each independently represent a hydrogen atom or an alkyl group having 1 to 6 carbon atoms, which may have a substituent. Examples of the substituent which may be included in the alkyl group having 1 to 6 carbon atoms include the above-described substituent W, and an alkyl group, an alkoxy group, or a halogen atom is preferable.

In addition, in Formula (B-1), A represents a divalent linking group represented by any of Formulae (A-1) to (A-15). Here, * in Formulae (A-1) to (A-15) represents a bonding position to $L^2$ or $L^3$, and carbon atoms constituting ring structures in Formulae (A-1) to (A-15) may be substituted with a heteroatom or may have a substituent. Examples of the substituents which may be included in the carbon atoms constituting the ring structures include the above-described substituent W, and an alkyl group, an alkoxy group, or a halogen atom is preferable.

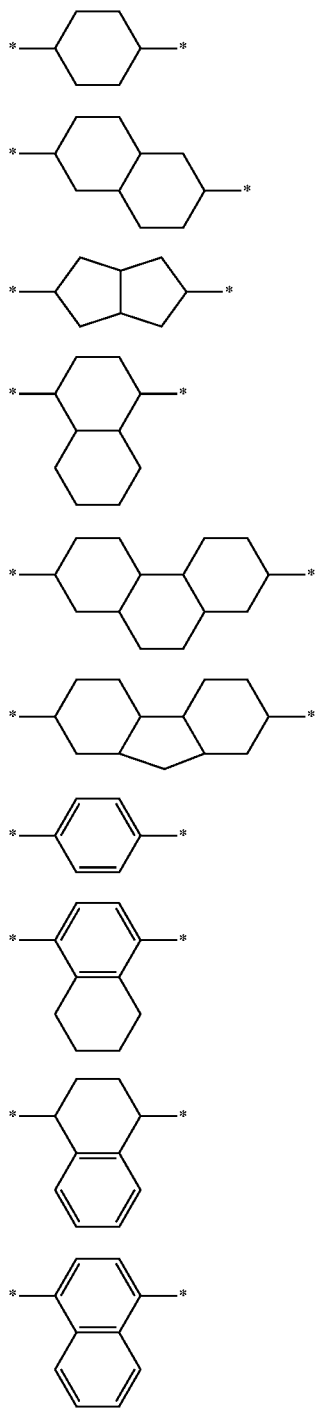

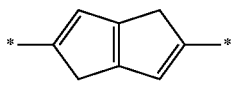

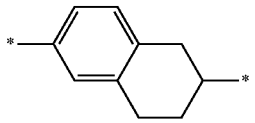

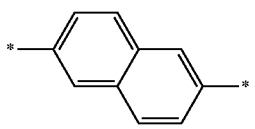

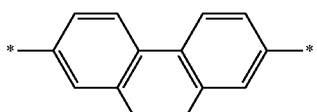

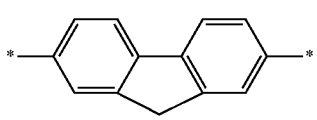

Specific examples of the divalent linking group represented by any of Formulae (A-1) to (A-15) include a 1,4-phenylene group, a 1,4-cyclohexylene group, a 1,4-cyclohexenyl group, a tetrahydropyran-2,5-diyl group, a 1,4-piperazine group, a 1,4-piperidine group, a 1,3-dioxane-2,5-diyl group, a tetrahydrothiopyran-2,5-diyl group, a 1,4-bicyclo(2,2,2)octylene group, a decahydronaphthalene-2,6-diyl group, a pyridine-2,5-diyl group, a pyrimidine-2,5-diyl group, a pyrazine-2,5-diyl group, a 1,2,3,4-tetrahydronaphthalene-2,6-diyl group, a 2,6-naphthylene group, a phenanthrene-2,7-diyl group, a 9,10-dihydrophenanthrene-2,7-diyl group, a 1,2,3,4,4a,9,10a-octahydrophenanthrene-2,7-diyl group, a 9-fluorenone-2,7-diyl group, a fluorene-2,7-diyl group, a thienothiophene-3,6-diyl group, a carbazole-3,6-diyl group, and a carbazole-2,7-diyl group.

From the viewpoint of further increasing the alignment degree of the light absorption anisotropic layer to be formed, A in Formula (B-1) is preferably a divalent linking group represented by any of Formula (A-1), (A-4), (A-7), (A-10), or (A-13), and more preferably a divalent linking group represented by any of Formula (A-7) or (A-13).

In addition, in Formula (B-1), D represents a hydrogen bonding group composed of a hydrogen atom and a non-metal atom of Groups 14 to 16. However, the non-metal atom may have a substituent.

Here, examples of the non-metal atom of Groups 14 to 16 include an oxygen atom, a sulfur atom, a nitrogen atom, and a carbon atom.

In addition, examples of the substituent which may be included in the non-metal atom (particularly, a nitrogen atom and a carbon atom) include a halogen atom, an alkyl group, an alkoxy group, an alkyl-substituted alkoxy group, a cyclic alkyl group, an aryl group (such as a phenyl group or a naphthyl group), a cyano group, an amino group, a nitro group, an alkylcarbonyl group, a sulfo group, and a hydroxyl group.

Examples of such a hydrogen bonding group include a hydrogen bond-donating group and a hydrogen bond-accepting group.

Specific examples of the hydrogen bond-donating group include an amino group, an amide group, a urea group, a urethane group, a sulfonylamino group, a sulfo group, a phospho group, a hydroxy group, a mercapto group, a carboxyl group, a methylene group substituted with an electron withdrawing group, and a methine group substituted with an electron withdrawing group. Among these, a carboxyl group or an amide group is preferable.

Specific examples of the hydrogen bond-accepting group include a heteroatom having an unshared electron pair on a heterocycle, a hydroxy group, an aldehyde, a ketone, a carboxyl group, carboxylic acid ester, carboxylic acid amide, a lactone, a lactam, sulfonic acid amide, a sulfo group, a phospho group, phosphoric acid amide, urethane, urea, an ether structure (particularly, a polymer structure having an oxygen atom contained in a polyether structure), an aliphatic amine, and an aromatic amine. Among these, a carboxyl group or an amide group is preferable.

(Repeating Structure B2)

The repeating structure B2 of the above-described fluorine-containing polymer is a repeating structure having a fluorine atom.

In the present invention, from the viewpoint of further increasing the alignment degree of the light absorption anisotropic layer to be formed, a content of the repeating structure B2 is preferably 15% to 90% by mass, more preferably 20% to 80% by mass, and still more preferably 30% to 70% by mass with respect to the total mass of the surfactant.

The surfactant may have only one or two or more kinds of repeating structures B2. In a case where the surfactant has two or more kinds of repeating structures B2, the above-described content of the repeating structure B2 indicates the total content of the repeating structures B2.

(Repeating Structure B3)

In the present invention, from the reason that upper layer coating properties with respect to the light absorption anisotropic layer to be formed is favorable, it is preferable that the above-described fluorine-containing polymer further has a repeating structure B3 derived from a monomer having a molecular weight of 300 or less, in addition to the repeating structures B1 and B2 described above.

From the reason that the upper layer coating properties with respect to the light absorption anisotropic layer to be formed is more favorable, the repeating structure B3 is preferably a repeating structure represented by Formula (N—1). It is preferable that the repeating structure B3 has a structure different from the above-described repeating structure B2 and does not have a fluorine atom.

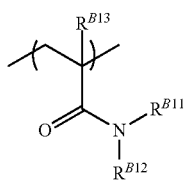

(N-1)

In Formula (N-1), $R^{B11}$ and $R^{B12}$ each independently represent a hydrogen atom or a substituent. However, in a case where $R^{B11}$ and $R^{B12}$ are a substituent, $R^{B11}$ and $R^{B12}$ may be linked to each other to form a ring.

The total molecular weight of $R^{B11}$ and $R^{B12}$ is preferably 200 or less, more preferably 100 or less, and still more preferably 70 or less. In a case where the above-described total molecular weight thereof is 100 or less, interaction between the repeating structures B3 is further improved, and compatibility between the surfactant and the liquid crystal molecule can be further decreased. As a result, a light absorption anisotropic layer having fewer alignment defects and an excellent alignment degree is obtained.

The lower limit of the total molecular weight of $R^{B11}$ and $R^{B12}$ is preferably 2 or more.

As the substituent represented by $R^{B11}$ and $R^{B12}$, from the viewpoint that the effect of the present invention is more excellent, an organic group is preferable, an organic group having 1 to 15 carbon atoms is more preferable, an organic group having 1 to 12 carbon atoms is still more preferable, and an organic group having 1 to 8 carbon atoms is particularly preferable. Examples of the above-described organic group include a linear, branched, or cyclic alkyl group, an aromatic hydrocarbon group, and a heterocyclic group.

The number of carbon atoms in the alkyl group is preferably 1 to 15, more preferably 1 to 12, and still more preferably 1 to 8.

The carbon atom in the alkyl group may be substituted with —O—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —C(S)—, —S(O)—, —SO$_2$—, —(O)S(O)O—, —O(O)S(O)O—, —SC(O)—, —C(O)S—, and a group obtained by combining two or more of these groups. Among the groups with which the carbon atom in the alkyl group may be substituted, from the viewpoint that the effect of the present invention is more excellent, —O—, —C(O)—, —N(Z)—, —OC(O)—, or —C(O)O— is preferable.

The hydrogen atom in the alkyl group may be substituted with a halogen atom, a cyano group, an aryl group, a nitro group, —OZ$^H$, —C(O)Z$^H$— C(O)OZ$^H$, —OC(O)Z$^H$, —OC(O)OZ$^H$, —NZ$^H$Z$^{H'}$, —NZ$^H$C(O)Z$^{H'}$, —NZ$^H$C(O)OZ$^{H'}$, —C(O)NZ$^H$Z$^{H'}$, —OC(O)NZ$^H$Z$^{H'}$, —NZ$^H$C(O)NZ$^{H'}$OZ$^{H''}$, —S$^Z$H, —C(S)Z$^H$, —C(O)S$^Z$H, or —SC(O)Z$^H$. Z$^H$, Z$^{H'}$, and Z$^{H''}$ each independently represent a hydrogen atom, a halogen atom, an alkyl group having 1 to 10 carbon atoms, a cyano group, or a nitro group. Among the groups with which the hydrogen atom in the alkyl group may be substituted, from the viewpoint that the effect of the present invention is more excellent, —OH, —COOH, or an aryl group (preferably, a phenyl group) is preferable.

The hydrogen atom in the aromatic hydrocarbon group and the hydrogen atom in the heterocyclic group may be substituted with a halogen atom, a cyano group, an alkyl group having 1 to 10 carbon atoms, a nitro group, —OZ$^H$, —C(O)Z$^H$— —C(O)OZ$^H$, —OC(O)Z$^H$, —OC(O)OZ$^H$— NZ$^H$Z$^{H'}$, —NZ$^H$C(O)Z$^{H'}$, —NZ$^H$C(O)OZ$^{H'}$, —C(O)NZ$^H$Z$^{H'}$, —OC(O)NZ$^H$Z$^{H'}$, —NZ$^H$C(O)NZ$^{H'}$OZ$^{H''}$, —S$^Z$H, —C(S)Z$^H$, —C(O)S$^Z$H, —SC(O)Z$^H$, or —B(OH)$_2$. Z$^H$, Z$^{H'}$, and Z$^{H''}$ each independently represent a hydrogen atom, a halogen atom, an alkyl group having 1 to 10 carbon atoms, a cyano group, or a nitro group. Among the groups with which the hydrogen atom in the aromatic hydrocarbon group and the hydrogen atom in the heterocyclic group may be substituted, —OH or —B(OH)$_2$ is preferable from the viewpoint that the effect of the present invention is more excellent.

From the viewpoint that the effect of the present invention is more excellent, it is preferable that $R^{B11}$ and $R^{B12}$ each independently represent a hydrogen atom or an organic group having 1 to 15 carbon atoms. Suitable aspects of the organic group are as described above. From the viewpoint that the effect of the present invention is more excellent, at least one of $R^{B11}$ or $R^{B12}$ is preferably a substituent and more preferably an organic group having 1 to 15 carbon atoms.

The ring formed by linking $R^{B11}$ and $R^{B12}$ to each other is a heterocyclic ring having a nitrogen atom in Formula (N-1), and may further have a heteroatom such as an oxygen atom, a sulfur atom, and a nitrogen atom in the ring.

From the viewpoint that the effect of the present invention is more excellent, the ring formed by linking $R^{B11}$ and $R^{B12}$ linked to each other is preferably a 4- to 8-membered ring, more preferably a 5- to 7-membered ring, and still more preferably a 5- or 6-membered ring.

From the viewpoint that the effect of the present invention is more excellent, the number of carbon atoms constituting the ring formed by linking $R^{B11}$ and $R^{B12}$ to each other is preferably 3 to 7 and more preferably 3 to 6.

The ring formed by linking $R^{B11}$ and $R^{B12}$ to each other may or may not have aromaticity, but it is preferable that the ring does not have aromaticity from the viewpoint that the effect of the present invention is more excellent.

Specific examples of the ring formed by linking $R^{B11}$ and $R^{B12}$ to each other include the following groups.

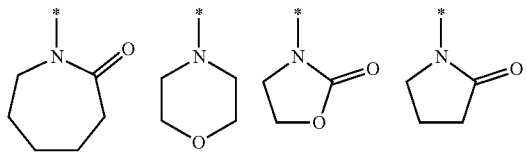

$R^{B13}$ represents a hydrogen atom, an alkyl group having 1 to 5 carbon atoms, a halogen atom, or a cyano group, preferably a hydrogen atom or an alkyl group having 1 to 5 carbon atoms and more preferably a hydrogen atom.

The number of carbon atoms in the above-described alkyl group is 1 to 5, preferably 1 to 3 and more preferably 1. The alkyl group may have a linear, branched, or cyclic structure.

Specific examples of the repeating structure B3 are shown below, but the repeating structure B3 is not limited to the following structures.

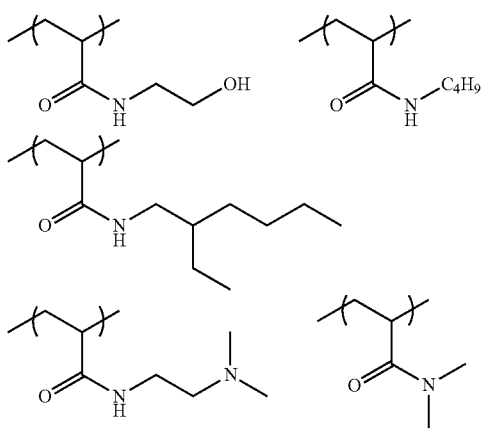

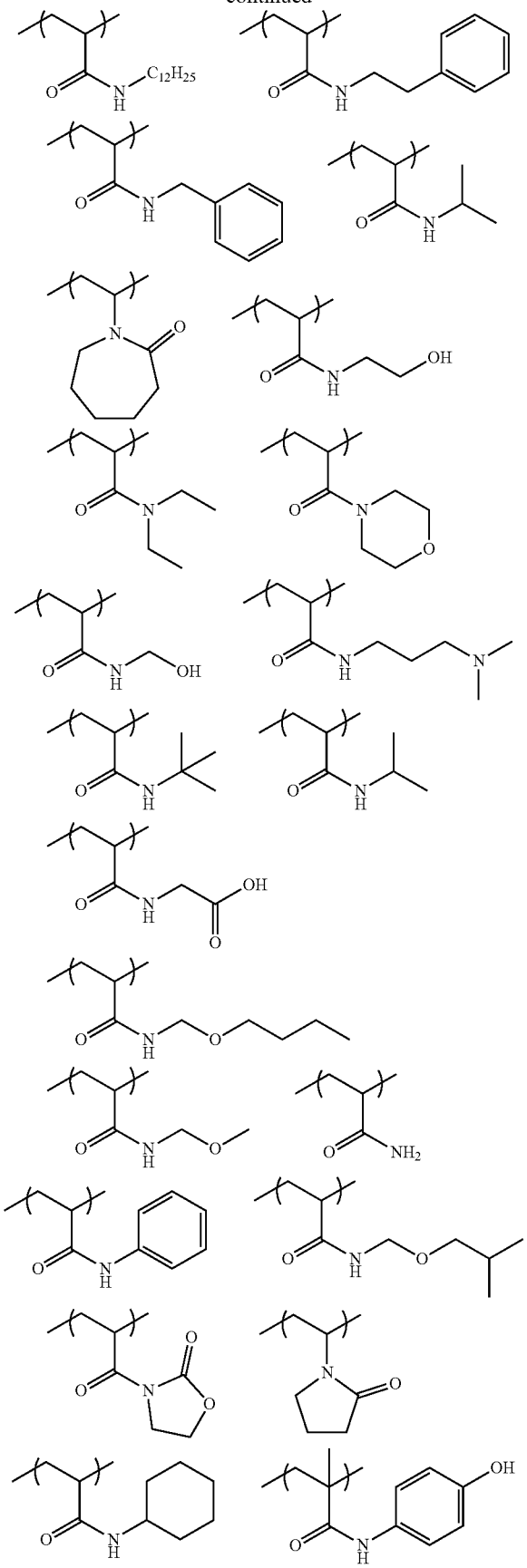

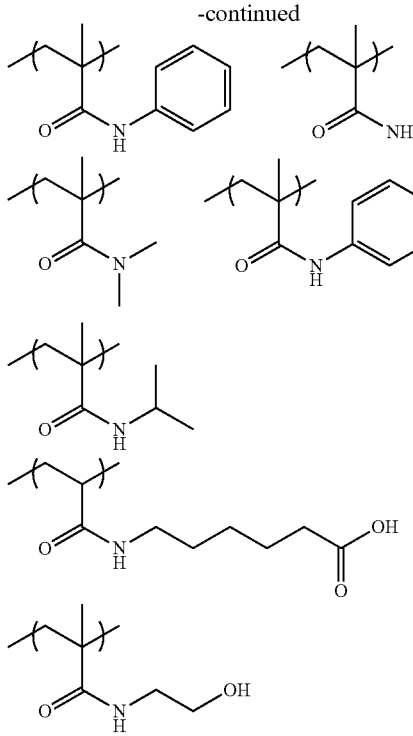

A content of the repeating structure B3 is preferably 300 to 7500 by mass, more preferably 15% to 70% by mass, and still more preferably 20% to 65% by mass with respect to the total mass of all repeating structures of the fluorine-containing polymer. In a case where the content of the repeating structure B3 is within the above-described range, the effect of the present invention is more excellent.

The surfactant may have only one or two or more kinds of repeating structures B3. In a case where the surfactant has two or more kinds of repeating structures B3, the above-described content of the repeating structure B3 indicates the total content of the repeating structures B3.

(Other Repeating Structures (No. 1))

The above-described fluorine-containing polymer may further have a repeating structure represented by General Formula (M-3).

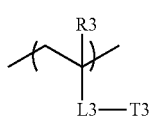
(M-3)

In Formula (M-3. R3 represents a hydrogen atom, a fluorine atom, a chlorine atom, or an alkyl group having 1 to 20 carbon atoms, L3 represents a single bond or a divalent linking group, and T3 represents an aromatic ring.

Examples of the linking group as L3 include the same groups as those for SP21 in Formula (F-2) described above.

Examples of the aromatic ring group as T3 include an aromatic hydrocarbon ring group such as a benzene ring group, a naphthalene ring group, an anthracene ring group, and a phenanthroline ring group; and an aromatic heterocyclic group such as a furan ring group, a pyrrole ring group, a thiophene ring group, a pyridine ring group, a thiazole ring group, and a benzothiazole ring group. Among these, a benzene ring group (for example, a 1,4-phenyl group) is preferable. The compatibility can be improved by allowing the polymer to include these groups.

Specific examples of a monomer forming the above-described repeating structure represented by Formula (M-3) include structures represented by Formulae (M3-1) to (M3-5), but the present invention is not limited thereto.

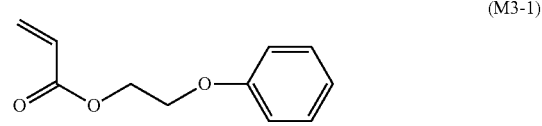
(M3-1)

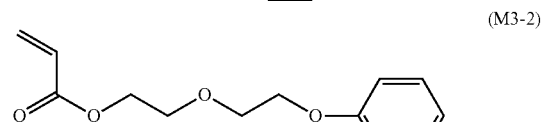
(M3-2)

(M3-3)

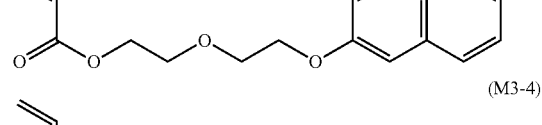
(M3-4)

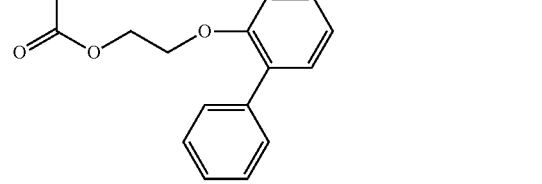
(M3-5)

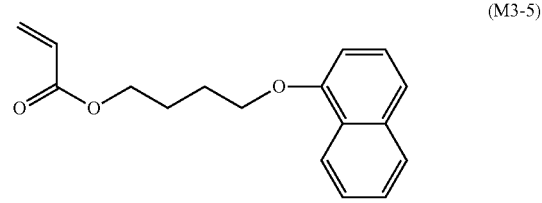

(Other Repeating Structures (No. 2))

The above-described fluorine-containing polymer may further have a repeating structure represented by General Formula (M-4).

(M-4)

In Formula (M-4), R4 represents a hydrogen atom, a fluorine atom, a chlorine atom, or an alkyl group having 1 to 20 carbon atoms, L4 represents a single bond or a divalent linking group, and Q4 represents a crosslinkable group represented by any of Formulae (P1) to (P30) described above.

Examples of the linking group as L4 include the same groups as those for SPW in Formula (W1) described, such as an aromatic hydrocarbon group having 4 to 20 carbon atoms, a cyclic alkylene group having 4 to 20 carbon atoms, and a heterocyclic group having 1 to 20 carbon atoms.

Among these, a linear, branched, or cyclic alkylene group having 1 to 20 carbon atoms, or an aromatic hydrocarbon group having 4 to 20 carbon atoms is preferable, and it is preferable that the linking group has —O—, —CO—O—, —CO—NH—, or —O—CO—.

In a case where Q4 represents a group including a cationically polymerizable group, the cationically polymerizable group is not particularly limited, and examples thereof include an alicyclic ether group, a cyclic acetal group, a cyclic lactone group, a cyclic thioether group, a spiroorthoester group, and a vinyloxy group.

As the cationically polymerizable group, an alicyclic ether group or a vinyloxy group is preferable, an epoxy group, an oxetanyl group, or a vinyloxy group is more preferable, an epoxy group or an oxetanyl group is still more preferable, and an epoxy group is particularly preferable. An alicyclic epoxy group is particularly preferable as the epoxy group. Each group mentioned above may have a substituent.

In a case where Q4 represents a group including a radically polymerizable group, the radically polymerizable group is not particularly limited, examples thereof include a group having a polymerizable carbon-carbon double bond, and specific examples thereof include a (meth)acryloyl group, a (meth)acryloyloxy group, a (meth)acrylamide group, a vinyl group, a styryl group, and an allyl group. Among these, a (meth)acryloyloxy group is preferable. Each group mentioned above may have a substituent. By including these groups, for example, it is possible to improve adhesiveness between layers in a case where a plurality of liquid crystal composition layers are laminated in a liquid crystal film, which will be described later.

Specific examples of a monomer forming the repeating structure represented by Formula (M-4) described above include monomers represented by Formulae (M4-1) to (M4-17), but the present invention is not limited thereto.

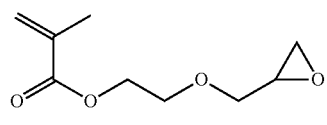
(M4-1)

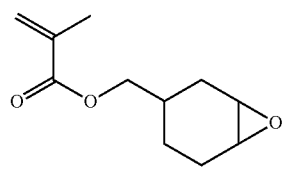
(M4-2)

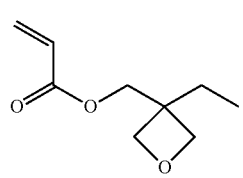
(M4-3)

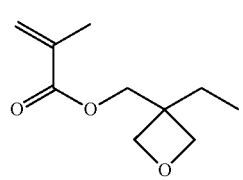
(M4-4)

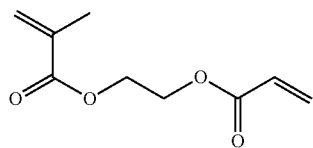
(M4-5)

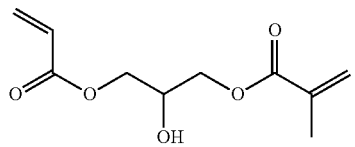
(M4-6)

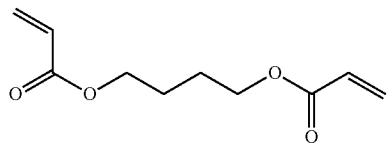
(M4-7)

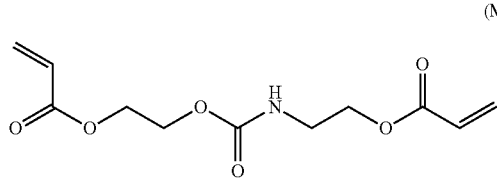
(M4-8)

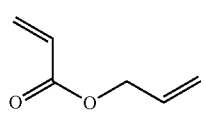
(M4-9)

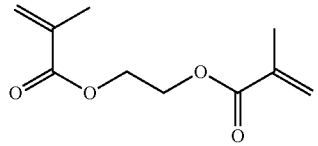
(M4-10)

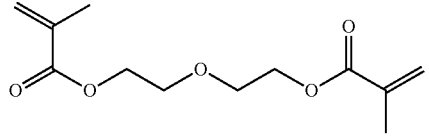
(M4-11)

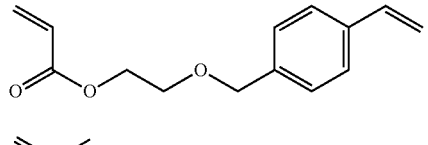
(M4-12)

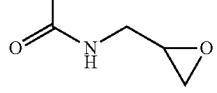
(M4-13)

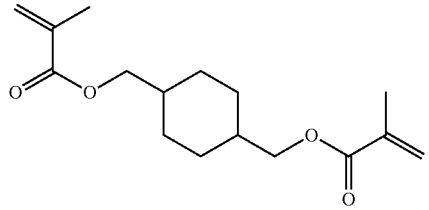
(M4-14)

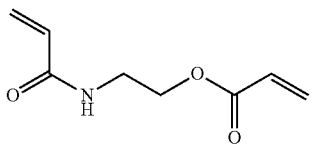
(M4-15)

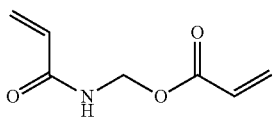
(M4-16)

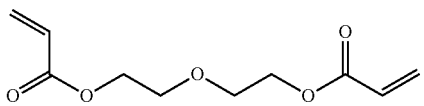
(M4-17)

The above-described fluorine-containing polymer may be a polymer having a block structure, a graft structure, a branch structure, or a star structure. It is preferable that the fluorine-containing polymer has a block structure, a graft structure, a branched structure, or a star structure from the viewpoint that a group of fluorine atoms is present as an aggregate and transferability of the polymer to a surface of a coating film is improved.

In addition, in a copolymer having a random structure with a fluorine-substituted alkyl chain length of 1 to 4, the aggregate of the group of fluorine atoms is small and solubility in a general-purpose solvent is excellent, but the transferability to the surface of the coating film is degraded. On the other hand, since the aggregate of the group of fluorine atoms is present in the above-described polymer, the transferability of the polymer to the surface of the coating film is high even in a case where the fluorine-substituted alkyl chain length is 1 to 4, and thus it is preferable that such a copolymer is added to the composition from the viewpoint of reducing surface tension of the coating film, and improving wettability (homogeneous coating property) of the composition to a base material during coating and a surface state of the coating film surface.

In the present invention, in a case where the liquid crystal composition contains the surfactant, from the viewpoint of improving display performance and durability of a display device, a difference between a log P value of the surfactant and a log P value of the above-described liquid crystalline compound is preferably less than 3.1, more preferably less than 1.4, and still more preferably 0 or more and less than 1.4.

Here, in a case where a plurality of surfactants or a plurality of liquid crystalline compounds are used, the difference (absolute value) between the log P value of the surfactant and the log P value of the liquid crystalline compound denotes the minimum difference from among differences calculated from the log P values of the respective compounds.

In the present invention, the liquid crystal composition may contain two or more kinds of surfactants. It is preferable that the liquid crystal composition contains a surfactant in which the difference in the log P value with the liquid crystalline compound is less than 1.4 from the viewpoint of improving the display performance and the durability of the display device, and it is preferable that the liquid crystal composition further contains a surfactant in which the difference in the log P value with the liquid crystalline compound is 1.4 or more from the viewpoint of improving the smoothness of the coating film surface, improving the alignment degree, suppressing cissing and unevenness, and improving the in-plane uniformity.

In a case where the liquid crystal composition contains a surfactant, a content of the surfactant is preferably 0.001 to 5 parts by mass and more preferably 0.01 to 3 parts by mass with respect to a total of 100 parts by mass of the above-described dichroic substance and the above-described liquid crystalline compound in the liquid crystal composition. The surfactant may be used alone or in combination of two or more kinds thereof. In a case of containing two or more kinds of surfactants, it is preferable that the total amount thereof is within the above-described range.

<Adhesion Improver>

From the viewpoint of adhesiveness to a barrier layer described later, the liquid crystal composition may contain an adhesion improver. Examples of the adhesion improver include a compound including a hydroxyl group, a carboxyl group, or a boronic acid group, and a compound including a boronic acid group is preferable.

Suitable examples of the compound including a boronic acid group include a compound represented by the following formula.

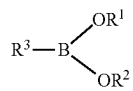

(in the formula, $R^1$ and $R^2$ each independently represent a hydrogen atom, a substituted or unsubstituted aliphatic hydrocarbon group, a substituted or unsubstituted aryl group, or a substituted or unsubstituted heterocyclic group, and $R^3$ represents a substituent including a functional group which can be bonded to a (meth)acryloyl group)

<Solvent>

From the viewpoint of workability and the like, it is preferable that the liquid crystal composition contains a solvent.

Examples of the solvent include organic solvents such as ketones (such as acetone, 2-butanone, methyl isobutyl ketone, cyclopentanone, and cyclohexanone), ethers (such as dioxane, tetrahydrofuran, 2-methyltetrahydrofuran, cyclopentyl methyl ether, tetrahydropyran, and dioxolane), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane, dichloroethane, dichlorobenzene, and chlorotoluene), esters (such as methyl acetate, ethyl acetate, butyl acetate, and ethyl lactate), alcohols (such as ethanol, isopropanol, butanol, cyclohexanol, isopentyl alcohol, neopentyl alcohol, diacetone alcohol, and benzyl alcohol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, and N-ethylpyrrolidone), and heterocyclic compounds (such as pyridine), and water. These solvents may be used alone or in combination of two or more kinds thereof.

Among these solvents, from the viewpoint of taking advantage of excellent solubility of the liquid crystal composition, ketones (particularly, cyclopentanone or cyclohexanone), ethers (particularly, tetrahydrofuran, cyclopentyl methyl ether, tetrahydropyran, or dioxolane), or amides (particularly, dimethylformamide, dimethylacetamide, N-methylpyrrolidone, or N-ethylpyrrolidone) are preferable.

In a case where the liquid crystal composition contains a solvent, a content of the solvent is preferably 80% to 99% by mass, more preferably 83% to 97% by mass, and particularly preferably 85% to 95% by mass with respect to the total mass of the liquid crystal composition.

The solvent may be used alone or in combination of two or more kinds thereof. In a case of containing two or more kinds of solvents, it is preferable that the total amount thereof is within the above-described range.

<Method of Forming Light Absorption Anisotropic Layer>

A method for forming the light absorption anisotropic layer using the above-described liquid crystal composition is not particularly limited, and examples thereof include a method including, in the following order, a step (hereinafter, also referred to as "coating film formation step") of applying the above-described liquid crystal composition onto a photoalignment layer (for example, a photoalignment layer described later) to form a coating film, and a step (hereinafter, also referred to as "alignment step") of aligning a liquid crystalline component contained in the coating film.

(Coating Film Formation Step)

The coating film formation step is a step of applying the liquid crystal composition onto a photoalignment layer to form a coating film.

The photoalignment layer is easily coated with the liquid crystal composition by using a liquid crystal composition containing the above-described solvent or using a liquid-like material such as a melt, which is obtained by heating the liquid crystal composition.

Specific examples of a method of applying the liquid crystal composition include known methods such as a roll coating method, a gravure printing method, a spin coating method, a wire bar coating method, an extrusion coating method, a direct gravure coating method, a reverse gravure coating method, a die coating method, a spraying method, and an ink jet method.

(Alignment Step)

The alignment step is a step of aligning a liquid crystalline component contained in the coating film. In this manner, the light absorption anisotropic layer is obtained.

In a case where the above-described dichroic substance has liquid crystallinity, the liquid crystalline component is a component which also includes the dichroic substance having liquid crystallinity in addition to the above-described liquid crystalline compound.

The alignment step may include a drying treatment. Components such as a solvent can be removed from the coating film by performing the drying treatment. The drying treatment may be performed by a method of allowing the coating film to stand at room temperature for a predetermined time (for example, natural drying) or a method of heating the coating film and/or blowing air to the coating film.

Here, the liquid crystalline component contained in the liquid crystal composition may be aligned by the coating film formation step or the drying treatment described above. For example, in an aspect in which the liquid crystal composition is prepared as a coating liquid containing a solvent, by drying the coating film and removing the solvent from the coating film, a coating film having a light absorption anisotropy (that is, the light absorption anisotropic layer) is obtained.

In a case where the drying treatment is performed at a temperature higher than or equal to a transition temperature of the liquid crystalline component contained in the coating film to the liquid crystal phase, a heat treatment described below may not be performed.

From the viewpoint of manufacturing suitability or the like, the transition temperature of the liquid crystalline component contained in the coating film to the liquid crystal phase is preferably 10° C. to 250° C. and more preferably 25° C. to 190° C. In a case where the above-described transition temperature is 10° C. or higher, a cooling treatment or the like for lowering the temperature to a temperature range in which the liquid crystal phase is exhibited is not necessary, which is preferable. In addition, in a case where the above-described transition temperature is 250° C. or lower, a high temperature is not required even in a case of setting an isotropic liquid state at a temperature higher than the temperature range in which the liquid crystal phase is temporarily exhibited, and waste of thermal energy and deformation and deterioration of a substrate can be reduced, which is preferable.

It is preferable that the alignment step includes a heat treatment. In this manner, since the liquid crystalline component contained in the coating film can be aligned, the coating film after being subjected to the heat treatment can be suitably used as the light absorption anisotropic layer.

From the viewpoint of the manufacturing suitability or the like, the heat treatment is performed at a temperature of preferably 10° C. to 250° C. and more preferably 25° C. to 190° C. In addition, the heating time is preferably 1 to 300 seconds and more preferably 1 to 60 seconds.

The alignment step may include a cooling treatment performed after the heat treatment. The cooling treatment is a treatment of cooling the heated coating film to room temperature (20° C. to 25° C.). In this manner, the alignment of the liquid crystalline component contained in the coating film can be fixed. A cooling unit is not particularly limited, and the cooling treatment can be performed according to a known method.

The light absorption anisotropic layer can be obtained by performing the above-described steps.

In the present embodiment, examples of a method of aligning the liquid crystalline component contained in the coating film include the drying treatment and the heat treatment, but the present invention is not limited thereto, and the liquid crystal component can be aligned by a known alignment treatment.

(Other Steps)

The method of forming the light absorption anisotropic layer may include a step of curing the light absorption anisotropic layer after the aligning step (hereinafter, also referred to as "curing step").

The curing step is performed by heating the light absorption anisotropic layer and/or irradiating the light absorption anisotropic layer with light (exposing the light absorption anisotropic layer to light), for example, in a case where the light absorption anisotropic layer has a crosslinkable group (polymerizable group). Among these, it is preferable that the curing step is performed by irradiating the light absorption anisotropic layer with light.

In addition, in a case where the photoalignment layer contains a compound having a radically polymerizable group with photoreactivity, an unreacted radically polymerizable group can be remained on the surface of the photoalignment layer by a method of not containing a radical polymerization initiator in the photoalignment layer, a method in which the exposure is performed in an environment with a high oxygen concentration, or the like. By reacting the unreacted radically polymerizable group existing on the surface of the photoalignment layer with the radically polymerizable group of the light absorption anisotropic layer in the "curing step", adhesiveness between the photoalignment layer and the light absorption anisotropic layer can be enhanced.

Various light sources such as infrared rays, visible light, and ultraviolet rays can be used as a light source for curing, but ultraviolet rays are preferable. In addition, ultraviolet rays may be applied while the layer is heated during curing, or ultraviolet rays may be applied through a filter which transmits only a specific wavelength.

In a case where the exposure is performed while the layer is heated, the heating temperature during the exposure depends on the transition temperature of the liquid crystalline component contained in the light absorption anisotropic layer to the liquid crystal phase, but it is preferably 25° C. to 140° C.

In addition, the exposure may be performed under a nitrogen atmosphere. In a case where the curing of the light absorption anisotropic layer proceeds by radical polymerization, since inhibition of polymerization by oxygen is reduced, it is preferable that the exposure is performed in a nitrogen atmosphere.

[Laminate]

The laminate according to the embodiment of the present invention includes the light absorption anisotropic layer according to the embodiment of the present invention (hereinafter, also referred to as "light absorption anisotropic layer A), and preferably further includes at least one of a light absorption anisotropic layer B different from the light absorption anisotropic layer A or an optically anisotropic layer.

In addition, the laminate according to the embodiment of the present invention may include at least one member selected from the group consisting of a base material, an alignment layer, a barrier layer, and a pressure sensitive adhesive layer.

Hereinafter, each layer constituting the laminate according to the embodiment of the present invention will be described.

[Base Material]

The base material can be selected depending on applications of the light absorption anisotropic layer, and examples thereof include glass and a polymer film. A light transmittance of the base material is preferably 80% or more.

In a case where a polymer film is used as the base material, it is preferable to use an optically isotropic polymer film. As specific examples and preferred aspects of the polymer, the description in paragraph [0013] of JP2002-22942A can be applied. In addition, even in a case of a polymer easily exhibiting birefringence, such as polycarbonate and polysulfone which has been known in the related art, a polymer with the exhibiting property which has been decreased by modifying the molecules, described in WO2000/26705A, can also be used.

Regarding the base material, from the viewpoint of thinning, it is also preferable to peel off the base material from a laminate as a final product.

[Alignment Film]

The alignment film may be any layer as long as the organic dichroic coloring agent contained in the liquid crystal composition can be in a desired alignment state on the alignment film.

Examples of a method for forming the alignment film include methods such as rubbing treatment of a film surface of an organic compound (preferably a polymer), oblique vapor deposition of an inorganic compound, formation of a layer having microgrooves, and accumulation of an organic compound (for example, ω-tricosanoic acid, dioctadecylmethylammonium chloride, or methyl stearate) by the Langmuir-Blodgett method (LB film). Furthermore, an alignment film in which an alignment function is generated by application of an electric field, application of a magnetic field, or irradiation with light has also been known.

Among these, in the present invention, an alignment film formed by performing a rubbing treatment is preferable from the viewpoint of easily controlling a pretilt angle of the alignment film, and a photo-alignment film formed by irradiation with light is also preferable from the viewpoint of the uniformity of alignment.

<Rubbing-Treated Alignment Film>

A polymer material used for the alignment film formed by performing a rubbing treatment is described in a plurality of documents, and a plurality of commercially available products can be used. In the present invention, polyvinyl alcohol or polyimide, or derivatives thereof are preferably used. The alignment film can refer to the description on page 43, line 24 to page 49, line 8 of WO2001/88574A1. A thickness of the alignment film is preferably 0.01 to 10 μm and more preferably 0.01 to 2 μm.

<Photo-Alignment Film>

A photo-alignment compound used for the alignment film formed by irradiation with light is described in a plurality of documents. In the present invention, preferred examples thereof include azo compounds described in JP2006-285197A, JP2007-076839A, JP2007-138138A, JP2007-94071A, JP2007-121721A, JP2007-140465A, JP2007-156439A, JP2007-133184A, JP2009-109831A, JP3883848B, and JP4151746B; aromatic ester compounds described in JP2002-229039A; maleimide and/or alkenyl-substituted nadimide compounds having a photo-alignment unit, described in JP2002-265541A and JP2002-317013A; photo-crosslinkable silane derivatives described in JP4205195B and JP4205198B; and photo-crosslinkable polyimides, polyamides, or esters described in JP2003-520878A, JP2004-529220A, and JP4162850B. Azo compounds, photo-crosslinkable polyimides, polyamides, or esters are more preferable.

Among these, a photosensitive compound having a photoreactive group, which undergoes at least one of dimerization or isomerization by action of light is preferably used as the photo-alignment compound.

In addition, examples of the photoreactive group include a group having a cinnamic acid (cinnamoyl) structure (skeleton), a group having a coumarin structure (skeleton), a group having a chalcone structure (skeleton), a group having a benzophenone structure (skeleton), and a group having an anthracene structure (skeleton). Among these groups, a group having a cinnamoyl structure or a group having a coumarin structure is preferable, and a group having a cinnamoyl structure is more preferable.

In addition, the photosensitive compound having the above-described photoreactive group may further have a crosslinkable group.

As the crosslinkable group, a thermally crosslinking group which causes a curing reaction due to action of heat or a photo-crosslinkable group which causes a curing reaction due to action of light is preferable, and the crosslinkable group may be a crosslinkable group which has both the thermally crosslinking group and the photo-crosslinkable group. For specific compounds, the description of WO2019-131943A can be referred to.

Examples of the above-described crosslinkable group include at least one selected from the group consisting of an epoxy group, an oxetanyl group, a group represented by —NH—CH$_2$—O—R (R represents a hydrogen atom or an alkyl group having 1 to 20 carbon atoms), a group having an ethylenically unsaturated double bond, and a blocked isocyanate group. Among these, an epoxy group, an oxetanyl group, or a group having an ethylenically unsaturated double bond is preferable.

A 3-membered cyclic ether group is also referred to as the epoxy group, and a 4-membered cyclic ether group is also referred to as the oxetanyl group.

In addition, specific examples of the group having an ethylenically unsaturated double bond include a vinyl group, an allyl group, a styryl group, an acryloyl group, and a methacryloyl group, and an acryloyl group or a methacryloyl group is preferable.

The photo-alignment film formed of the above-described material is irradiated with linearly polarized light or non-polarized light to produce a photo-alignment film.

In the present specification, the "irradiation with linearly polarized light" and the "irradiation with non-polarized light" are operations for causing a photo-reaction in the photo-alignment material. A wavelength of the light to be used varies depending on the photo-alignment material to be used, and is not particularly limited as long as the wavelength is required for the photo-reaction. A peak wavelength of the light to be used for irradiation with light is preferably 200 nm to 700 nm, and ultraviolet light having a peak wavelength of 400 nm or less is more preferable.

Examples of a light source used for the light irradiation include commonly used light sources, for example, lamps such as a tungsten lamp, a halogen lamp, a xenon lamp, a xenon flash lamp, a mercury lamp, a mercury xenon lamp, or a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As a method of obtaining the linearly polarized light, a method of using a polarizing plate (for example, iodine polarizing plate, dichroic coloring agent polarizing plate, and wire grid polarizing plate), a method of using a prismatic element (for example, Glan-Thomson prism) or a reflective type polarizer using Brewster's angle, or a method of using light emitted from a polarized laser light source can be adopted. In addition, by using a filter, a wavelength conversion element, or the like, only light having a required wavelength may be radiated selectively.

In a case where light to be applied is the linearly polarized light, a method of applying light vertically or obliquely to the upper surface of the alignment film or the surface of the alignment film from the rear surface is employed. An incidence angle of light varies depending on the photo-alignment material, but is preferably 0° to 90° (vertical) and more preferably 40° to 90°.

In a case where the light to be applied is the non-polarized light, the alignment film is irradiated with the non-polarized light obliquely. An incidence angle is preferably 10° to 80°, more preferably 20° to 60°, and particularly preferably 300 to 50°.

The irradiation time is preferably 1 minute to 60 minutes and more preferably 1 minute to 10 minutes.

In a case where patterning is required, a method of performing irradiation with light using a photomask as many times as necessary for pattern preparation or a method of writing a pattern by laser light scanning can be employed.

The alignment layer can be peeled off from the viewpoint of thinning, but from the viewpoint of durability, it is also preferable to make a final product left in the laminate as it is.

[Optically Anisotropic Layer]

The laminate according to the embodiment of the present invention preferably includes an optically anisotropic layer.

Here, the optically anisotropic layer denotes all films showing a retardation, and examples thereof include a stretched polymer film and a retardation film provided with an optically anisotropic layer having a liquid crystalline compound aligned on a support.

Here, the alignment direction of the liquid crystalline compound contained in the optically anisotropic layer is not particularly limited, and examples thereof include horizontal alignment, vertical alignment, and twisted alignment with respect to the film surface.

In addition, a λ/4 plate, a λ/2 plate, and the like have specific functions of the optically anisotropic layer.

In addition, the optically anisotropic layer may be formed of a plurality of layers. Regarding the optically anisotropic layer formed of a plurality of optically anisotropic layers, for example, the description in paragraphs [0008] to [0053] of JP2014-209219A can be referred to.

In addition, such an optically anisotropic layer and the above-described light absorption anisotropic layer A may be provided by coming into contact with each other, or another layer may be provided therebetween. Examples of such a layer include a pressure-sensitive adhesive layer and an adhesive layer for ensuring adhesiveness.

It is preferable that the laminate according to the embodiment of the present invention includes a λ/4 plate as the optically anisotropic layer described above, and more preferable that the laminate includes a λ/4 plate on the light absorption anisotropic layer.

Here, the "λ/4 plate" is a plate having a λ/4 function, specifically, a plate having a function of converting linearly polarized light having a specific wavelength into circularly polarized light (or converting circularly polarized light into linearly polarized light).

Specific examples of an aspect in which the λ/4 plate has a monolayer structure include a stretched polymer film and a retardation film in which an optically anisotropic layer having a λ/4 function is provided on a support. In addition, specific examples of an aspect in which the λ/4 plate has a multilayer structure include a broadband λ/4 plate obtained by laminating λ/4 plate and a λ/2 plate.

From the viewpoint of thinning, the optically anisotropic layer is preferably a liquid crystal cured film, and a thickness thereof is preferably 0.1 to 5.0 μm and more preferably 0.3 to 3.0 μm.

[Barrier Layer]

The laminate according to the embodiment of the present invention may include a barrier layer on the light absorption anisotropic layer (in a case of including a λ/4 plate, on the λ/4 plate).

Here, the barrier layer is also referred to as a gas-shielding layer (oxygen-shielding layer), and has a function of protecting the polarizer of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Light Absorption Anisotropic Layer B]

It is also preferable that the laminate according to the embodiment of the present invention includes, together with the light absorption anisotropic layer A, a light absorption anisotropic layer B which is different from the light absorption anisotropic layer A.

Here, the light absorption anisotropic layer A and the light absorption anisotropic layer B are different from each other in terms of the kind of the dichroic coloring agent contained in each layer, and specifically, it is preferable that the light absorption anisotropic layer A contains the organic dichroic coloring agent having a maximal absorption wavelength in the visible light region and the light absorption anisotropic layer B contains a dichroic coloring agent (organic dichroic coloring agent) having a maximal absorption wavelength in an infrared region, which will be described later.

The light absorption anisotropic layer B contains a dichroic coloring agent having a maximal absorption wavelength at a wavelength of 700 to 1400 nm. The light absorption anisotropic layer B can polarize light in the infrared region, and the light absorption anisotropic layer A has a small influence on the light in the infrared region.

As the dichroic coloring agent having a maximal absorption wavelength at a wavelength of 700 to 1400 nm, a known compound can be used.

In addition, the light absorption anisotropic layer B preferably contains the above-described liquid crystalline compound, and may contain the surfactant, the adhesion improver, or the like described above.

As a method for producing the light absorption anisotropic layer B, any method may be used as long as the dichroic coloring agent having a maximal absorption wavelength at a wavelength of 700 to 1400 nm is used, but it is preferable that the light absorption anisotropic layer B is produced by the same method as the above-described light absorption anisotropic layer A using the dichroic coloring agent having a maximal absorption wavelength at a wavelength of 700 to 1400 nm (that is, a dichroic coloring agent having a maximal absorption wavelength in the infrared region; hereinafter, also referred to as "infrared dichroic coloring agent"). In addition, as described in WO2018-88558A, the light absorption anisotropic layer B can also be produced by dispersing the infrared dichroic coloring agent in PVA, and performing stretching.

In a case of a liquid crystal cured film, a thickness of the light absorption anisotropic layer B is preferably 0.5 to 10 µm and more preferably 1.0 to 5.0 µm. In a case of a PVA film, the thickness thereof is preferably 5.0 to 100 µm and more preferably 10 to 50 µm.

[Pressure-Sensitive Adhesive Layer]

From the viewpoint of bonding the above-described λ/4 plate, the laminate according to the embodiment of the present invention may include a pressure-sensitive adhesive layer on a surface to which the λ/4 plate is bonded.

Examples of a pressure sensitive adhesive contained in the pressure-sensitive adhesive layer include a rubber-based pressure sensitive adhesive, an acrylic pressure sensitive adhesive, a silicone-based pressure sensitive adhesive, a urethane-based pressure sensitive adhesive, a vinyl alkyl ether-based pressure sensitive adhesive, a polyvinyl alcohol-based pressure sensitive adhesive, a polyvinylpyrrolidone-based pressure sensitive adhesive, a polyacrylamide-based pressure sensitive adhesive, and a cellulose-based pressure sensitive adhesive.

Among these, from the viewpoint of transparency, weather fastness, heat resistance, and the like, an acrylic pressure sensitive adhesive (pressure-sensitive adhesive) is preferable.

The pressure-sensitive adhesive layer can be formed by a method of coating a release sheet with a solution of a pressure sensitive adhesive, drying the solution, and transferring the sheet to a surface of a transparent resin layer or a method of directly coating a surface of a transparent resin layer with a solution of a pressure sensitive adhesive and drying the solution. The solution of a pressure sensitive adhesive is prepared, for example, as an approximately 10% to 40% by mass solution obtained by dissolving or dispersing the pressure sensitive adhesive in a solvent such as toluene and ethyl acetate.

As a coating method, a roll coating method such as reverse coating or gravure coating, a spin coating method, a screen coating method, a fountain coating method, a dipping method, or a spraying method can be employed.

In addition, examples of a constituent material of the release sheet include appropriate thin paper bodies, for example, synthetic resin films such as polyethylene, polypropylene, and polyethylene terephthalate, rubber sheets, paper, cloth, nonwoven fabrics, nets, foam sheets, and metal foils.

In the present invention, a thickness of an optional pressure-sensitive adhesive layer is not particularly limited, but is preferably 3 to 50 µm, more preferably 4 to 40 µm, and still more preferably 5 to 30 µm.

[Applications]

The light absorption anisotropic layer and laminate according to the embodiment of the present invention can be used as a polarizer (polarizing plate), and specifically, for example, it can be used as a linearly polarizing plate or a circularly polarizing plate, and since it has characteristic of absorbing little infrared light even in a case where the infrared light passes through it, it can be used for any application which take advantage of this characteristic. Specifically, the light absorption anisotropic layer and laminate according to the embodiment of the present invention can be used by being incorporated into a display device (image display device) used in combination with a light source or a sensor of infrared light, an infrared irradiation device, an infrared sensing device, or the like. In addition, the light absorption anisotropic layer and laminate according to the embodiment of the present invention can also be used as a switching element, an isolator, or a member for a camera.

For the purpose of reducing size and weight of the above-described device and increasing a degree of freedom in design, a design in which infrared light passes through a polarizer is required. In this case, the light absorption anisotropic layer and laminate according to the embodiment of the present invention can increase the S/N ratio of infrared light because the infrared light is less likely to be absorbed by the polarizer.

In a case where the laminate according to the embodiment of the present invention does not include an optically anisotropic layer such as the above-described λ/4 plate, the laminate can be used as a linearly polarizing plate.

On the other hand, in a case where the laminate according to the embodiment of the present invention includes the above-described λ/4 plate, the laminate can be used as a circularly polarizing plate.

[Display Device]

The display device according to the embodiment of the present invention includes the above-described light absorption anisotropic layer according to the embodiment of the present invention (light absorption anisotropic layer A) or the above-described laminate according to the embodiment of the present invention.

A display element used in the display device according to the embodiment of the present invention is not particularly limited, and examples thereof include an organic electroluminescence (hereinafter, abbreviated as "EL") display panel, a micro LED display panel, a mini LED display panel, an LED array, and a combination of transmissive liquid crystal panel and backlight unit.

Among these, a liquid crystal cell, a micro LED display panel, or an organic EL display panel is preferable, and an organic EL display panel is more preferable. That is, the display panel according to the embodiment of the present invention is preferably a liquid crystal display device using a liquid crystal cell as the display element, a micro LED display device using a micro LED display panel as the display element, or an organic EL display device using an organic EL display panel as the display panel, and more preferably an organic EL display device.

The display device according to the embodiment of the present invention preferably includes any one or both of an infrared light source and an infrared light receiving section, and more preferably includes the both.

As the infrared light source, any light source can be adopted, and typical examples thereof include infrared light-emitting LED devices, infrared lasers, and various lamps which emit light in the near-infrared region.

As the infrared light receiving section, a photodetector element such as a photodiode and a phototransistor, which has sensitivity in an invisible region can be adopted. A photodiode or a phototransistor, which has sensitivity in a near-infrared region, is preferable. As the photodetector element, an organic photodiode (OPD) or an organic phototransistor (OPT) may be adopted.

The light receiving section is provided between the above-described emission surface and the above-described light emitting panel, on the above-described light emitting panel, or on a side of the above-described light emitting panel opposite to the above-described emission surface. A target detected by the light receiving section may be a shape of a target, a surface state of a target, an eye movement of a user, an eye position, a facial expression, a face shape, a vein pattern, a blood flow, a pulse, a blood oxygen saturation, a fingerprint, and an iris. That is, the sensor system according to the embodiment of the present invention can detect or recognize a shape of a target, a surface state of a target, an eye movement of a user, an eye position, a facial expression, a face shape, a vein pattern, a blood flow, a pulse, blood oxygen saturation, a degree, a fingerprint, and an iris.

For example, a light emitting panel or a display device including the above-described sensor system can be applied to wearable devices such as a head-mounted display, mobile display devices such as a smartphone and a tablet, or stationary devices such as a television and a lighting.

Hereinafter, an example of a display device which can sense infrared rays will be described with reference to the accompanying drawings.

FIG. 1 is a schematic cross-sectional view showing an example of the display device according to the embodiment of the present invention. As shown in FIG. 1, a display device 100 includes an infrared light source 101, an infrared light receiving section 102, a visible light emitting panel 103 which is one of the above-described display element, a light absorption anisotropic layer 1 which is the above-described light absorption anisotropic layer A, and an optically anisotropic layer 2.

As shown in FIG. 1, infrared light emitted from the infrared light source 101 is transmitted through the optically anisotropic layer 2 and the light absorption anisotropic layer 1 in this order, and is applied to a palm of a person, which is a measurement target. Infrared light reflected from the measurement target is transmitted through the light absorption anisotropic layer 1 and the optically anisotropic layer 2 in this order, and is received by the light receiving section 102. The infrared light received by the light receiving section 102 is unpolarized light.

Figure 2:
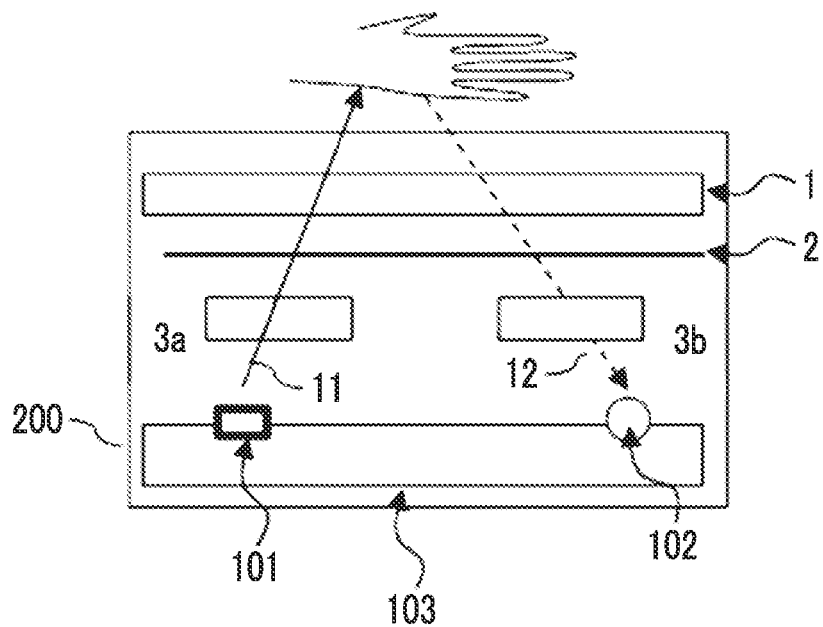
FIG. 2 is a schematic cross-sectional view showing an example of the display device according to the embodiment of the present invention.

FIG. 2 is a schematic cross-sectional view showing an example of the display device according to the embodiment of the present invention. As shown in FIG. 2, a display device 200 includes an infrared light source 101, an infrared light receiving section 102, a visible light emitting panel 103 which is one of the above-described display element, a light absorption anisotropic layer 1 which is the above-described light absorption anisotropic layer A, an optically anisotropic layer 2, an infrared light polarizer 3a, and an infrared light polarizer 3b. The display device 200 in FIG. 2 has the same configuration as the display device 100 in FIG. 1, except that the display device further includes the infrared light polarizer 3a and the infrared light polarizer 3b.

As shown in FIG. 2, infrared light emitted from the infrared light source 101 is transmitted through the infrared light polarizer 3a, the optically anisotropic layer 2, and the light absorption anisotropic layer 1 in this order, and is applied to a palm of a person, which is a measurement target. Infrared light reflected from the measurement target is transmitted through the light absorption anisotropic layer 1, the optically anisotropic layer 2, and the infrared light polarizer 3b in this order, and is received by the light receiving section 102. The infrared light received by the light receiving section 102 is linearly polarized light.

[Viewing Angle Control Layer]

The display device according to the embodiment of the present invention may include a viewing angle control layer.

Here, the viewing angle control layer is a layer which controls transmittance as viewed in the front direction and an oblique direction of the display device used for preventing peeping into the display device or switching the viewing angle, and examples thereof include a light control film (manufactured by 3M Company) and a laminate formed of a light absorption anisotropic layer having an absorption axis in the thickness direction. With regard to the laminate formed of a light absorption anisotropic layer having an absorption axis in the thickness direction, for example, the description in paragraphs [0006] to [0043] of WO2018/079854A can be referred to.

Suitable examples of an aspect of an organic EL display device which is an example of the display device according to the embodiment of the present invention include an aspect of a display device including the above-described viewing angle control layer, the above-described light absorption anisotropic layer A, the above-described optically anisotropic layer, and an organic EL display panel from the viewing side.

[Surface Protective Material]

The display device according to the embodiment of the present invention preferably includes a surface protective material on a side closest to the viewing side.

Here, a material constituting the surface protective material is not particularly limited, and may be an inorganic substance or an organic substance. Examples of the inorganic substance include a glass substrate. In addition, examples of the organic substance include a support consisting of a polymer film such as polyimide and cellulose acylate. Each surface layer of the surface protective material may include one or a plurality of layers selected from a surface curing layer (hard coat layer), a low reflection layer which suppresses surface reflection occurring at an air interface, and the like.

A thickness of the surface protective material is not particularly limited, but from the viewpoint of thinning, it is preferably 800 μm or less and more preferably 100 μm or less. The lower limit thereof is not particularly limited, but is preferably 0.1 μm or more.

For example, a bendable glass base material having a thickness of 100 μm or less is preferable from the viewpoint that it is possible to take advantage of flexible characteristics of the organic EL display device.

Furthermore, from the viewpoint of impact resistance, it is also preferable that a resin film as a protective film, for example, a (meth)acrylic resin, a polyester-based resin such as polyethylene terephthalate (PET), a cellulose-based resin such as triacetyl cellulose (TAC), or a cycloolefin-based resin such as a norbornene-based resin, is bonded to the glass base material having a thickness of 100 μm or less with an adhesive or the like. In particular, it is preferable that polyethylene terephthalate (PET) is bonded to the glass base material from the viewpoint of flexibility, and preferable that polyethylene terephthalate (PET) having an Re of 3,000 nm or more and 10,000 nm or less is bonded to the glass base material from the viewpoint of visibility.

[Infrared Light Irradiation Device]

The infrared light irradiation device according to the embodiment of the present invention includes the above-described light absorption anisotropic layer according to the embodiment of the present invention (light absorption anisotropic layer A) or the above-described laminate according to the embodiment of the present invention, and specifically, it further includes the above-described infrared light source.

In the infrared light irradiation device, infrared light emitted from the infrared light source is transmitted through the light absorption anisotropic layer according to the embodiment of the present invention or the laminate according to the embodiment of the present invention.

[Infrared Light Sensing Device]

The infrared light sensing device according to the embodiment of the present invention includes the above-described light absorption anisotropic layer according to the embodiment of the present invention (light absorption anisotropic layer A) or the above-described laminate according to the embodiment of the present invention, and specifically, it further includes the above-described infrared light source and the above-described infrared light receiving section. The light absorption anisotropic layer according to the embodiment of the present invention or the laminate according to the embodiment of the present invention is disposed on an optical path of infrared light.

EXAMPLES

Hereinafter, the present invention will be described in more detail with reference to Examples. Materials, used amounts, ratios, treatment contents, treatment procedures, and the like described in Examples can be appropriately changed without departing from the spirit of the present invention. Therefore, the scope of the present invention should not be construed as being limited to Examples.

Production Example 1

(Production of Transparent Support)

The following composition was put into a mixing tank and stirred, thereby preparing a cellulose acetate solution used as a core layer cellulose acylate dope.

| Core layer cellulose acylate dope | |
|---|---|
| Cellulose acetate having acetyl substitution degree of 2.88 | 100 parts by mass |
| Polyester B described in Table 1 of JP2015-227955A | 12 parts by mass |
| Compound F shown below | 2 parts by mass |
| Methylene chloride (first solvent) | 430 parts by mass |
| Methanol (second solvent) | 64 parts by mass |

Compound F

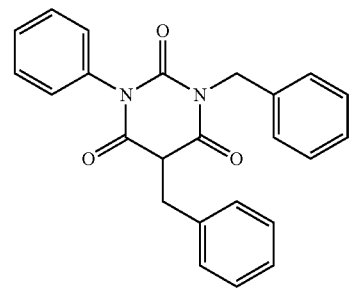 [SMILES: O=C1C(Cc2ccccc2)C(=O)N(c2ccccc2)C(=O)N1Cc1ccccc1]

10 parts by mass of the following matting agent solution was added to 90 parts by mass of the above-described core layer cellulose acylate dope, thereby preparing a cellulose acetate solution used as an outer layer cellulose acylate dope.

| Matting agent solution | |
|---|---|
| Silica particles with average particle size of 20 nm (AEROSIL R972, manufactured by Nippon Aerosil Co., Ltd.) | 2 parts by mass |
| Methylene chloride (first solvent) | 76 parts by mass |
| Methanol (second solvent) | 11 parts by mass |
| Core layer cellulose acylate dope described above | 1 part by mass |

The core layer cellulose acylate dope and the outer layer cellulose acylate dope were filtered through filter paper having an average hole diameter of 34 μm and a sintered metal filter having an average pore size of 10 μm, and three layers which were the core layer cellulose acylate dope and the outer layer cellulose acylate dopes provided on both sides of the core layer cellulose acylate dope were simultaneously cast from a casting port onto a drum at 20° C. (band casting machine).

Next, the film on the drum was peeled off in a state in which the solvent content in the film was approximately 20% by mass, both ends of the film in the width direction were fixed by tenter clips, and the film was dried while being stretched at a stretching ratio of 1.1 times in the lateral direction.

Thereafter, the obtained film was further dried by being transported between the rolls of the heat treatment device to produce a transparent support having a thickness of 40 μm, and the transparent support was used as a cellulose acylate film A1.

[Formation of Photo-Alignment Film B1]

The above-described cellulose acylate film A1 was continuously coated with a composition for forming a photo-alignment film described below with a wire bar. The support on which the coating film had been formed was dried with hot air at 140° C. for 120 seconds, and the coating film was irradiated with polarized ultraviolet rays (10 mJ/cm², using an ultra-high pressure mercury lamp) to form a photo-alignment film B1, thereby obtaining a triacetyl cellulose (TAC) film with the photo-alignment film. A film thickness of the photo-alignment film B1 was 0.25 μm.

| Composition for forming photo-alignment film | |
|---|---|
| Polymer PA-1 shown below | 100.00 parts by mass |
| Acid generator PAG-1 shown below | 8.25 parts by mass |
| Stabilizer DIPEA shown below | 0.6 parts by mass |
| Xylene | 1126.60 parts by mass |
| Methyl isobutyl ketone | 125.18 parts by mass |

Polymer PA-1 (in the formulae, the numerical value described in each repeating unit denotes the content (% by mass) of each repeating unit with respect to all repeating units)

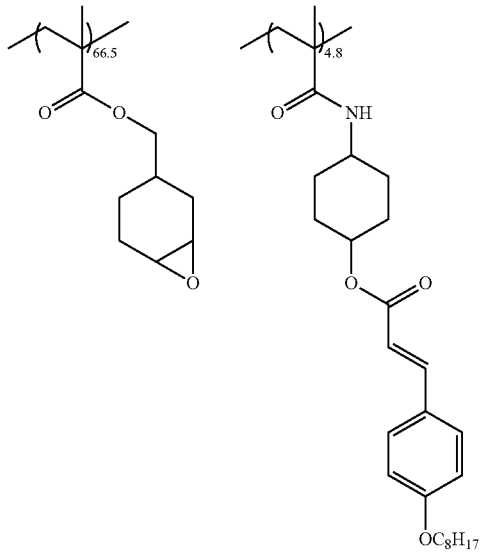

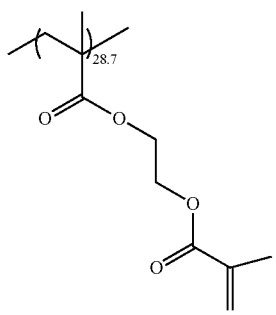

Acid Generator PAG-1

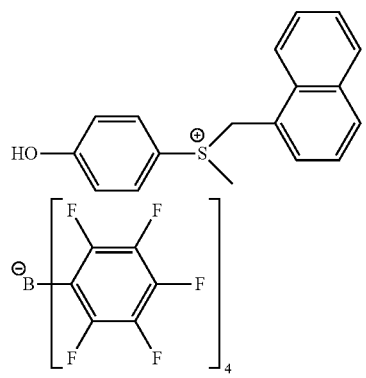

Stabilizer DIPEA

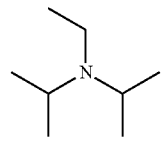

[Production of Light Absorption Anisotropic Layer C1]

A coating film was formed by continuously coating the obtained photo-alignment film B1 with a composition C1 for forming a light absorption anisotropic layer, having the following composition, with a wire bar.

Next, the coating film was heated at 140° C. for 15 seconds, subjected to a heat treatment at 80° C. for 5 seconds, and cooled to room temperature (23° C.). Next, the coating film was heated at 75° C. for 60 seconds, and cooled to room temperature again.

Thereafter, a light absorption anisotropic layer C1 (polarizer) (thickness: 2.0 μm) was produced on the photo-alignment film B1 by irradiating the coating film with a light emitting diode (LED) lamp (central wavelength: 365 nm, half-width: 10 nm) for 2 seconds under an irradiation condition of an illuminance of 200 mW/cm².

In a case where a transmittance of the light absorption anisotropic layer C1 in a wavelength range of 280 to 780 nm was measured with a spectrophotometer, and the average transmittance of visible light was 42%. An alignment degree was measured as follows, and the alignment degree at a wavelength of 650 nm was 0.97.

In addition, in a case where the light absorption anisotropic layer C1 was subjected to in-plane measurement using an X-ray diffractometer for evaluating a thin film (manufactured by Rigaku Corporation, product name: "ATX-G" in-plane optical system), a Bragg peak was observed.

<Evaluation of Alignment Degree>

The alignment degree was calculated according to the following expression by setting a laminate including the light absorption anisotropic layer on a sample table in a state where a linear polarizer is inserted into a side of a light source of an optical microscope (manufactured by Nikon Corporation, product name "ECLIPSE E600 POL"), and measuring an absorbance of the light absorption anisotropic layer in a wavelength range of 400 to 700 nm using a multi-channel spectrometer (manufactured by Ocean Optics Inc., product name "QE65000").

$S=[(Az0/Ay0)-1]/[(Az0/Ay0)+2]$    Alignment degree:

Az0: absorbance of the light absorption anisotropic layer with respect to polarized light in an absorption axis direction Ay0: absorbance of the light absorption anisotropic layer with respect to polarized light in a polarization axis direction In a case where a support, a photoalignment layer, an oxygen-shielding layer, a pressure-sensitive adhesive layer, a retardation layer (positive A-plate, positive C-plate, or the like), an adhesive layer, a surface film, or the like did not have an absorption at 400 to 700 nm, the alignment degree of the light absorption anisotropic layer could be measured without any influence even in a case where the alignment degree was measured in a state of the laminate including these layers.

The absorption axis of the light absorption anisotropic layer C1 was in the plane of the light absorption anisotropic layer C1, and was orthogonal to a width direction of the cellulose acylate film A1.

| Formulation of composition C1 for forming light absorption anisotropic layer | |
|---|---|
| First dichroic substance Dye-C1 shown below | 0.59 parts by mass |
| Second dichroic substance Dye-M1 shown below | 0.14 parts by mass |
| Third dichroic substance Dye-Y1 shown below | 0.25 parts by mass |
| Liquid crystalline compound L-1 shown below | 3.27 parts by mass |
| Liquid crystalline compound L-2 shown below | 1.44 parts by mass |
| Adhesion improver A-1 shown below | 0.06 parts by mass |
| Polymerization initiator IRGACURE OXE-02 (manufactured by BASF SE) | 0.18 parts by mass |
| Surfactant F-1 shown below | 0.030 parts by mass |
| Cyclopentanone | 91.70 parts by mass |
| Benzyl alcohol | 2.35 parts by mass |

Dichroic Substance Dye-C1

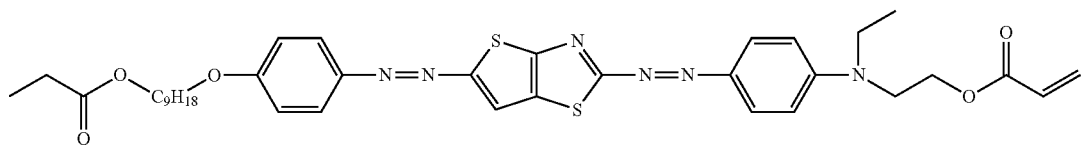

Dichroic Substance Dye-M1

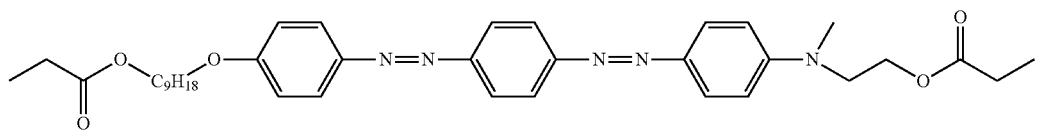

Dichroic Substance Dye-Y1

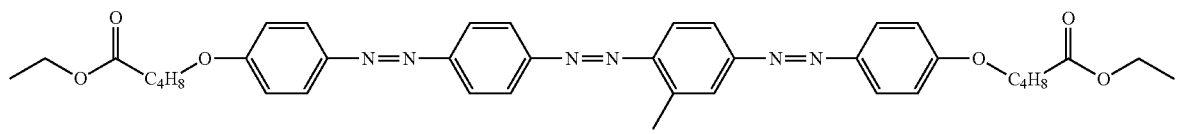

Liquid crystalline compound L-1 (in the formulae, the numerical value ("59", "15", or "26") described in each repeating unit denotes the content (% by mass) of each repeating unit with respect to all repeating units)

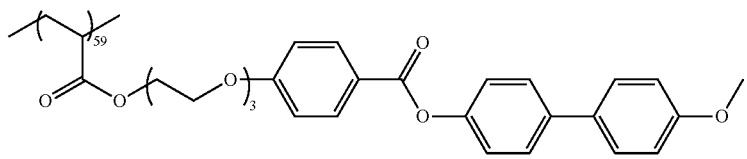

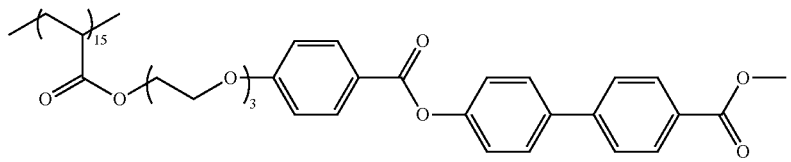

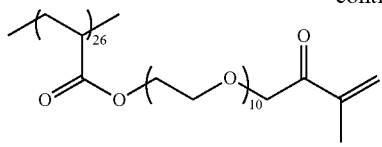

Liquid Crystalline Compound L-2

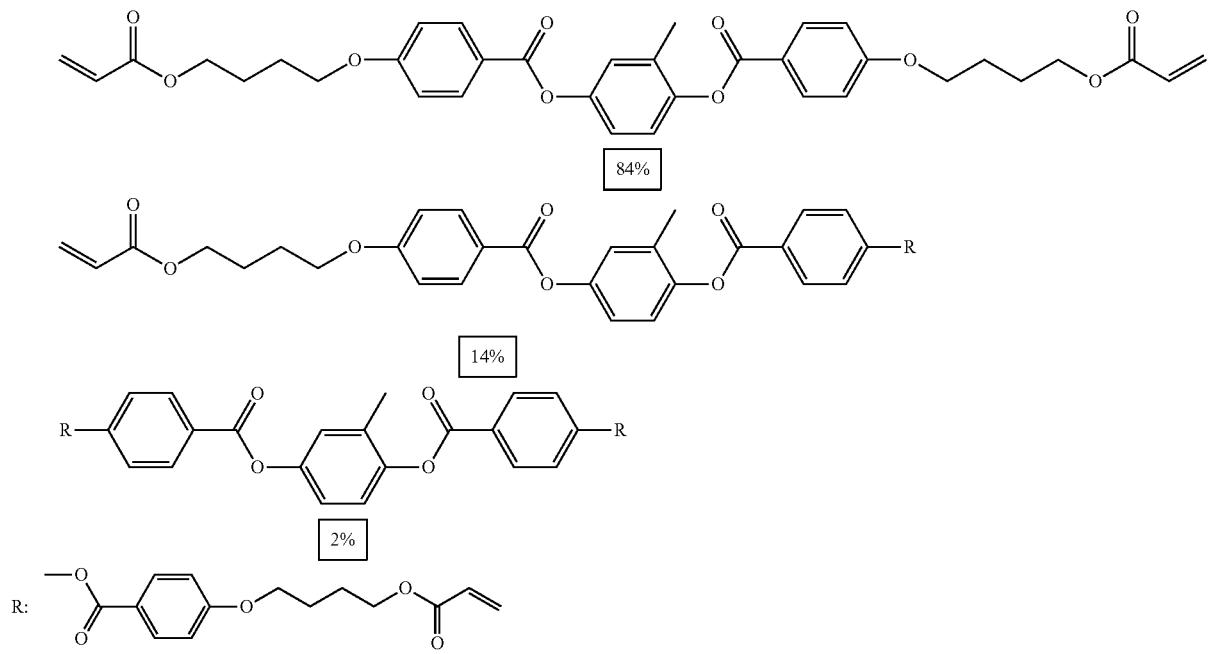

Adhesion Improver A-1

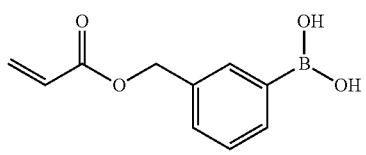

Surfactant F-1 (in the formulae, the numerical value described in each repeating unit denotes the content (% by mass) of each repeating unit with respect to all repeating units)

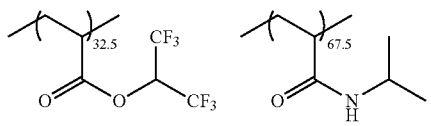

[Formation of Oxygen-Shielding Layer D1]

The light absorption anisotropic layer C1 was continuously coated with a coating liquid D1 having the following composition with a wire bar. Thereafter, the coating layer was dried with hot air at 80° C. for 5 minutes, and irradiated with ultraviolet rays (300 mJ/cm², using an ultra-high pressure mercury lamp), thereby obtaining a laminate on which an oxygen-shielding layer D1 consisting of polyvinyl alcohol (PVA) with a thickness of 1.0 μm was formed, that is, a laminate CP1 including the cellulose acylate film A1 (transparent support), the photo-alignment film B1, the light absorption anisotropic layer C1, and the oxygen-shielding layer D1 adjacent to each other in this order.

| Composition of coating solution D1 for forming oxygen-shielding layer | |
|---|---|
| Modified polyvinyl alcohol shown below | 3.30 parts by mass |
| Initiator Irg2959 | 0.20 parts by mass |
| Surfactant F-2 shown below | 0.0018 parts by mass |
| Water | 74.1 parts by mass |
| Methanol | 22.4 parts by mass |

Modified Polyvinyl Alcohol

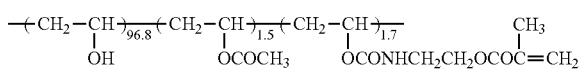

Surfactant F-2

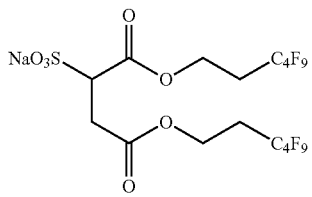

Polymer PA-2

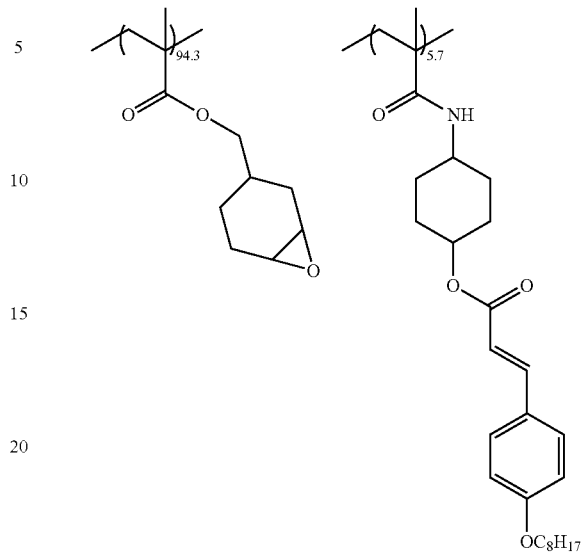

[Production of TAC Film Including Positive A-Plate]

The above-described cellulose acylate film A1 was continuously coated with a coating liquid E1 for forming a photo-alignment film, having the following composition, with a wire bar. The support on which the coating film had been formed was dried with hot air at 140° C. for 120 seconds, and the coating film was irradiated with polarized ultraviolet rays (10 mJ/cm², using an ultra-high pressure mercury lamp) to form a photo-alignment film E1 having a thickness of 0.2 μm, thereby obtaining a TAC film with the photo-alignment film.

| Coating liquid E1 for forming photo-alignment film | |
|---|---|
| Polymer PA-2 shown below | 100.00 parts by mass |
| Acid generator PAG-1 described above | 5.00 parts by mass |
| Acid generator CPI-110TF shown below | 0.005 parts by mass |
| Isopropyl alcohol | 16.50 parts by mass |
| Butyl acetate | 1072.00 parts by mass |
| Methyl ethyl ketone | 268.00 parts by mass |

Acid Generator CPI-110TF

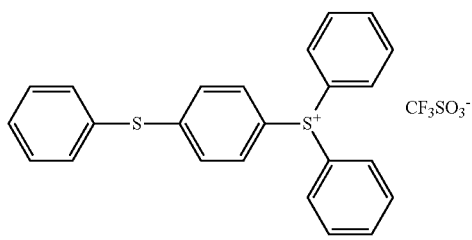

The above-described photo-alignment film E1 was coated with a composition F1 having the following composition using a bar coater. The coating film formed on the photo-alignment film E1 was heated to 120° C. with hot air, cooled to 60° C., irradiated with ultraviolet rays having a wavelength of 365 nm with an illuminance of 100 mJ/cm² using a high-pressure mercury lamp in a nitrogen atmosphere, and continuously irradiated with ultraviolet rays with an illuminance of 500 mJ/cm² while being heated at 120° C., so that the alignment of the liquid crystalline compound was immobilized, thereby producing a TAC film having a positive A-plate F1.

A thickness of the positive A-plate F1 was 2.5 μm, and an Re (550) was 144 nm. In addition, the positive A-plate satisfied a relationship of "Re(450)≤Re(550)≤Re(650)". Re(450)/Re(550) was 0.82.

| Composition F1 | |
|---|---|
| Polymerizable liquid crystalline compound LA-1 shown below | 43.50 parts by mass |
| Polymerizable liquid crystalline compound LA-2 shown below | 43.50 parts by mass |
| Polymerizable liquid crystalline compound LA-3 shown below | 8.00 parts by mass |
| Polymerizable liquid crystalline compound LA-4 shown below | 5.00 parts by mass |
| Polymerization initiator PI-1 shown below | 0.55 parts by mass |
| Leveling agent T-1 shown below | 0.20 parts by mass |
| Cyclopentanone | 235.00 parts by mass |

Polymerizable Liquid Crystalline Compound LA-1 (tBu Represents a Tertiary Butyl Group)

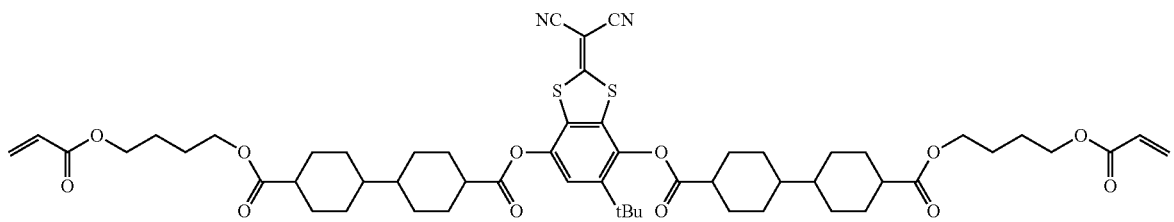 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]

Polymerizable Liquid Crystalline Compound LA-2

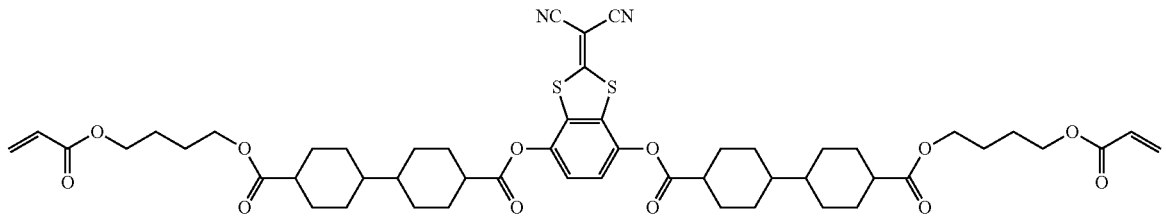 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]

Polymerizable Liquid Crystalline Compound LA-3

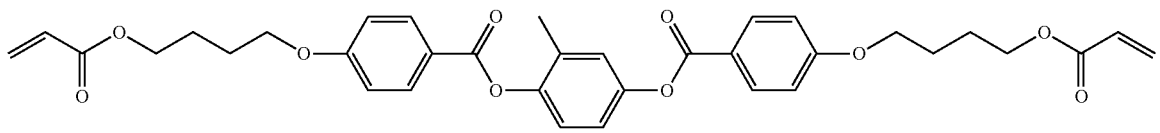 [SMILES: C=CC(=O)OCCCCOc1ccc(C(=O)Oc2ccc(OC(=O)c3ccc(OCCCCOC(=O)C=C)cc3)c(C)c2)cc1]

Polymerizable Liquid Crystalline Compound LA-4 (Me Represents a Methyl Group)

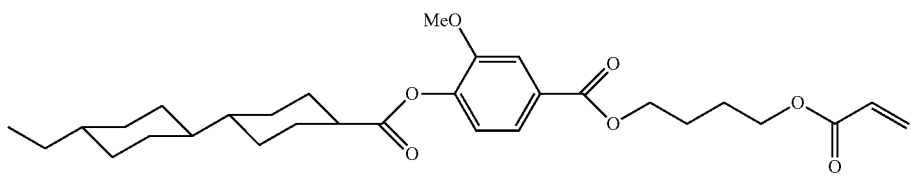 [SMILES: C=CC(=O)OCCCCOC(=O)c1ccc(OC(=O)C2CCC(C3CCC(CC)CC3)CC2)c(OC)c1]

Polymerization Initiator PI-1

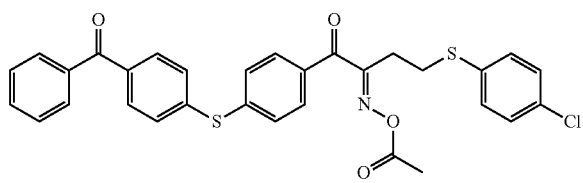 [SMILES: CC(=O)O/N=C(\CCSc1ccc(Cl)cc1)C(=O)c1ccc(Sc2ccc(C(=O)c3ccccc3)cc2)cc1]

Leveling Agent T-1

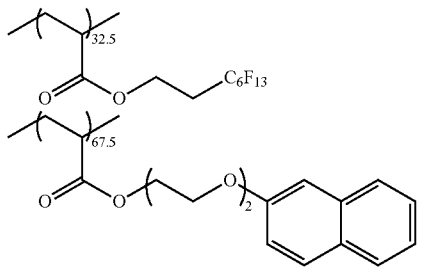

[Production of TAC Film Including Positive C-Plate H1]

The above-described cellulose acylate film A1 was used as a temporary support.

After passing the cellulose acylate film A1 through a dielectric heating roll at a temperature of 60° C. to raise the film surface temperature to 40° C., an alkaline solution having the composition shown below was applied onto one surface of the film using a bar coater at a coating amount of 14 ml/m², followed by heating to 110° C., and transportation of the film under a steam type far-infrared heater manufactured by Noritake Company Limited for 10 seconds.

Next, the film was coated with pure water such that the coating amount reached 3 ml/m² using the same bar coater. Next, the film was washed with water by a fountain coater and drained by an air knife three times, and then transported to a drying zone at 70° C. for 10 seconds and dried to produce a cellulose acylate film A1 subjected to an alkali saponification treatment.

| (Alkali solution) | |
|---|---|
| Potassium hydroxide | 4.7 parts by mass |
| Water | 15.8 parts by mass |
| Isopropanol | 63.7 parts by mass |
| Fluorine-containing surfactant SF-1 ($C_{14}H_{29}O(CH_2CH_2O)_{20}H$) | 1.0 part by mass |
| Propylene glycol | 14.8 parts by mass |

The cellulose acylate film A1 which had been subjected to the alkali saponification treatment was continuously coated with a coating liquid G1 for forming a photo-alignment film, having the following composition, using a #8 wire bar. The obtained film was dried with hot air at 60° C. for 60 seconds, and further dried with hot air at 100° C. for 120 seconds to form a photo-alignment film G1.

| Coating liquid G1 for forming photo-alignment film | |
|---|---|
| Polyvinyl alcohol (PVA103 manufactured by Kuraray Co., Ltd.) | 2.4 parts by mass |
| Isopropyl alcohol | 1.6 parts by mass |
| Methanol | 36 parts by mass |
| Water | 60 parts by mass |

The photo-alignment film G1 was coated with a coating liquid H1 for forming a positive C-plate, having the following composition, the obtained coating film was aged at 60° C. for 60 seconds and irradiated with ultraviolet rays at an illuminance of 1000 mJ/cm² in the air using an air-cooled metal halide lamp at an illuminance of 70 mW/cm² (manufactured by Eye Graphics Co., Ltd.), and the alignment state thereof was fixed to vertically align the liquid crystalline compound, thereby producing a TAC film having a positive C-plate H1 with a thickness of 0.5 m.

An Rth (550) of the obtained positive C-plate was −60 nm.

| Coating liquid H1 for forming positive C-plate | |
|---|---|
| Liquid crystalline compound LC-1 shown below | 80 parts by mass |
| Liquid crystalline compound LC-2 shown below | 20 parts by mass |
| Vertically aligned liquid crystalline compound alignment agent S01 shown below | 1 part by mass |
| Ethylene oxide-modified trimethylolpropane triacrylate (V#360, manufactured by Osaka Organic Chemical Industry Ltd.) | 8 parts by mass |
| IRGACURE 907 (manufactured by BASF SE) | 3 parts by mass |
| KAYACURE DETX (manufactured by Nippon Kayaku Co., Ltd.) | 1 part by mass |
| Compound B03 shown below | 0.4 parts by mass |
| Methyl ethyl ketone | 170 parts by mass |
| Cyclohexanone | 30 parts by mass |

Liquid Crystalline Compound LC-1

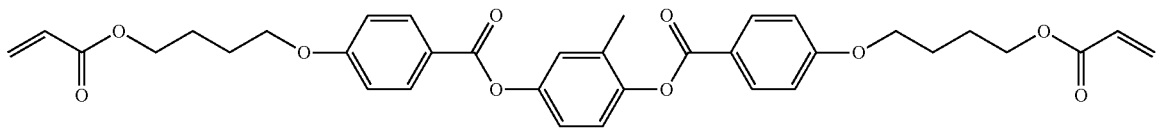 [SMILES: C=CC(=O)OCCCCOc1ccc(C(=O)Oc2ccc(OC(=O)c3ccc(OCCCCOC(=O)C=C)cc3)c(C)c2)cc1]

Liquid Crystalline Compound LC-2

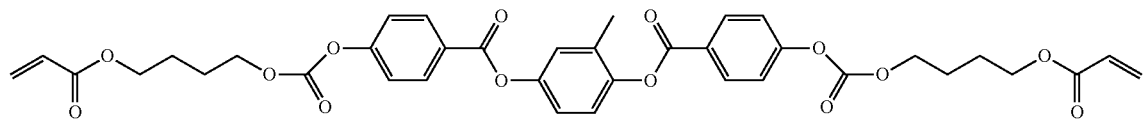 [SMILES: C=CC(=O)OCCCCOC(=O)Oc1ccc(C(=O)Oc2ccc(OC(=O)c3ccc(OC(=O)OCCCCOC(=O)C=C)cc3)c(C)c2)cc1]

Vertically Aligned Liquid Crystalline Compound Alignment Agent S01

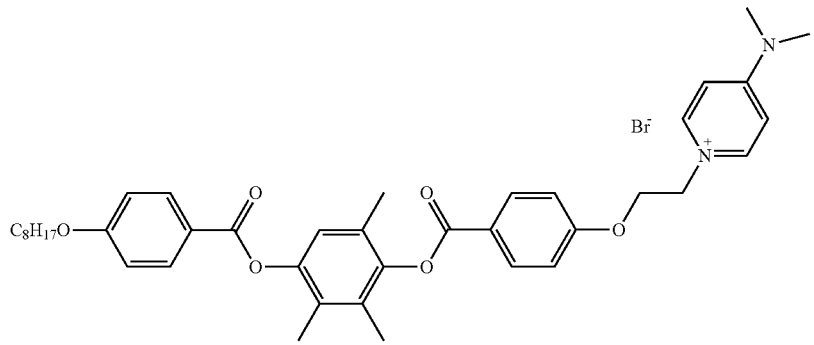

Compound B03

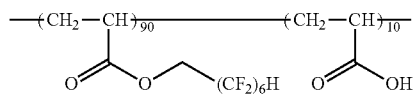

[Production of Pressure Sensitive Adhesives N1 and N2]

Next, an acrylate-based polymer was prepared according to the following procedure.

95 parts by mass of butyl acrylate and 5 parts by mass of acrylic acid were polymerized by a solution polymerization method in a reaction container equipped with a cooling pipe, a nitrogen introduction pipe, a thermometer, and a stirrer, thereby obtaining an acrylate-based polymer (NA1) with an average molecular weight of 2,000,000 and a molecular weight distribution (Mw/Mn) of 3.0.

Next, an acrylate-based pressure sensitive adhesive was produced with the following composition using the obtained acrylate-based polymer (NA1). Each separate film which had been subjected to a surface treatment with a silicone-based release agent was coated with the composition using a die coater, dried in an environment of 90° C. for 1 minute, and irradiated with ultraviolet rays (UV) under the following conditions, thereby obtaining the following acrylate-based pressure sensitive adhesives N1 and N2 (pressure-sensitive adhesive layers). The composition and the film thickness of the acrylate-based pressure sensitive adhesive are shown below.

<UV Irradiation Conditions>

Electrodeless lamp H bulb (Fusion Co., Ltd.)
Illuminance: 600 mW/cm$^2$, light dose: 150 mJ/cm$^2$
The UV illuminance and the light dose were measured using "UVPF-36" (manufactured by Eye Graphics Co., Ltd.).

| Acrylate-based pressure sensitive adhesive N1 (film thickness: 15 μm) | |
|---|---|
| Acrylate-based polymer (NA1) | 100 parts by mass |
| (A) Polyfunctional acrylate-based monomer shown below | 11.1 parts by mass |
| (B) Photopolymerization initiator shown below | 1.1 parts by mass |
| (C) Isocyanate-based crosslinking agent shown below | 1.0 part by mass |
| (D) Silane coupling agent shown below | 0.2 parts by mass |

Acrylate-Based Pressure Sensitive Adhesive N2 (Film Thickness: 25 μm)

| Acrylate-based polymer (NA1) | 100 parts by mass |
|---|---|
| (C) Isocyanate-based crosslinking agent shown below | 1.0 part by mass |
| (D) Silane coupling agent shown below | 0.2 parts by mass |

(A) Polyfunctional acrylate-based monomer: tris(acryloyloxyethyl) isocyanurate, molecular weight=423, trifunctional type (manufactured by Toagosei Co., Ltd., trade name "ARONIX M-315")

(B) Photopolymerization initiator: mixture of benzophenone and 1-hydroxycyclohexyl phenyl ketone at mass ratio of 1:1, "IRGACURE 500" manufactured by Ciba Specialty Chemicals Corp.

(C) Isocyanate-based crosslinking agent: trimethylolpropane-modified tolylene diisocyanate ("CORONATE L" manufactured by Nippon Polyurethane Industry Co., Ltd.)

(D) Silane coupling agent: 3-glycidoxypropyltrimethoxysilane ("KBM-403" manufactured by Shin-Etsu Chemical Co., Ltd.)

[Production of UV Adhesive]

An UV adhesive composition having the following composition was prepared.

| UV adhesive composition | |
|---|---|
| CEL2021P (manufactured by Daicel Corporation) | 70 parts by mass |
| 1,4-Butanediol diglycidyl ether | 20 parts by mass |
| 2-Ethylhexyl glycidyl ether | 10 parts by mass |
| CPI-100P | 2.25 parts by mass |

CPI-100P

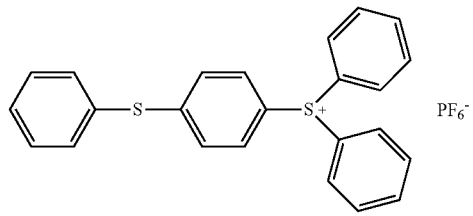

[Production of Laminate CPAC1]

The above-described TAC film having the positive A-plate F1 on the phase difference side and the above-described TAC film having the positive C-plate H1 on the phase difference side were bonded to each other by irradiation with UV rays of 600 mJ/cm$^2$ using the above-described UV adhesive composition. A thickness of the UV adhesive layer was 3 μm. The surfaces bonded to each other with the UV adhesive were respectively subjected to a corona treatment. Next, the photo-alignment film E1 on the positive A-plate F1 side and the cellulose acylate film A1 were removed to obtain a retardation plate AC1. The retardation plate AC1 had a layer configuration of the positive A-plate F1, the UV adhesive layer, the positive C-plate H1, the photo-alignment film G1, and the cellulose acylate film A1.

The above-described laminate CP1 on the oxygen-shielding layer D1 side was bonded to a low-reflection surface film CV-LC5 (manufactured by FUJIFILM Corporation) on a support side using the above-described pressure sensitive adhesive N1. Next, only the cellulose acylate film A1 of the above-described laminate CP1 was removed, and the surface from which the film had been removed and the retardation plate AC1 on the positive A-plate F1 side were bonded to each other using the above-described pressure sensitive adhesive N1. Next, the photo-alignment film G1 on the positive C-plate H1 side and the cellulose acylate film A1 included in the above-described retardation plate AC1 were removed, thereby producing a laminate CPAC1. At this time, the films were bonded to each other such that an angle between an absorption axis of the light absorption anisotropic layer C1 included in the above-described laminate CPAC1 and a slow axis of the positive A-plate F1 was set to 45°. The laminate CPAC1 had a layer configuration of the low-reflection surface film CV-LC5, the pressure sensitive adhesive layer N1, the oxygen-shielding layer D1, the light absorption anisotropic layer C1, the photo-alignment film B1, the pressure sensitive adhesive layer N1, the positive A-plate F1, the UV adhesive layer, and the positive C-plate H1.

GALAXY S5 (manufactured by Samsung Electronics Co., Ltd.) equipped with an organic EL panel (organic EL display element) was disassembled, a touch panel provided with a circularly polarizing plate was peeled off from the organic EL display device, and a circularly polarizing plate was further peeled off from the touch panel, so that the organic EL display element, the touch panel, and the circularly polarizing plate were isolated from each other. Subsequently, the isolated touch panel was bonded to the organic EL display element again, and the laminate CPAC1 on the positive C-plate 1 side, which had been produced above, was bonded onto the touch panel such that air did not enter, thereby producing an organic EL display device 1.

Production Examples 2 to 7

[Production of Laminate CP2]

A light absorption anisotropic layer C2 (thickness: 2.0 μm) was produced by, in Production Example 1, changing the composition C1 for forming a light absorption anisotropic layer to a composition C2 for forming a light absorption anisotropic layer.

The absorption axis of the light absorption anisotropic layer C2 was in the plane of the light absorption anisotropic layer C2, and was orthogonal to a width direction of the cellulose acylate film A1.

Thereafter, a laminate CP2 was obtained in the same manner as in Production Example 1.

| Formulation of composition C2 for forming light absorption anisotropic layer | |
|---|---|
| First dichroic substance Dye-C1 described above | 0.46 parts by mass |
| Second dichroic substance Dye-M1 described above | 0.14 parts by mass |
| Third dichroic substance Dye-Y1 described above | 0.25 parts by mass |
| Liquid crystalline compound L-1 described above | 3.27 parts by mass |
| Liquid crystalline compound L-2 described above | 1.44 parts by mass |
| Adhesion improver A-1 described above | 0.06 parts by mass |
| Polymerization initiator IRGACURE OXE-02 (manufactured by BASF SE) | 0.18 parts by mass |
| Surfactant F-1 described above | 0.030 parts by mass |
| Cyclopentanone | 91.83 parts by mass |
| Benzyl alcohol | 2.35 parts by mass |

[Production of Laminate CP3]

A light absorption anisotropic layer C3 (thickness: 2.0 μm) was produced by, in Production Example 1, changing the composition C1 for forming a light absorption anisotropic layer to a composition C3 for forming a light absorption anisotropic layer.

The absorption axis of the light absorption anisotropic layer C3 was in the plane of the light absorption anisotropic layer C3, and was orthogonal to a width direction of the cellulose acylate film A1.

Thereafter, a laminate CP3 was obtained in the same manner as in Production Example 1.

| Formulation of composition C3 for forming light absorption anisotropic layer | |
|---|---|
| First dichroic substance Dye-C1 described above | 0.35 parts by mass |
| Second dichroic substance Dye-M1 described above | 0.14 parts by mass |
| Third dichroic substance Dye-Y1 described above | 0.25 parts by mass |
| Liquid crystalline compound L-1 described above | 3.27 parts by mass |
| Liquid crystalline compound L-2 described above | 1.44 parts by mass |
| Adhesion improver A-1 described above | 0.06 parts by mass |
| Polymerization initiator IRGACURE OXE-02 (manufactured by BASF SE) | 0.18 parts by mass |
| Surfactant F-1 described above | 0.030 parts by mass |
| Cyclopentanone | 91.94 parts by mass |
| Benzyl alcohol | 2.35 parts by mass |

[Production of Laminate CP4]

A light absorption anisotropic layer C4 (thickness: 2.0 μm) was produced by, in Production Example 1, changing the composition C1 for forming a light absorption anisotropic layer to a composition C4 for forming a light absorption anisotropic layer.

In a case where a transmittance of the light absorption anisotropic layer C4 in a wavelength range of 280 to 780 nm was measured with a spectrophotometer, and the average transmittance of visible light was 42%.

The absorption axis of the light absorption anisotropic layer C4 was in the plane of the light absorption anisotropic layer C4, and was orthogonal to a width direction of the cellulose acylate film A1.

Thereafter, a laminate CP4 was obtained in the same manner as in Production Example 1.

| Formulation of composition C4 for forming light absorption anisotropic layer | |
|---|---|
| First dichroic substance Dye-C2 shown below | 0.59 parts by mass |
| Second dichroic substance Dye-M1 described above | 0.14 parts by mass |
| Third dichroic substance Dye-Y1 described above | 0.25 parts by mass |
| Liquid crystalline compound L-1 described above | 3.27 parts by mass |
| Liquid crystalline compound L-2 described above | 1.44 parts by mass |
| Adhesion improver A-1 described above | 0.06 parts by mass |
| Polymerization initiator IRGACURE OXE-02 (manufactured by BASF SE) | 0.18 parts by mass |
| Surfactant F-1 described above | 0.030 parts by mass |
| Cyclopentanone | 91.70 parts by mass |
| Benzyl alcohol | 2.35 parts by mass |

Dichroic Substance Dye-C2

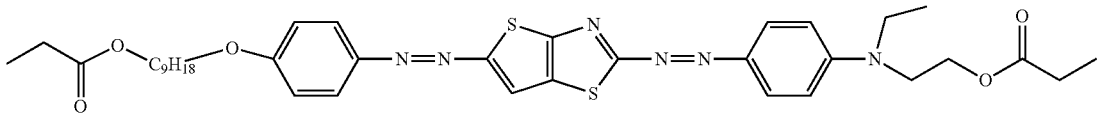

[Production of Laminate CP5]

A light absorption anisotropic layer C5 (thickness: 2.0 μm) was produced by, in Production Example 1, changing the composition C1 for forming a light absorption anisotropic layer to a composition C5 for forming a light absorption anisotropic layer.

In a case where a transmittance of the light absorption anisotropic layer C5 in a wavelength range of 280 to 780 nm was measured with a spectrophotometer, and the average transmittance of visible light was 42%.

The absorption axis of the light absorption anisotropic layer C5 was in the plane of the light absorption anisotropic layer C5, and was orthogonal to a width direction of the cellulose acylate film A1.

Thereafter, a laminate CP5 was obtained in the same manner as in Production Example 1.

| Formulation of composition C5 for forming light absorption anisotropic layer | |
|---|---|
| First dichroic substance Dye-C3 shown below | 0.59 parts by mass |
| Second dichroic substance Dye-M1 described above | 0.14 parts by mass |
| Third dichroic substance Dye-Y1 described above | 0.25 parts by mass |
| Liquid crystalline compound L-1 described above | 3.27 parts by mass |
| Liquid crystalline compound L-2 described above | 1.44 parts by mass |
| Adhesion improver A-1 described above | 0.06 parts by mass |
| Polymerization initiator IRGACURE OXE-02 (manufactured by BASF SE) | 0.18 parts by mass |
| Surfactant F-1 shown below | 0.030 parts by mass |
| Cyclopentanone | 91.70 parts by mass |
| Benzyl alcohol | 2.35 parts by mass |

Dichroic Substance Dye-C3

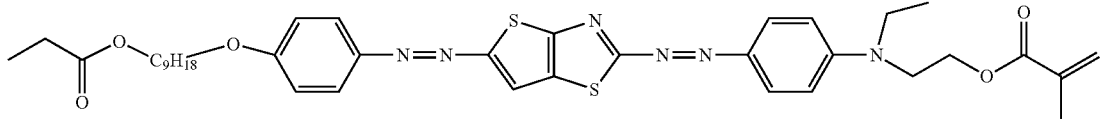

[Production of Laminate CP6]

A light absorption anisotropic layer C6 (thickness: 2.0 μm) was produced by, in Production Example 1, changing the composition C1 for forming a light absorption anisotropic layer to a composition C6 for forming a light absorption anisotropic layer.

The absorption axis of the light absorption anisotropic layer C6 was in the plane of the light absorption anisotropic layer C6, and was orthogonal to a width direction of the cellulose acylate film A1.

Thereafter, a laminate CP6 was obtained in the same manner as in Production Example 1.

| Formulation of composition C6 for forming light absorption anisotropic layer | |
|---|---|
| First dichroic substance Dye-C3 described above | 0.35 parts by mass |
| Second dichroic substance Dye-M1 described above | 0.14 parts by mass |
| Third dichroic substance Dye-Y1 described above | 0.25 parts by mass |
| Liquid crystalline compound L-1 described above | 3.27 parts by mass |
| Liquid crystalline compound L-2 described above | 1.44 parts by mass |
| Adhesion improver A-1 described above | 0.06 parts by mass |
| Polymerization initiator IRGACURE OXE-02 (manufactured by BASF SE) | 0.18 parts by mass |
| Surfactant F-1 shown below | 0.030 parts by mass |

-continued

| Formulation of composition C6 for forming light absorption anisotropic layer | |
|---|---|
| Cyclopentanone | 91.94 parts by mass |
| Benzyl alcohol | 2.35 parts by mass |

[Production of Laminate CP7]

A light absorption anisotropic layer C7 (thickness: 2.0 μm) was produced by, in Production Example 1, changing the composition C1 for forming a light absorption anisotropic layer to a composition C7 for forming a light absorption anisotropic layer.

In a case where a transmittance of the light absorption anisotropic layer C7 in a wavelength range of 280 to 780 nm was measured with a spectrophotometer, and the average transmittance of visible light was 42%.

The absorption axis of the light absorption anisotropic layer C7 was in the plane of the light absorption anisotropic layer C7, and was orthogonal to a width direction of the cellulose acylate film A1.

Thereafter, a laminate CP7 was obtained in the same manner as in Production Example 1.

| Formulation of composition C7 for forming light absorption anisotropic layer | |
|---|---|
| First dichroic substance Dye-C4 shown below | 1.41 parts by mass |
| Second dichroic substance Dye-M1 described above | 0.14 parts by mass |
| Third dichroic substance Dye-Y1 described above | 0.25 parts by mass |
| Liquid crystalline compound L-1 described above | 3.27 parts by mass |
| Liquid crystalline compound L-2 described above | 1.44 parts by mass |

-continued

| Formulation of composition C7 for forming light absorption anisotropic layer | |
|---|---|
| Adhesion improver A-1 described above | 0.06 parts by mass |
| Polymerization initiator IRGACURE OXE-02 (manufactured by BASF SE) | 0.18 parts by mass |
| Surfactant F-1 described above | 0.030 parts by mass |
| Cyclopentanone | 90.88 parts by mass |
| Benzyl alcohol | 2.35 parts by mass |

Dichroic Substance Dye-C4 (in the Formula, Me Denotes a Methyl Group)

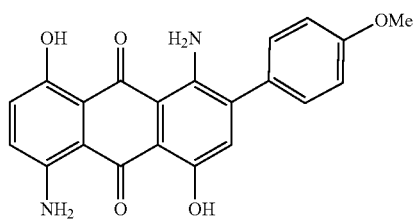 [SMILES: COc1ccc(-c2cc(O)c3c(c2N)C(=O)c2c(O)ccc(N)c2C3=O)cc1]

[Production of Organic EL Display Devices 2 to 7]

Organic EL display devices 2 to 7 were produced using the laminates CP2 to CP7 produced above in the same manner as that for the laminate CP1 of Production Example 1.

Production Example 8

[Production of PVA Polarizer 8]

A polyvinyl alcohol-based film (VF-XS manufactured by Kuraray) having a thickness of 75 μm, a polymerization degree of 2400, and a saponification degree of 99% or more was swelled with hot water at 40° C., and then dyed with an aqueous solution containing iodine, potassium iodide, and boric acid. The dyed film was stretched in a solution containing 3% by mass of boric acid, and immersed in an aqueous solution containing 5% by mass of potassium iodide after the stretching. The film immersed in the potassium iodide aqueous solution for 15 seconds was dried in a dryer at 70° C. for 10 minutes to obtain a polarizer 8 (light absorption anisotropic layer 8) having a thickness of 15 μm.

[Production of Organic EL Display Device 8]

The above-described polarizer 8 on one surface was bonded to a low-reflection surface film CV-LC5 (manufactured by FUJIFILM Corporation) on a support side using a PVA adhesive. Next, the other surface of the above-described polarizer 8 and the above-described retardation plate AC1 on the positive A-plate F1 side were bonded to each other using the above-described pressure sensitive adhesive N1. Next, the photo-alignment film G1 on the positive C-plate H1 side and the cellulose acylate film A1 included in the above-described retardation plate AC1 were removed, thereby producing a laminate CPAC8. At this time, the films were bonded to each other such that an angle between an absorption axis of the polarizer 8 included in the above-described laminate CPAC8 and a slow axis of the positive A-plate F1 was set to 45°. The laminate CPAC8 had a layer configuration of the low-reflection surface film CV-LC5, the PVA adhesive layer, the polarizer 8, the pressure-sensitive adhesive layer N1, the positive A-plate F1, the UV adhesive layer, and the positive C-plate H1.

Furthermore, an organic EL display device 8 was produced using the laminate CPAC8 in the same manner as in Production Example 1.

[Evaluation]

[Polarization Degree]

A polarization degree was measured for each wavelength of 450 nm, 550 nm, and 650 nm, using a laminate obtained after the formation of the oxygen-shielding layer (for example, in Example 1, the laminate CP1 including the cellulose acylate film A1 (transparent support), the photo-alignment film B1, the light absorption anisotropic layer C1, and the oxygen-shielding layer D1 adjacent to each other in this order) or using the polarizer 8.

Specifically, the transmittance of the light absorption anisotropic layer was measured using an automatic polarizing film measuring device (trade name, VAP-7070, manufactured by Jasco Corporation), and the polarization degree was calculated according to the following expression.

Polarization degree [%]=[($MD-TD$)/($MD+TD$)]×100

MD: transmittance of the light absorption anisotropic layer with respect to polarized light vibrating in a y-axis direction (direction orthogonal to the absorption axis direction)

TD: transmittance of the light absorption anisotropic layer with respect to polarized light vibrating in a x-axis direction (the absorption axis direction)

Members other than the light absorption anisotropic layer in the laminate did not have absorption at a wavelength of 450 nm, at a wavelength of 550 nm, and at a wavelength of 650 nm.

[Absorbance]

An average absorbance at a wavelength of 750 nm was measured with a spectrophotometer, using a laminate obtained after the formation of the oxygen-shielding layer (for example, in Example 1, the laminate CP1 including the cellulose acylate film A1 (transparent support), the photo-alignment film B1, the light absorption anisotropic layer C1, and the oxygen-shielding layer D1 adjacent to each other in this order) or using the polarizer 8.

Members other than the light absorption anisotropic layer in the laminate did not have an absorption at a wavelength of 750 nm.

[Display Performance]

A display screen of the produced organic EL display device was brought into a black display state, and reflected light in a case where a fluorescent lamp was projected from the front was observed. The display performance was evaluated based on the following standard.

A: it was black, no color-tinting was recognized at all, and the reflectivity was low.

B: coloration was slightly recognized, but the reflectivity was low.

C: coloration was recognized, and the reflectivity was high.

[Infrared Light Utilization Efficiency]

Infrared light utilization efficiency was evaluated using the laminates CPAC1 to CPAC8. After two layers of the above-described laminate were passed through a light source (for ecoVis of Ocean Photonics, a cut filter was used to transmit light of 700 nm to 850 nm) of 700 to 850 nm (it was assumed that light emitted from the light source passed through the laminate twice and reached the sensor), luminance was measured with a near-infrared spectroradiometer (SR-NIR manufactured by TOPCON CORPORATION). The infrared light utilization efficiency was evaluated based on the following standard.

A: 80% or more of the illuminance was maintained at compared with no laminate.

B: 65% or more and less than 80% of the illuminance was maintained as compared with no laminate.

C: 50% or more and less than 65% of the illuminance was maintained as compared with no laminate.

D: illuminance was reduced to less than 50% as compared with no laminate.

The results of each evaluation are listed in Table 1.

TABLE 1

| Production Example | Type of light absorption anisotropic layer | Content of organic dichroic coloring agent (mg/cm³) | Polarization degree at 450 nm (%) | Polarization degree at 550 nm (%) | Polarization degree at 650 nm (%) | Average absorbance at 750 nm | Evaluation Display performance | Infrared light utilization efficiency | Remark |
|---|---|---|---|---|---|---|---|---|---|
| Production Example 1 | C1 | 164 | 99.5 | 99.8 | 99.8 | 0.10 | A | A | Example |
| Production Example 2 | C2 | 146 | 99.5 | 99.8 | 99.1 | 0.08 | B | A | Example |
| Production Example 3 | C3 | 130 | 99.5 | 99.8 | 96.8 | 0.06 | C | A | Comparative Example |
| Production Example 4 | C4 | 164 | 99.5 | 99.8 | 99.6 | 0.09 | A | A | Example |
| Production Example 5 | C5 | 164 | 99.5 | 99.8 | 99.3 | 0.18 | B | C | Example |
| Production Example 6 | C6 | 130 | 99.5 | 99.8 | 97.1 | 0.12 | C | B | Comparative Example |
| Production Example 7 | C7 | 265 | 99.5 | 99.8 | 99.0 | 0.25 | B | D | Comparative Example |
| Production Example 8 | 8 | — | 99.8 | 99.8 | 99.8 | 0.37 | A | D | Comparative Example |

It was confirmed that, in Production Examples 1, 2, 4, and 5 of the present invention, which satisfied the expressions (1) to (4), the display performance and the infrared light utilization efficiency were excellent.

Production Example 9

[Production of Laminate CP9]

A light absorption anisotropic layer C9 (thickness: 3.0 µm) was produced by, in Production Example 1, changing the composition C1 for forming a light absorption anisotropic layer to a composition C9 for forming a light absorption anisotropic layer.

It was confirmed that the maximal absorption wavelength of the light absorption anisotropic layer C9 was in a wavelength range of 800 to 850 nm.

The absorption axis of the light absorption anisotropic layer C9 was in the plane of the light absorption anisotropic layer C9, and was orthogonal to a width direction of the cellulose acylate film A1.

A laminate CP9 was obtained in the same manner as in the production of the laminate CP1 in Production Example 1, except that the light absorption anisotropic layer C9 was used instead of the light absorption anisotropic layer C1.

| Formulation of composition C9 for forming light absorption anisotropic layer | |
|---|---|
| Dichroic substance IR-1 shown below | 0.39 parts by mass |
| Liquid crystalline compound L-1 described above | 2.70 parts by mass |
| Liquid crystalline compound L-2 described above | 1.16 parts by mass |
| Adhesion improver A-1 described above | 0.06 parts by mass |
| Polymerization initiator IRGACURE OXE-02 (manufactured by BASF SE) | 0.17 parts by mass |
| Surfactant F-1 described above | 0.030 parts by mass |
| Cyclopentanone | 90.88 parts by mass |
| Benzyl alcohol | 2.35 parts by mass |

Dichroic Substance IR-1

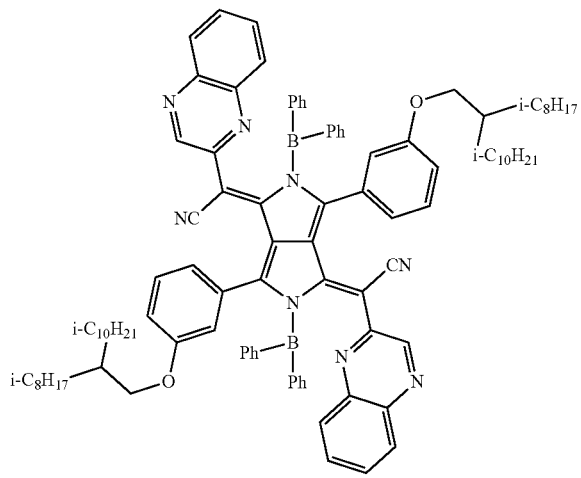

[Production of Laminate CPACIR1]

The laminate CP9 on the light absorption anisotropic layer side and the above-described laminate CPAC1 on the positive C-plate H1 side were bonded to each other using the above-described pressure sensitive adhesive N1, and the cellulose acylate film A1 was peeled off to produce a laminate CPACIR1. In this case, the absorption axis of the laminate CP9 was aligned with the absorption axis of the laminate CP1. Infrared light (850 nm) was sufficiently transmitted through the portion of CPAC1 in the laminate, and in a case where the infrared light was incident from the CP9 side, elliptically polarized light of the infrared light was generated.

Production Example 10

[Production of Laminate CP10]
<Synthesis>

The following rod-like liquid crystal compound I-1 and dichroic coloring agents II-1 and II-2 having a hydrophilic group were synthesized by known methods. The rod-like liquid crystalline compound I-1 was a high-molecular-weight liquid crystalline compound (in the formula, n was 2 or more), the number-average molecular weight of the rod-like liquid crystalline compound I-1 was 24,000 and the molecular weight distribution was 6.8.

In addition, both the dichroic coloring agent II-1 and the dichroic coloring agent II-2 exhibited lyotropic liquid crystallinity.

Rod-Like Liquid Crystalline Compound I-1

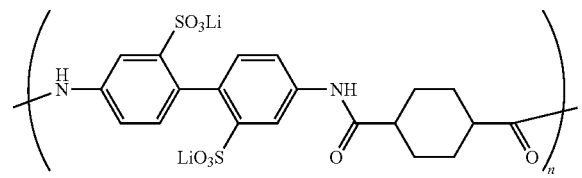

Dichroic Coloring Agent II-1

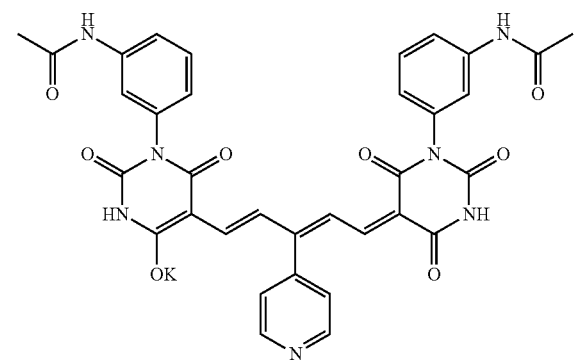

Dichroic Coloring Agent II-2

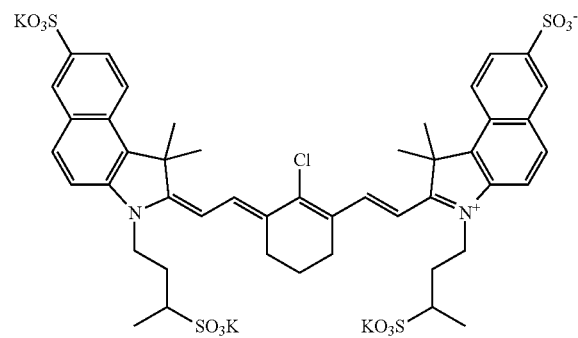

<Production of Light Absorption Anisotropic Layer CP10>

A composition 1 for forming an anisotropic organic film, having the following composition, was prepared. The composition 1 for forming an anisotropic organic film was a composition exhibiting lyotropic liquid crystallinity.

| Composition 1 for forming anisotropic organic film | |
|---|---|
| Rod-like liquid crystalline compound I-1 described above | 10 parts by mass |
| Dichroic coloring agent II-1 described above | 0.5 parts by mass |
| Dichroic coloring agent II-2 described above | 0.5 parts by mass |
| Water | 89 parts by mass |

5 g of the composition 1 for forming an anisotropic organic film prepared above and 20 g of zirconia beads of Φ2 mm were filled in a zirconia 45 mL container, and using a planetary ball mill P-7 classic line manufactured by Fritsch GmbH, milling was performed for 50 minutes at a rotation speed of 300 rpm.

The composition 1 for forming an anisotropic organic film, which had been subjected to the milling treatment described above, was applied onto a glass substrate as a base material with a wire bar (moving speed: 100 cm/s), and naturally dried. Next, the obtained coating film was immersed in a 1 mol/L calcium chloride aqueous solution for 5 seconds, washed with ion exchange water, and blast-dried to fix the alignment state, thereby producing a light absorption anisotropic layer C10 having a film thickness of 1.6 μm.

It was confirmed that the maximal absorption wavelength of the light absorption anisotropic layer C10 was 925 nm. In addition, the absorption axis of the light absorption anisotropic layer C10 was in the plane of the light absorption anisotropic layer C10.

[Production of Laminate CPACIR2]

The light absorption anisotropic layer C10 and the above-described laminate CPAC1 on the positive C-plate H1 side were bonded to each other using the above-described pressure sensitive adhesive N1, and the glass plate was peeled off to produce a laminate CPACIR2. In this case, the absorption axis of the light absorption anisotropic layer C10 was aligned with the absorption axis of CP1.

Infrared light (850 nm) was sufficiently transmitted through the portion of CPAC1 in the laminate, and in a case where the infrared light was incident from the CP10 side, elliptically polarized light of the infrared light was generated.

EXPLANATION OF REFERENCES

1: light absorption anisotropic layer (light absorption anisotropic layer A)
2: optically anisotropic layer
3: light absorption anisotropic layer (light absorption anisotropic layer B)
3a, 3b: infrared light polarizer
11: infrared emitted light
12: infrared incident light
100, 200: display device
101: infrared light source
102: infrared light receiving section
103: visible light emitting panel

What is claimed is:
1. A light absorption anisotropic layer comprising:
an organic dichroic coloring agent,
wherein the light absorption anisotropic layer satisfies the following expressions (1) to (4),

$$P(450) > 99.0\%, \quad (1)$$

$$P(550) > 99.0\%, \quad (2)$$

$$P(650) > 99.0\%, \text{ and} \quad (3)$$

$$A(750) < 0.20, \quad (4)$$

here, the P(450) represents a polarization degree at a wavelength of 450 nm, the P(550) represents a polarization degree at a wavelength of 550 nm, the P(650) represents a polarization degree at a wavelength of 650 nm, and the A(750) represents an average absorbance at a wavelength of 750 nm.

2. The light absorption anisotropic layer according to claim 1,
wherein the light absorption anisotropic layer satisfies the following expression (5), $$A(750) \leq 0.15. \quad (5)$$

3. The light absorption anisotropic layer according to claim 2,
wherein a film thickness is 0.5 to 5.0 μm.

4. The light absorption anisotropic layer according to claim 1,
wherein the light absorption anisotropic layer satisfies the following expression (6), $$A(750) \leq 0.10. \quad (6)$$

5. The light absorption anisotropic layer according to claim 1,
wherein a film thickness is 0.5 to 5.0 μm.

6. The light absorption anisotropic layer according to claim 1, further comprising:
a liquid crystalline compound.

7. The light absorption anisotropic layer according to claim 6,
wherein a content of the organic dichroic coloring agent is 5 to 40 parts by mass with respect to 100 parts by mass of a content of the liquid crystalline compound.

8. The light absorption anisotropic layer according to claim 1,
wherein a content of the organic dichroic coloring agent in the light absorption anisotropic layer is 100 to 250 mg/cm$^3$.

9. The light absorption anisotropic layer according to claim 1,
wherein an alignment degree at a wavelength of 650 nm is 0.95 or more.

10. The light absorption anisotropic layer according to claim 1,
wherein the light absorption anisotropic layer shows a Bragg peak in an X-ray diffraction measurement.

11. A laminate comprising:
the light absorption anisotropic layer according to claim 1; and
an optically anisotropic layer.

12. The laminate according to claim 11,
wherein the laminate is used for a display device, a sensor, a lens, a switching element, an isolator, or a camera.

13. A display device comprising:
the laminate according to claim 11.

14. An infrared light irradiation device comprising:
the laminate according to claim 11.

15. An infrared light sensing device comprising:
the laminate according to claim 11.

16. A laminate comprising:
a light absorption anisotropic layer A which is the light absorption anisotropic layer according to claim 1; and
a light absorption anisotropic layer B which is different from the light absorption anisotropic layer A,
wherein the light absorption anisotropic layer B contains a dichroic coloring agent having a maximal absorption wavelength at a wavelength of 700 to 1400 nm.

17. The light absorption anisotropic layer according to claim 1,
wherein the light absorption anisotropic layer is used for a display device, a sensor, a lens, a switching element, an isolator, or a camera.

18. A display device comprising:
the light absorption anisotropic layer according to claim 1.

19. An infrared light irradiation device comprising:
the light absorption anisotropic layer according to claim 1.

20. An infrared light sensing device comprising:
the light absorption anisotropic layer according to claim 1.

* * * * *